United States Patent
Takahashi et al.

(10) Patent No.: US 9,270,173 B2
(45) Date of Patent: Feb. 23, 2016

(54) DC CONVERTER CIRCUIT AND POWER SUPPLY CIRCUIT

(71) Applicant: SEMICONDUCTOR ENERGY LABORATORY CO., LTD., Atsugi-shi, Kanagawa-ken (JP)

(72) Inventors: Kei Takahashi, Kanagawa (JP); Yoshiaki Ito, Kanagawa (JP); Hiroki Inoue, Kanagawa (JP); Tatsuji Nishijima, Kanagawa (JP)

(73) Assignee: Semiconductor Energy Laboratory Co., Ltd., Kanagawa-ken (JP)

( * ) Notice: Subject to any disclaimer, the term of this patent is extended or adjusted under 35 U.S.C. 154(b) by 0 days.

(21) Appl. No.: 14/580,279

(22) Filed: Dec. 23, 2014

(65) Prior Publication Data

US 2015/0108959 A1    Apr. 23, 2015

Related U.S. Application Data

(62) Division of application No. 12/956,491, filed on Nov. 30, 2010, now Pat. No. 8,922,182.

(30) Foreign Application Priority Data

Dec. 4, 2009  (JP) ................................. 2009-276859

(51) Int. Cl.
*G05F 1/00* (2006.01)
*H02M 3/156* (2006.01)
(Continued)

(52) U.S. Cl.
CPC ............... *H02M 3/156* (2013.01); *H01L 27/12* (2013.01); *H01L 27/1225* (2013.01); *H01L 29/7869* (2013.01); *H02M 3/155* (2013.01)

(58) Field of Classification Search
USPC ............ 323/222, 223, 282, 283, 284; 257/64, 257/66, 72, 350, 351, 627, E21.414, 257/E21.166, E21.479, E21.174; 438/149, 438/151, 158
See application file for complete search history.

(56) References Cited

U.S. PATENT DOCUMENTS 5,691,889 A    11/1997  Bazinet et al.
5,731,856 A    3/1998   Kim et al.
(Continued)

FOREIGN PATENT DOCUMENTS

EP    1737044 A    12/2006
EP    2120267 A    11/2009
(Continued)

OTHER PUBLICATIONS

International Search Report (Application No. PCT/JP2010/070248) Dated Feb. 15, 2011.
(Continued)

*Primary Examiner* — Nguyen Tran
(74) *Attorney, Agent, or Firm* — Fish & Richardson P.C.

(57) ABSTRACT

A DC converter circuit having high reliability is provided. The DC converter circuit includes: an inductor configured to generate electromotive force in accordance with a change in flowing current; a transistor including a gate, a source, and a drain, which is configured to control generation of the electromotive force in the inductor by being on or off; a rectifier in a conducting state when the transistor is off; and a control circuit configured to control on and off of the transistor. The transistor includes an oxide semiconductor layer whose hydrogen concentration is less than or equal to $5 \times 10^{19}$ atoms/$cm^3$ as a channel formation layer.

16 Claims, 21 Drawing Sheets

(51) Int. Cl.
    *H01L 27/12* (2006.01)
    *H01L 29/786* (2006.01)
    *H02M 3/155* (2006.01)

(56) References Cited

U.S. PATENT DOCUMENTS

| | | | |
|---|---|---|---|
| 5,744,864 A | 4/1998 | Cillessen et al. | |
| 5,982,156 A | 11/1999 | Weimer et al. | |
| 6,294,274 B1 | 9/2001 | Kawazoe et al. | |
| 6,400,211 B1 | 6/2002 | Yokomizo et al. | |
| 6,563,174 B2 | 5/2003 | Kawasaki et al. | |
| 6,727,522 B1 | 4/2004 | Kawasaki et al. | |
| 7,049,190 B2 | 5/2006 | Takeda et al. | |
| 7,061,014 B2 | 6/2006 | Hosono et al. | |
| 7,064,346 B2 | 6/2006 | Kawasaki et al. | |
| 7,072,193 B2 | 7/2006 | Lin | |
| 7,105,868 B2 | 9/2006 | Nause et al. | |
| 7,211,825 B2 | 5/2007 | Shih et al | |
| 7,282,782 B2 | 10/2007 | Hoffman et al. | |
| 7,297,977 B2 | 11/2007 | Hoffman et al. | |
| 7,323,356 B2 | 1/2008 | Hosono et al. | |
| 7,323,851 B2 * | 1/2008 | Markowski | 323/222 |
| 7,385,224 B2 | 6/2008 | Ishii et al. | |
| 7,402,506 B2 | 7/2008 | Levy et al. | |
| 7,403,049 B2 | 7/2008 | Uchimoto | |
| 7,411,209 B2 | 8/2008 | Endo et al. | |
| 7,443,202 B2 | 10/2008 | Kimura et al. | |
| 7,453,065 B2 | 11/2008 | Saito et al. | |
| 7,453,087 B2 | 11/2008 | Iwasaki | |
| 7,462,862 B2 | 12/2008 | Hoffman et al. | |
| 7,468,304 B2 | 12/2008 | Kaji et al. | |
| 7,501,293 B2 | 3/2009 | Ito et al. | |
| 7,601,984 B2 | 10/2009 | Sano et al. | |
| 7,674,650 B2 | 3/2010 | Akimoto et al. | |
| 7,714,562 B2 | 5/2010 | Oswald et al. | |
| 7,724,070 B2 | 5/2010 | Fukami | |
| 7,732,819 B2 | 6/2010 | Akimoto et al. | |
| 7,791,072 B2 | 9/2010 | Kumomi et al. | |
| 7,791,074 B2 | 9/2010 | Iwasaki | |
| 8,106,382 B2 | 1/2012 | Saitoh et al. | |
| 8,158,974 B2 | 4/2012 | Yano et al. | |
| 8,367,489 B2 | 2/2013 | Yamazaki | |
| 8,384,076 B2 | 2/2013 | Park et al. | |
| 8,482,329 B2 | 7/2013 | Deshpande et al. | |
| 8,698,138 B2 | 4/2014 | Yamazaki | |
| 2001/0046027 A1 | 11/2001 | Tai et al. | |
| 2002/0056838 A1 | 5/2002 | Ogawa | |
| 2002/0132454 A1 | 9/2002 | Ohtsu et al. | |
| 2003/0189401 A1 | 10/2003 | Kido et al. | |
| 2003/0218222 A1 | 11/2003 | Wager, III et al. | |
| 2004/0038446 A1 | 2/2004 | Takeda et al. | |
| 2004/0127038 A1 | 7/2004 | Carcia et al. | |
| 2005/0017302 A1 | 1/2005 | Hoffman | |
| 2005/0199959 A1 | 9/2005 | Chiang et al. | |
| 2006/0035452 A1 | 2/2006 | Carcia et al. | |
| 2006/0043377 A1 | 3/2006 | Hoffman et al. | |
| 2006/0091793 A1 | 5/2006 | Baude et al. | |
| 2006/0108529 A1 | 5/2006 | Saito et al. | |
| 2006/0108636 A1 | 5/2006 | Sano et al. | |
| 2006/0110867 A1 | 5/2006 | Yabuta et al. | |
| 2006/0113536 A1 | 6/2006 | Kumomi et al. | |
| 2006/0113539 A1 | 6/2006 | Sano et al. | |
| 2006/0113549 A1 | 6/2006 | Den et al. | |
| 2006/0113565 A1 | 6/2006 | Abe et al. | |
| 2006/0164154 A1 | 7/2006 | Fukami | |
| 2006/0169973 A1 | 8/2006 | Isa et al. | |
| 2006/0170111 A1 | 8/2006 | Isa et al. | |
| 2006/0197092 A1 | 9/2006 | Hoffman et al. | |
| 2006/0208977 A1 | 9/2006 | Kimura | |
| 2006/0220619 A1 | 10/2006 | Namba et al. | |
| 2006/0228974 A1 | 10/2006 | Thelss et al. | |
| 2006/0231882 A1 | 10/2006 | Kim et al. | |
| 2006/0238135 A1 | 10/2006 | Kimura | |
| 2006/0244107 A1 | 11/2006 | Sugihara et al. | |
| 2006/0263576 A1 | 11/2006 | Hirose | |
| 2006/0284171 A1 | 12/2006 | Levy et al. | |
| 2006/0284172 A1 | 12/2006 | Ishii | |
| 2006/0292777 A1 | 12/2006 | Dunbar | |
| 2007/0024187 A1 | 2/2007 | Shin et al. | |
| 2007/0046191 A1 | 3/2007 | Saito | |
| 2007/0052025 A1 | 3/2007 | Yabuta | |
| 2007/0054507 A1 | 3/2007 | Kaji et al. | |
| 2007/0090365 A1 | 4/2007 | Hayashi et al. | |
| 2007/0108446 A1 | 5/2007 | Akimoto | |
| 2007/0145965 A1 | 6/2007 | Oswald et al. | |
| 2007/0152217 A1 | 7/2007 | Lai et al. | |
| 2007/0172591 A1 | 7/2007 | Seo et al. | |
| 2007/0187678 A1 | 8/2007 | Hirao et al. | |
| 2007/0187760 A1 | 8/2007 | Furuta et al. | |
| 2007/0194379 A1 | 8/2007 | Hosono et al. | |
| 2007/0252928 A1 | 11/2007 | Ito et al. | |
| 2007/0272922 A1 | 11/2007 | Kim et al. | |
| 2007/0287296 A1 | 12/2007 | Chang | |
| 2008/0006877 A1 | 1/2008 | Mardilovich et al. | |
| 2008/0038882 A1 | 2/2008 | Takechi et al. | |
| 2008/0038929 A1 | 2/2008 | Chang | |
| 2008/0050595 A1 | 2/2008 | Nakagawara et al. | |
| 2008/0073653 A1 | 3/2008 | Iwasaki | |
| 2008/0083950 A1 | 4/2008 | Pan et al. | |
| 2008/0106191 A1 | 5/2008 | Kawase | |
| 2008/0128689 A1 | 6/2008 | Lee et al. | |
| 2008/0129195 A1 | 6/2008 | Ishizaki et al. | |
| 2008/0166834 A1 | 7/2008 | Kim et al. | |
| 2008/0182358 A1 | 7/2008 | Cowdery-Corvan et al. | |
| 2008/0197821 A1 | 8/2008 | Hasegawa et al. | |
| 2008/0224133 A1 | 9/2008 | Park et al. | |
| 2008/0254569 A1 | 10/2008 | Hoffman et al. | |
| 2008/0258139 A1 | 10/2008 | Ito et al. | |
| 2008/0258140 A1 | 10/2008 | Lee et al. | |
| 2008/0258141 A1 | 10/2008 | Park et al. | |
| 2008/0258143 A1 | 10/2008 | Kim et al. | |
| 2008/0278120 A1 | 11/2008 | Sato | |
| 2008/0290393 A1 * | 11/2008 | Kakehata et al. | 257/316 |
| 2008/0296568 A1 | 12/2008 | Ryu et al. | |
| 2009/0068773 A1 | 3/2009 | Lai et al. | |
| 2009/0073325 A1 | 3/2009 | Kuwabara et al. | |
| 2009/0114910 A1 | 5/2009 | Chang | |
| 2009/0134399 A1 | 5/2009 | Sakakura et al. | |
| 2009/0134468 A1 | 5/2009 | Tsuchiya et al. | |
| 2009/0152506 A1 | 6/2009 | Umeda et al. | |
| 2009/0152541 A1 | 6/2009 | Maekawa et al. | |
| 2009/0212826 A1 | 8/2009 | Mizunaga | |
| 2009/0278122 A1 | 11/2009 | Hosono et al. | |
| 2009/0280600 A1 | 11/2009 | Hosono et al. | |
| 2010/0051938 A1 | 3/2010 | Hayashi et al. | |
| 2010/0065844 A1 | 3/2010 | Tokunaga | |
| 2010/0092800 A1 | 4/2010 | Itagaki et al. | |
| 2010/0109002 A1 | 5/2010 | Itagaki et al. | |
| 2010/0276689 A1 | 11/2010 | Iwasaki | |
| 2010/0279462 A1 | 11/2010 | Iwasaki | |
| 2011/0068852 A1 | 3/2011 | Yamazaki et al. | |
| 2011/0089927 A1 | 4/2011 | Yamazaki et al. | |
| 2011/0101942 A1 | 5/2011 | Yamazaki et al. | |
| 2014/0197407 A1 | 7/2014 | Yamazaki | |
| 2014/0368417 A1 | 12/2014 | Yamazaki et al. | |
| 2015/0097595 A1 | 4/2015 | Yamazaki et al. | |

FOREIGN PATENT DOCUMENTS

| | | |
|---|---|---|
| EP | 2226847 A | 9/2010 |
| EP | 2408011 A | 1/2012 |
| JP | 55-051624 A | 4/1980 |
| JP | 58-086868 A | 5/1983 |
| JP | 60-198861 A | 10/1985 |
| JP | 63-136816 A | 6/1988 |
| JP | 63-210022 A | 8/1988 |
| JP | 63-210023 A | 8/1988 |
| JP | 63-210024 A | 8/1988 |
| JP | 63-215519 A | 9/1988 |
| JP | 63-239117 A | 10/1988 |
| JP | 63-265818 A | 11/1988 |
| JP | 05-251705 A | 9/1993 |
| JP | 06-189529 A | 7/1994 |
| JP | 08-264794 A | 10/1996 |

(56) References Cited

FOREIGN PATENT DOCUMENTS

| | | |
|---|---|---|
| JP | 11-505377 | 5/1999 |
| JP | 2000-044236 A | 2/2000 |
| JP | 2000-150900 A | 5/2000 |
| JP | 2002-076356 A | 3/2002 |
| JP | 2002-289859 A | 10/2002 |
| JP | 2003-086000 A | 3/2003 |
| JP | 2003-086808 A | 3/2003 |
| JP | 2004-103957 A | 4/2004 |
| JP | 2004-104942 A | 4/2004 |
| JP | 2004-273614 A | 9/2004 |
| JP | 2004-273732 A | 9/2004 |
| JP | 2006-165527 A | 6/2006 |
| JP | 2006-204049 A | 8/2006 |
| JP | 2007-074190 A | 3/2007 |
| JP | 2007-103918 A | 4/2007 |
| JP | 2007-159395 A | 6/2007 |
| JP | 2009-060439 A | 3/2009 |
| JP | 2009-135140 A | 6/2009 |
| JP | 2009-200944 A | 9/2009 |
| JP | 2009-240025 A | 10/2009 |
| JP | 2009-278115 A | 11/2009 |
| JP | 2011-135067 A | 7/2011 |
| WO | WO-2004/114391 | 12/2004 |
| WO | WO-2007/029844 | 3/2007 |
| WO | WO-2009/028394 | 3/2009 |
| WO | WO-2011/065244 | 6/2011 |

OTHER PUBLICATIONS

Written Opinion (Application No. PCT/JP2010/070248) Dated Feb. 15, 2011.

Coates.D et al., "Optical Studies of the Amorphous Liquid-Cholesteric Liquid Crystal Transition:The "Blue Phase"", Physics Letters, Sep. 10, 1973, vol. 45A, No. 2, pp. 115-116.

Meiboom.S et al., "Theory of the Blue Phase of Cholesteric Liquid Crystals", Phys. Rev. Lett. (Physical Review Letters), May 4, 1981, vol. 46, No. 18, pp. 1216-1219.

Costello.M et al., "Electron Microscopy of a Cholesteric Liquid Crystal and Its Blue Phase", Phys. Rev. A (Physical Review. A), May 1, 1984, vol. 29, No. 5, pp. 2957-2959.

Kimizuka.N. et al., "Spinel,YbFe2O4, and Yb2Fe3O7 Types of Structures for Compounds in the In2O3 and Sc2O3—A2O3—Bo Systems [A; Fe, Ga, or Al; B: Mg, Mn, Fe, Ni, Cu, or Zn] At Temperatures over 1000° C.", Journal of Solid State Chemistry, 1985, vol. 60, pp. 382-384.

Nakamura.M et al., "The phase relations in the In2O3—Ga2ZnO4—ZnO system at 1350° C.", Journal of Solid State Chemistry, Aug. 1, 1991, vol. 93, No. 2, pp. 298-315.

Kitzerow.H et al., "Observation of Blue Phases in Chiral Networks", Liquid Crystals, 1993, vol. 14, No. 3, pp. 911-916.

Kimizuka.N. et al., "Syntheses and Single-Crystal Data of Homologous Compounds, In2O3(ZnO)m (m=3, 4, and 5), InGaO3(ZnO)3, and Ga2O3(ZnO0m (m=7,8,9, and 16) in the In2O3—ZnGa2O4—ZnO System", Journal of Solid State Chemistry, Apr. 1, 1995, vol. 116, No. 1, pp. 170-178.

Chern.H et al., "An Analytical Model for the Above-Threshold Characteristics of Polysilicon Thin-Film Transistors", IEEE Transactions on Electron Devices, Jul. 1, 1995, vol. 42, No. 7, pp. 1240-1246.

Prins.M et al., "A Ferroelectric Transparent Thin-Film Transistor", Appl. Phys. Lett. (Applied Physics Letters), Jun. 17, 1996, vol. 68, No. 25, pp. 3650-3652.

Li.C et al., "Modulated Structures of Homologous Compounds InMO3(ZnO)m (M=In,Ga; m=Integer) Described by Four-Dimensional Superspace Group", Journal of Solid State Chemistry, 1998, vol. 139, pp. 347-355.

Kikuchi.H et al., "Polymer-Stabilized Liquid Crystal Blue Phases", Nature Materials, Sep. 2, 2002, vol. 1, pp. 64-68.

Tsuda.K et al., "Ultra Low Power Consumption Technologies for Mobile TFT-LCDs ", IDW '02 : Proceedings of the 9th International Display Workshops, Dec. 4, 2002, pp. 295-298.

Nomura.K et al., "Thin-Film Transistor Fabricated in Single-Crystalline Transparent Oxide Semiconductor", Science, May 23, 2003, vol. 300, No. 5623, pp. 1269-1272.

Ikeda.T et al., "Full-Functional System Liquid Crystal Display Using Cg-Silicon Technology", SID Digest '04 : SID International Symposium Digest of Technical Papers, 2004, vol. 35, pp. 860-863.

Nomura.K et al., "Room-Temperature Fabrication of Transparent Flexible Thin-Film Transistors Using Amorphous Oxide Semiconductors", Nature, Nov. 25, 2004, vol. 432, pp. 488-492.

Dembo.H et al., "RFCPUS on Glass and Plastic Substrates Fabricated by TFT Transfer Technology", IEDM 05: Technical Digest of International Electron Devices Meeting, Dec. 5, 2005, pp. 1067-1069.

Kanno.H et al., "White Stacked Electrophosphorecent Organic Light-Emitting Devices Employing MOO3 as a Charge-Generation Layer", Adv. Mater. (Advanced Materials) 2006, vol. 18, No. 3, pp. 339-342.

Lee.H et al., "Current Status of, Challenges to, and Perspective View of AM-OLED ", IDW '06: Proceedings of the 13th International Display Workshops, Dec. 7, 2006, pp. 663-666.

Hosono.H, "68.3:Invited Paper:Transparent Amorphous Oxide Semiconductors for High Performance TFT", SID Digest '07 : SID International Symposium Digest of Technical Papers, 2007, vol. 38, pp. 1830-1833.

Hirao.T et al., "Novel Top-Gate Zinc Oxide Thin-Film Transistors (ZnO TFTs) for AMLCDs", J. Soc. Inf. Display (Journal of the Society for Information Display), 2007, vol. 15, No. 1, pp. 17-22.

Park.S et al., "Challenge to Future Displays: Transparent Am-OLED Driven by Peald Grown ZnO TFT", IMID '07 Digest, 2007, pp. 1249-1252.

Kikuchi.H et al., "62.2:Invited Paper:Fast Electro-Optical Switching in Polymer-Stabilized Liquid Crystalline Blue Phases for Display Application", SID Digest '07 : SID International Symposium Digest of Technical Papers, 2007, vol. 38, pp. 1737-1740.

Miyasaka.M, "SUFTLA Flexible Microelectronics on Their Way to Business", SID Digest '07 : SID International Symposium Digest of Technical Papers, 2007, vol. 38, pp. 1673-1676.

Kurokawa.Y et al., "UHF RFCPUS on Flexible and Glass Substrates for Secure RFID Systems", Journal of Solid-State Circuits, 2008, vol. 43, No. 1, pp. 292-299.

Jeong.J et al., "3.1: Distinguished Paper: 12.1-Inch WXGA AMOLED Display Driven by Indium—Gallium—Zinc Oxide TFTs Array", SID Sigest '08 : Sid International Digest of Technical Papers, May 20, 2008, vol. 39, No. 1, pp. 1-4.

Lee.J et al., "World's Largest (15-Inch) XGA AMLCD Panel Using IGZO Oxide TFT", SID Digest '08 : SID International Symposium Digest of Technical Papers, May 20, 2008, vol. 39, pp. 625-628.

Park.J et al., "Amorphous Indium—Gallium—Zinc Oxide TFTs and Their Application for Large Size AMOLED", AM-FPD '08 Digest of Technical Papers, Jul. 2, 2008, pp. 275-278.

Takahashi.M et al., "Theoretical Analysis of IGZO Transparent Amorphous Oxide Semiconductor", IDW '08 : Proceedings of the 15th International Display Workshops, Dec. 3, 2008, pp. 1637-1640.

Sakata.J et al., "Development of 4.0-In. AMOLED Display With Driver Circuit Using Amorphous In—Ga—Zn—Oxide TFTs", IDW '09 : Proceedings of the 16th International Display Workshops, 2009, pp. 689-692.

Asaoka.Y et al., "29.1: Polarizer-Free Reflective LCD Combined With Ultra Low-Power Driving Technology", SID Digest '09 : SID International Symposium Digest of Technical Papers, May 31, 2009, pp. 395-398.

Nowatari.H et al., "60.2: Intermediate Connector With Suppressed Voltage Loss for White Tandem OLEDs", SID Digest '09 : SID International Symposium Digest of Technical Papers, May 31, 2009, vol. 40, pp. 899-902.

Jin.D et al., "65.2:Distinguished Paper:World-Largest (6.5") Flexible Full Color Top Emission AMOLED Display on Plastic Film and Its Bending Properties", SID Digest '09 : SID International Symposium Digest of Technical Papers, May 31, 2009, pp. 983-985.

Lee.M et al., "15.4:Excellent Performance of Indium—Oxide-Based Thin-Film Transistors by DC Sputtering", SID Digest '09 : SID International Symposium Digest of Technical Papers, May 31, 2009, pp. 191-193.

(56) References Cited

OTHER PUBLICATIONS

Cho.D et al., "21.2:Al and Sn-Doped Zinc Indium Oxide Thin Film Transistors for AMOLED Back-Plane", SID Digest '09 : SID International Symposium Digest of Technical Papers, May 31, 2009, pp. 280-283.

Kikuchi.H et al., "39.1:Invited Paper:Optically Isotropic Nano-Structured Liquid Crystal Composites for Display Applications", SID Digest '09 : SID International Symposium Digest of Technical Papers, May 31, 2009, pp. 578-581.

Osada.T et al., "15.2: Development of Driver-Integrated Panel using Amorphous In—Ga—Zn—Oxide TFT", SID Digest '09 : SID International Symposium Digest of Technical Papers, May 31, 2009, pp. 184-187.

Ohara.H et al., "21.3:4.0 in. QVGA AMOLED Display Using In—Ga—Zn—Oxide TFTs With a Novel Passivation Layer", SID Digest '09 : SID International Symposium Digest of Technical Papers, May 31, 2009, pp. 284-287.

Godo.H et al., "P-9:Numerical Analysis on Temperature Dependence of Characteristics of Amorphous In—GA—Zn—Oxide TFT", SID Digest '09 : SID International Symposium Digest of Technical Papers, May 31, 2009, pp. 1110-1112.

Osada.T et al., "Development of Driver-Integrated Panel Using Amorphous In—Ga—Zn—Oxide TFT", AM-FPD '09 Digest of Technical Papers, Jul. 1, 2009, pp. 33-36.

Godo.H et al., "Temperature Dependence of Characteristics and Electronic Structure for Amorphous In—Ga—Zn—Oxide TFT", AM-FPD '09 Digest of Technical Papers, Jul. 1, 2009, pp. 41-44.

Ohara.H et al., "Amorphous In—Ga—Zn—Oxide TFTs with Suppressed Variation for 4.0 inch QVGA AMOLED Display", AM-FPD '09 Digest of Technical Papers, Jul. 1, 2009, pp. 227-230, The Japan Society of Applied Physics.

Park.J et al., "High performance amorphous oxide thin film transistors with self-aligned top-gate structure", IEDM 09: Technical Digest of International Electron Devices Meeting, Dec. 7, 2009, pp. 191-194.

Nakamura.M, "Synthesis of Homologous Compound with New Long-Period Structure", NIRIM Newsletter, Mar. 1, 1995, vol. 150, pp. 1-4.

Hosono.H et al., "Working hypothesis to explore novel wide band gap electrically conducting amorphous oxides and examples", J. Non-Cryst. Solids (Journal of Non-Crystalline Solids), 1996, vol. 198-200, pp. 165-169.

Orita.M et al., "Mechanism of Electrical Conductivity of Transparent InGaZnO4", Phys. Rev. B (Physical Review B), Jan. 15, 2000, vol. 61, No. 3, pp. 1811-1816.

Van de Walle.C, "Hydrogen as a Cause of Doping in Zinc Oxide", Phys. Rev. Lett. (Physical Review Letters), Jul. 31, 2000, vol. 85, No. 5, pp. 1012-1015.

Orita.M et al., "Amorphous transparent conductive oxide InGaO3(ZnO)m (m<4):a Zn4s conductor", Philosophical Magazine, 2001, vol. 81, No. 5, pp. 501-515.

Janotti.A et al., "Oxygen Vacancies in ZnO", Appl. Phys. Lett. (Applied Physics Letters) , 2005, vol. 87, pp. 122102-1-122102-3.

Clark.S et al., "First Principles Methods Using CASTEP", Zeitschrift fur Kristallographie, 2005, vol. 220, pp. 567-570.

Nomura.K et al., "Amorphous Oxide Semiconductors for High-Performance Flexible Thin-Film Transistors", Jpn. J. Appl. Phys. (Japanese Journal of Applied Physics) , 2006, vol. 45. No. 5B, pp. 4303-4308.

Janotti.A et al., "Native Point Defects in ZnO", Phys. Rev. B (Physical Review. B), Oct. 4, 2007, vol. 76, No. 16, pp. 165202-1-165202-22.

Lany.S et al., "Dopability, Intrinsic Conductivity, and Nonstoichiometry of Transparent Conducting Oxides", Phys. Rev. Lett. (Physical Review Letters), Jan. 26, 2007, vol. 98, pp. 045501-1-045501-4.

Park.J et al., "Improvements in the Device Characteristics of Amorphous Indium Gallium Zinc Oxide Thin-Film Transistors by Ar Plasma Treatment", Appl. Phys. Lett. (Applied Physics Letters) , Jun. 26, 2007, vol. 90, No. 26, pp. 262106-1-262106-3.

Park.J et al., "Electronic Transport Properties of Amorphous Indium—Gallium—Zinc Oxide Semiconductor Upon Exposure to Water", Appl. Phys. Lett. (Applied Physics Letters) , 2008, vol. 92, pp. 072104-1-072104-3.

Hsieh.H et al., "P-29:Modeling of Amorphous Oxide Semiconductor Thin Film Transistors and Subgap Density of States", SID Digest '08 : SID International Symposium Digest of Technical Papers, May 20, 2008, vol. 39, pp. 1277-1280.

Oba.F et al., "Defect energetics in ZnO: A hybrid Hartree-Fock density functional study", Phys. Rev. B (Physical Review B), 2008, vol. 77, pp. 245202-1-245202-6.

Kim.S et al., "High-Performance oxide thin film transistors passivated by various gas plasmas", 214th ECS Meeting, 2008, No. 2317, ECS.

Hayashi.R et al., "42.1: Invited Paper: Improved Amorphous In—Ga—Zn—O TFTs", SID Digest '08 : SID International Symposium Digest of Technical Papers, May 20, 2008, vol. 39, pp. 621-624.

Son.K et al., "42.4L: Late-News Paper: 4 Inch QVGA AMOLED Driven by the Threshold Voltage Controlled Amorphous GIZO (Ga2O3—In2O3—ZnO) TFT", SID Digest '08 : SID International Symposium Digest of Technical Papers, May 20, 2008, vol. 39, pp. 633-636.

Park.Sang-Hee et al., "42.3: Transparent ZnO Thin Film Transistor for the Application of High Aperture Ratio Bottom Emission AM-OLED Display", SID Digest '08 : SID International Symposium Digest of Technical Papers, May 20, 2008, vol. 39, pp. 629-632.

Fung.T et al., "2-D Numerical Simulation of High Performance Amorphous In—Ga—Zn—O TFTs for Flat Panel Displays", AM-FPD '08 Digest of Technical Papers, Jul. 2, 2008, pp. 251-252, The Japan Society of Applied Physics.

Mo.Y et al., "Amorphous Oxide TFT Backplanes for Large Size AMOLED Displays", IDW '08 : Proceedings of the 6th International Display Workshops, Dec. 3, 2008, pp. 581-584.

Asakuma.N. et al., "Crystallization and Reduction of Sol-Gel-Derived Zinc Oxide Films by Irradiation With Ultraviolet Lamp", Journal of Sol-Gel Science and Technology, 2003, vol. 26, pp. 181-184.

Fortunato.E et al., "Wide-Bandgap High-Mobility ZnO Thin-Film Transistors Produced at Room Temperature", Appl. Phys. Lett. (Applied Physics Letters) , Sep. 27, 2004, vol. 85, No. 13, pp. 2541-2543.

Masuda.S et al., "Transparent thin film transistors using ZnO as an active channel layer and their electrical properties", J. Appl. Phys. (Journal of Applied Physics) , Feb. 1, 2003, vol. 93, No. 3, pp. 1624-1630.

Oh.M et al., "Improving the Gate Stability of ZnO Thin-Film Transistors With Aluminum Oxide Dielectric Layers", J. Electrochem. Soc. (Journal of the Electrochemical Society), 2008, vol. 155, No. 12, pp. H1009-H1014.

Park.J et al., "Dry etching of ZnO films and plasma-induced damage to optical properties", J. Vac. Sci. Technol. B (Journal of Vacuum Science & Technology B), Mar. 1, 2003, vol. 21, No. 2, pp. 800-803.

Ueno.K et al., "Field-Effect Transistor on SrTiO3 With Sputtered Al2O3 Gate Insulator", Appl. Phys. Lett. (Applied Physics Letters) , Sep. 1, 2003, vol. 83, No. 9, pp. 1755-1757.

Nomura.K et al., "Carrier transport in transparent oxide semiconductor with intrinsic structural randomness probed using single-crystalline InGaO3(ZnO)5 films", Appl. Phys. Lett. (Applied Physics Letters) , Sep. 13, 2004, vol. 85, No. 11, pp. 1993-1995.

\* cited by examiner

FIG. 21A
FIG. 21B
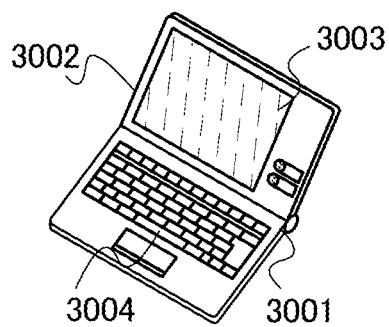
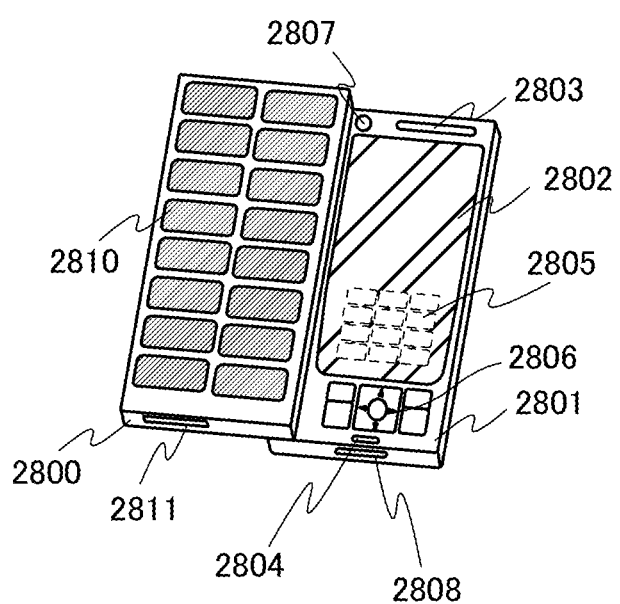

DC CONVERTER CIRCUIT AND POWER SUPPLY CIRCUIT

CROSS-REFERENCE TO RELATED APPLICATIONS

This application is a divisional of U.S. application Ser. No. 12/956,491, filed Nov. 30, 2010, now allowed, which claims the benefit of a foreign priority application filed in Japan as Serial No. 2009-276859 on Dec. 4, 2009, both of which are incorporated by reference.

TECHNICAL FIELD

An embodiment of the present invention relates to a DC converter circuit. In addition, an embodiment of the present invention relates to a power supply circuit.

BACKGROUND ART

In recent years, a circuit which converts DC voltage at a given value into DC voltage at another value (also referred to as a DC converter circuit or a DC-DC converter) is used in various electronic devices when power supply voltage at a stable value is generated from voltage with large fluctuation or when power supply voltage at a plurality of different values is needed, for example.

As the DC converter circuit, there is a non-isolated DC-DC converter circuit formed using, for example, a coil, a diode, and a transistor (e.g., Patent Document 1). The non-isolated DC-DC converter circuit has advantages of a small circuit area and low production cost.

REFERENCE

[Patent Document 1] Japanese Published Patent Application: No. S58-086868

DISCLOSURE OF INVENTION

However, a conventional DC converter circuit has a problem of low reliability. As one problem, dielectric breakdown might occur in a transistor (e.g., a thin film transistor) included in a DC converter circuit when high voltage at a given value or higher is applied to the transistor because the DC converter circuit uses a relatively high voltage, for example.

It is an object of an embodiment of the present invention to improve the reliability of a DC converter circuit.

According to an embodiment of the present invention, a DC converter circuit is formed with the use of a transistor including an oxide semiconductor as a channel formation layer. The oxide semiconductor has a lager energy gap than a silicon semiconductor and is highly purified semiconductor which is intrinsic or substantially intrinsic through removal of an impurity serving as an electron donor as much as possible. Accordingly, reliability of the DC converter circuit can be improved. The energy gap of the oxide semiconductor which is used in an embodiment of the present invention is 2 eV or more, preferably 2.5 eV or more, more preferably 3 eV or more, for example.

Note that higher purification is a general idea including at least one of the following cases: the case where hydrogen of an oxide semiconductor layer is removed as much as possible; and the case where oxygen is supplied to an oxide semiconductor layer and defects due to oxygen deficiency of the oxide semiconductor layer are reduced.

The concentration of hydrogen contained in the oxide semiconductor is less than or equal to $5 \times 10^{19}/cm^3$, preferably less than or equal to $5 \times 10^{18}/cm^3$, more preferably less than or equal to $5 \times 10^{17}/cm^3$ or less than or equal to $1 \times 10^{16}/cm^3$. In addition, hydrogen or an O—H group contained in the oxide semiconductor is removed. The carrier concentration is less than $1 \times 10^{12}/cm^3$, preferably less than $1 \times 10^{11}/cm^3$.

As the oxide semiconductor layer, any of the following oxide semiconductor film can be used: an In—Sn—Ga—Zn—O film that is a quaternary metal oxide; an In—Ga—Zn—O film, an In—Sn—Zn—O film, In—Al—Zn—O film, an Sn—Ga—Zn—O film, an Al—Ga—Zn—O film, or an Sn—Al—Zn—O film that is a ternary metal oxide; an In—Zn—O film, an Sn—Zn—O film, an Al—Zn—O film, a Zn—Mg—O film, an Sn—Mg—O film, an In—Mg—O film, or an In—Sn—O film that is a binary metal oxide; an In—O film; an Sn—O film; a Zn—O film; and the like. In addition, the above oxide semiconductor film may contain $SiO_2$. Note that here, for example, an In—Sn—Ga—Zn—O film means an oxide film including indium (In), tin (Sn), gallium (Ga), and zinc (Zn). There is no particular limitation on the stoichiometric proportion.

The oxide semiconductor layer can be formed using a film expressed by $InMO_3 (ZnO)_m$, (m>0). Here, M represents one or more metal elements selected from Ga, Al, Mn, and Co. For example, Ga, Ga and Al, Ga and Mn, or Ga and Co can be given as M. An oxide semiconductor film whose composition formula is expressed by as $InMO_3 (ZnO)_m$, (m>0) where at least Ga is included as M is referred to as the In—Ga—Zn—O oxide semiconductor described above, and a film thereof is also referred to as an In—Ga—Zn—O film.

As described above, when a highly purified oxide semiconductor is used for a channel formation region of a transistor, normally-off electric characteristics can be realized. For example, in the case where drain voltage lies within the range of 1 V to 10 V, off-state current (current that flows between a source and a drain when voltage between a gate and the source is set to be lower than or equal to 0 V) can be set to lower than or equal to $1 \times 10^{-13}$ A, or off-state current density (a numerical value calculated in such a way that off-state current is divided by a channel width of the transistor) can be set to be lower than or equal to 100 aA/μm (a (atto) denotes a factor of $10^{-18}$), preferably lower than or equal to 10 aA/μm, more preferably lower than or equal to 1 aA/μm.

With the use of a transistor including an oxide semiconductor layer which is highly purified by sufficiently reducing the hydrogen concentration as a channel formation layer, a highly reliable DC converter circuit can be achieved.

One embodiment of the present invention is a DC converter circuit including: an inductor configured to generate electromotive force in accordance with a change in flowing current; a transistor including a gate, a source, and a drain, which is configured to control generation of the electromotive force in the inductor by being on or off; a rectifier in a conducting state when the transistor is off; and a control circuit configured to control on and off of the transistor. The transistor includes an oxide semiconductor layer whose hydrogen concentration is less than or equal to $5 \times 10^{19}$ atoms/$cm^3$ as a channel formation layer.

According to the above embodiment of the present invention, the control circuit may include a hysteresis comparator to which a signal that is voltage of the second terminal of the inductor is input as an input signal. The hysteresis comparator compares the signal input and reference voltage and outputs a pulse signal whose pulse width is set in accordance with a comparison result, to the gate of the transistor as an output signal.

According to the above embodiment of the present invention, the hysteresis comparator may include a logic circuit. The logic circuit may include the transistor including the oxide semiconductor layer whose hydrogen concentration is less than or equal to $5 \times 10^{19}$ atoms/cm$^3$ as the channel formation layer.

Another embodiment of the present invention is a DC converter circuit including: an inductor including a first terminal and a second terminal, which is configured to generate electromotive force in accordance with a change in current flowing to the first terminal and the second terminal; a transistor including a gate, a source, and a drain, which is configured to control generation of the electromotive force in the inductor by being on or off; a rectifier in a conducting state when the transistor is off; and a control circuit configured to control on and off of the transistor. The control circuit includes a hysteresis comparator to which a signal that is voltage of the second terminal of the inductor is input as an input signal, which compares the signal input and reference voltage, and which outputs a pulse signal whose pulse width is set in accordance with a comparison result, to the gate of the transistor as an output signal.

According to the above embodiment of the present invention, the transistor may include an oxide semiconductor layer whose hydrogen concentration is less than or equal to $5 \times 10^{19}$ atoms/cm$^3$ as a channel formation layer.

Another embodiment of the present invention is a DC converter circuit including: a coil including a first terminal and a second terminal, in which voltage of the second terminal becomes output voltage; a transistor including a gate, a source, and a drain, in which one of the source and the drain is electrically connected to the first terminal of the coil and input voltage is applied to the other of the source and the drain; a capacitor including a first electrode and a second electrode, in which the first electrode is electrically connected to the second terminal of the coil and low power supply voltage is applied to the second electrode; a diode including an anode and a cathode, in which the low power supply voltage is applied to the anode and the cathode is electrically connected to one of the source and the drain of the transistor; and a hysteresis comparator to which the voltage of the second terminal of the coil is input as an input signal and which outputs a pulse signal whose duty ratio is set in accordance with the voltage of the second terminal of the coil, to the gate of the transistor as an output signal. The transistor includes an oxide semiconductor layer whose hydrogen concentration is less than or equal to $5 \times 10^{19}$ atoms/cm$^3$ as a channel formation layer.

According to another embodiment of the present invention, the hysteresis comparator may include a first comparator including a first input terminal, a second input terminal, and an output terminal, in which first reference voltage is applied to the first input terminal and the voltage of the second terminal of the coil is input to the second input terminal as an input signal; a second comparator including a first input terminal, a second input terminal, and an output terminal, in which the voltage of the second terminal of the coil is input to the first input terminal as an input signal and second reference voltage is applied to the second input terminal; a first inverter including an input terminal and an output terminal, in which the input terminal is electrically connected to the output terminal of the first comparator; a second inverter including an input terminal and an output terminal, in which the input terminal is electrically connected to the output terminal of the second comparator; a first NOR gate including a first input terminal, a second input terminal, and an output terminal, in which the first input terminal is electrically connected to the output terminal of the first inverter and the output terminal is electrically connected to the gate of the transistor; and a second NOR gate including a first input terminal, a second input terminal, and an output terminal, in which the first input terminal is electrically connected to the output terminal of the first NOR gate, the second input terminal is electrically connected to the output terminal of the second inverter, and the output terminal is electrically connected to the second input terminal of the first NOR gate.

According to the above embodiment of the present invention, each of the first comparator, the second comparator, the first inverter, the second inverter, the first NOR gate, and the second NOR gate may include a transistor including a gate, a source, and a drain. The transistor may include an oxide semiconductor layer whose hydrogen concentration is less than or equal to $5 \times 10^{19}$ atoms/cm$^3$ as a channel formation layer.

According to any of the above embodiments of the present invention, the capacitor may be an electric double-layer capacitor, a redox capacitor, or a lithium ion capacitor.

According to any of the above embodiments of the present invention, a power supply circuit includes the DC converter circuit and a power storage device electrically connected to the DC converter circuit.

According to the above embodiment of the present invention, the power storage device may be one or more of a photoelectric conversion device, a lithium ion secondary battery, and a lithium ion capacitor.

According to an embodiment of the present invention, the reliability of a DC converter circuit can be improved.

BRIEF DESCRIPTION OF DRAWINGS

FIGS. 21A and 21B are diagrams each illustrating an electronic device.

BEST MODE FOR CARRYING OUT THE INVENTION

Hereinafter, examples of embodiments of the present invention will be described with reference to the drawings. Note that the present invention is not limited to the description below, and it will be easily understood by those skilled in the art that modes and details thereof can be changed in various ways without departing from the spirit and scope of the present invention. Thus, the present invention should not be interpreted as being limited to the description of the embodiments.

Embodiment 1

In this embodiment, a DC converter circuit which is an embodiment of the present invention will be described.

Figure 1:
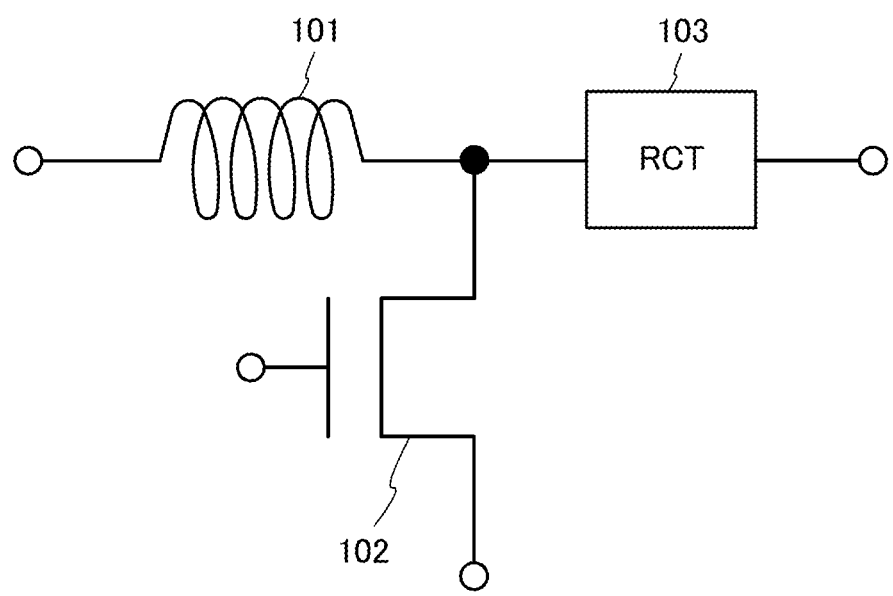
FIG. 1 is a circuit diagram illustrating an example of a circuit configuration of a DC converter circuit.

An example of the structure of the DC converter circuit in this embodiment will be described with reference to FIG. 1. FIG. 1 is a circuit diagram illustrating an example of the structure of the DC converter circuit of this embodiment.

The DC converter circuit illustrated in FIG. 1 includes an inductor 101, a transistor 102, and a rectifier (also referred to as RCT) 103.

In this specification, the transistor includes at least a gate, a source, and a drain. As the transistor, a gate insulated transistor can be used, for example.

The gate means entire gate electrode and gate wiring or part thereof. The gate wiring is a wiring for electrically connecting a gate electrode of at least one transistor to a different electrode or a different wiring. One conductive layer can function as a gate electrode and a gate wiring without distinction between the gate electrode and the gate wiring.

The source means entire source electrode and source wiring or part thereof. The source electrode means a conductive layer which functions as the source. The source wiring is a wiring for electrically connecting a source electrode of at least one transistor to a different electrode or a different wiring. One conductive layer can function as a source electrode and a source wiring without distinction between the source electrode and the source wiring.

The drain means entire drain electrode and drain wiring or part thereof. The drain electrode means a conductive layer which functions as the drain. The drain wiring is a wiring for electrically connecting a drain electrode of at least one transistor to a different electrode or a different wiring. One conductive layer can function as a drain electrode and a drain wiring without distinction between the drain electrode and the drain wiring.

Further, in this specification, a source and a drain of a transistor may interchange with each other depending on the structure, the operating condition, and the like of the transistor; therefore, it is difficult to define which is a source or a drain. Therefore, in this document (the specification, the claims, the drawings, and the like), one of them is referred to as one of the source and the drain, and the other is referred to as the other of the source and the drain.

The inductor 101 has a function of generating electromotive force in accordance with the change of current which flows in the inductor 101 by electromagnetic induction. For example, the inductor 101 includes a first terminal and a second terminal as illustrated in FIG. 1. For the inductor 101, a coil can be used, for example.

The transistor 102 has a function of controlling generation of electromotive force in the inductor 101 by being on or off. For example, one of a source and a drain of the transistor 102 is electrically connected to one of the first terminal and the second terminal of the inductor 101 as illustrated in FIG. 1.

Note that in general, voltage refers to a difference between potentials of two points (also referred to as a potential difference). However, both the value of voltage and the value of a potential are represented by volts (V) in a circuit diagram or the like in some cases; therefore, it is difficult to distinguish them. Thus, in this specification, a potential difference between a potential at one point and a reference potential is sometimes used as voltage at the point unless otherwise specified.

Note that as a signal in this specification, an analog signal or a digital signal which uses voltage or the like can be used, for example. Specifically, as a signal which uses voltage (also referred to as a voltage signal), it is preferable to use a signal having at least a first voltage state and a second voltage state. A digital signal which has a high-level voltage state as the first voltage state and a low-level voltage state as the second voltage state can be used, for example. Note that the high-level voltage is also referred to as voltage $V_H$ or simply $V_H$, and the low-level voltage is also referred to as voltage $V_L$ or simply $V_L$. In addition, the voltage in the first voltage state and the voltage in the second voltage state each have variation in some cases, which depends on signals. Moreover, since there is an influence of noise or the like, the voltage in the first voltage state and the voltage in the second voltage state do not necessarily have a given value and may have a value within a predetermined range.

For example, the rectifier 103 includes a first terminal and a second terminal as illustrate in FIG. 1. One of the first terminal and the second terminal of the rectifier 103 is electrically connected to one of the first terminal and the second terminal of the inductor 101.

As the rectifier 103, a diode or the like can be used, for example. As the diode, a PN diode, a PIN diode, or the like can be used, for example. As the diode, a transistor which can be applied to the transistor 102 and whose gate and drain are electrically connected to each other (also referred to as a diode-connected transistor) can be used. As the diode-connected transistor, a transistor including an oxide semiconductor layer serving as a channel formation layer can be used. In the channel formation layer, the hydrogen concentration is less than or equal to $5 \times 10^{19}$ atoms/cm$^3$, preferably less than or equal to $5 \times 10^{18}$ atoms/cm$^3$, more preferably less than or equal to $5 \times 10^{17}$ atoms/cm$^3$, and the carrier concentration is less than $1 \times 10^{12}$/cm$^3$, preferably less than $1 \times 10^{11}$/cm$^3$.

The DC converter circuit illustrated in FIG. 1 has different functions depending on to which terminal input voltage is applied and from which terminal voltage is output as output voltage. For example, in the case where current flows to the second terminal from the first terminal of the rectifier 103 when input voltage is applied to the other of the first terminal and the second terminal of the inductor 101 and the voltage of the other of the first terminal and the second terminal of the rectifier 103 is used as the output voltage, the DC converter circuit illustrated in FIG. 1 functions as a step-up circuit. On the other hand, in the case where current flows to the second terminal from the first terminal of the rectifier 103 when the input voltage is applied to the other of the source and the drain of the transistor 102 and the voltage of the other of the first terminal and the second terminal of the inductor 101 is used as the output voltage, the DC converter circuit illustrated in FIG. 1 functions as a step-down circuit.

The DC converter circuit of this embodiment can have a structure including a control circuit which controls on and off of the transistor 102. An example of a circuit configuration of a DC converter circuit in this embodiment will be described with reference to FIG. 2. Note that in the DC converter circuit illustrated in FIG. 2, as for the portion having the same structure as the DC converter circuit illustrated in FIG. 1, description of the DC converter circuit illustrated in FIG. 1 is used as appropriate.

Figure 2:
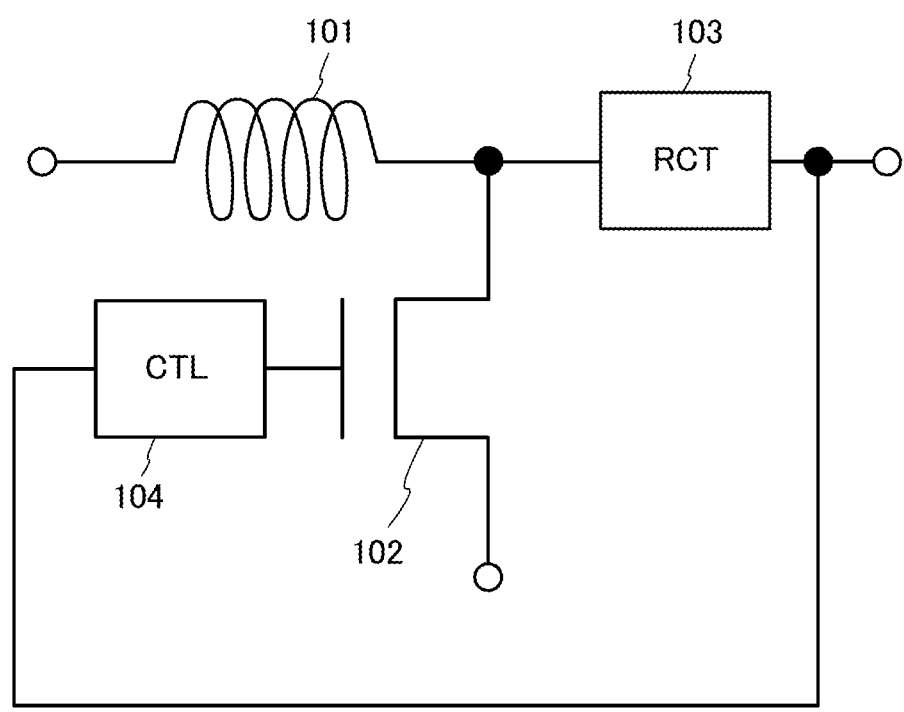
FIG. 2 is a circuit diagram illustrating an example of a circuit configuration of a DC converter circuit.

The DC converter circuit illustrated in FIG. 2 includes a control circuit 104 as well as the structure illustrated in FIG. 1.

The control circuit 104 has a function of controlling on and off of the transistor 102. In the control circuit 104, the output voltage of the DC converter circuit is input as an input signal, a pulse signal is generated utilizing a ripple of the output voltage of the DC converter circuit, and a generated pulse signal is output to a gate of the transistor 102. On and off of the transistor 102 are controlled by the pulse signal.

The control circuit 104 is formed using a hysteresis comparator, for example. The hysteresis comparator is formed using a plurality of logic circuits, for example. Each of the plurality of logic circuits is formed using a transistor, for example. The transistor includes an oxide semiconductor layer serving as a channel formation layer, for example. In the oxide semiconductor layer, the hydrogen concentration is less than or equal to $5\times10^{19}$ atoms/cm$^3$, preferably less than or equal to $5\times10^{18}$ atoms/cm$^3$, more preferably less than or equal to $5\times10^{17}$ atoms/cm$^3$, and the carrier concentration is less than $1\times10^{12}$/cm$^3$, preferably less than $1\times10^{11}$/cm$^3$. Therefore, there is a small change of voltage due to leakage current of the transistor in each logic circuit, so that the condition of the voltage of the pulse signal can be stabilized. When step-up operation is performed, the hysteresis comparator is preferably combined with another arithmetic circuit to form the control circuit 104.

Each example of the DC converter circuit of this embodiment includes the transistor, the inductor, and the rectifier as illustrated in FIG. 1 and FIG. 2.

Note that the DC converter circuit of this embodiment may have a capacitor for smoothing the output voltage. The use of the capacitor makes it possible to bring the output voltage close to a given value.

In addition, in the DC converter circuit of this embodiment, a transistor includes an oxide semiconductor layer serving as a channel formation layer, for example. In the oxide semiconductor layer, the hydrogen concentration is less than or equal to $5\times10^{19}$ atoms/cm$^3$, preferably less than or equal to $5\times10^{18}$ atoms/cm$^3$, more preferably less than or equal to $5\times10^{17}$ atoms/cm$^3$, and the carrier concentration is less than $1\times10^{12}$/cm$^3$, preferably less than $1\times10^{11}$/cm$^3$. The transistor with smaller off-state current and higher withstand voltage is provided as compared with a conventional transistor formed using silicon, for example. Accordingly, the transistor is used as a transistor included in the DC converter circuit, so that destruction of the transistor can be suppressed even when high voltage is applied between terminals of the transistor.

Next, as an example of the operation of the DC converter circuit of this embodiment, an example of the operation of the DC converter circuit illustrated in FIG. 2 will be described.

As a DC conversion method of the DC converter circuit of this embodiment, a non-linear control method can be used, for example. The non-linear control method is a method by which the transistor 102 is turned on and off alternately, whereby voltage input to the DC converter circuit is changed to a pulse signal, and a changed pulse signal is used to generate the output voltage. At this time, the state of the transistor 102 is set by the duty ratio of a pulse signal input to the gate, for example. Note that the pulse signal input to the transistor 102 is generated utilizing the output voltage of the DC converter circuit, for example.

In an example of the operation of the DC converter circuit illustrated in FIG. 2, a period can be mainly divided into a period T1 and a period T2, and operation in the period T1 and operation in the period T2 are alternately performed, so that the input voltage is stepped-up or stepped-down. Each period will be described below.

In the period T1, the transistor 102 is turned on in accordance with the pulse signal, and the rectifier 103 becomes a non-conducting state. Current flows to the inductor 101 in accordance with the value of the input voltage which is input to the DC converter circuit. At this time, electromotive force V1 is generated in the inductor 101.

In the period T2, the transistor 102 is turned off in accordance with the pulse signal. At this time, electromotive force V2 in the direction which is opposite to the direction of the electromotive force V1 is generated in the inductor 101 in order to suppress a change of its magnetic field, and the rectifier 103 becomes a conducting state, whereby current flows to the inductor 101 and the rectifier 103 and the value of the output voltage is changed. At this time, the value of the output voltage of the DC converter circuit illustrated in FIG. 2 is the changed value of the input voltage. The value of the output voltage is determined by the ratio of the length of the period T1 to the period T2, in other words, the duty ratio of the pulse signal. For example, in the period T1 and the period T2, when the output voltage is higher than a desired value, the duty ratio of the pulse signal is set to be lower by the control circuit 104. When the output voltage is lower than a desired value, the duty ratio of the pulse signal is set to be higher by the control circuit 104. In this way, in the DC converter circuit illustrated in FIG. 2, feedback of the output voltage every unit period to the control circuit 104 makes it possible to bring the output voltage after the feedback, close to a desired value.

As described above, as an example of the DC converter circuit of this embodiment, the transistor which is electrically connected to the inductor 101 is turned on and off alternately in accordance with the duty ratio of the pulse signal which is input from the control circuit, and the input voltage is converted into the voltage with another value to generate the output voltage, whereby the DC converter circuit can function as a step-up circuit or a step-down circuit.

Embodiment 2

In this embodiment, a DC converter circuit which is an embodiment of the present invention will be described. As a conversion method of a DC χονω∈πτ∈ρ circuit, a linear method and a switching method are typically given. Since a DC converter circuit using a switching method has excellent conversion efficiency, it is preferable to reduce power consumption in electronic devices. In this embodiment, a DC converter circuit of a switching method, in particular, a chopper method will be described.

An example of a structure of the DC converter circuit in this embodiment will be described with reference to FIG. 3. FIG.

3 is a circuit diagram illustrating an example of a structure of the DC converter circuit in this embodiment.

Figure 3:
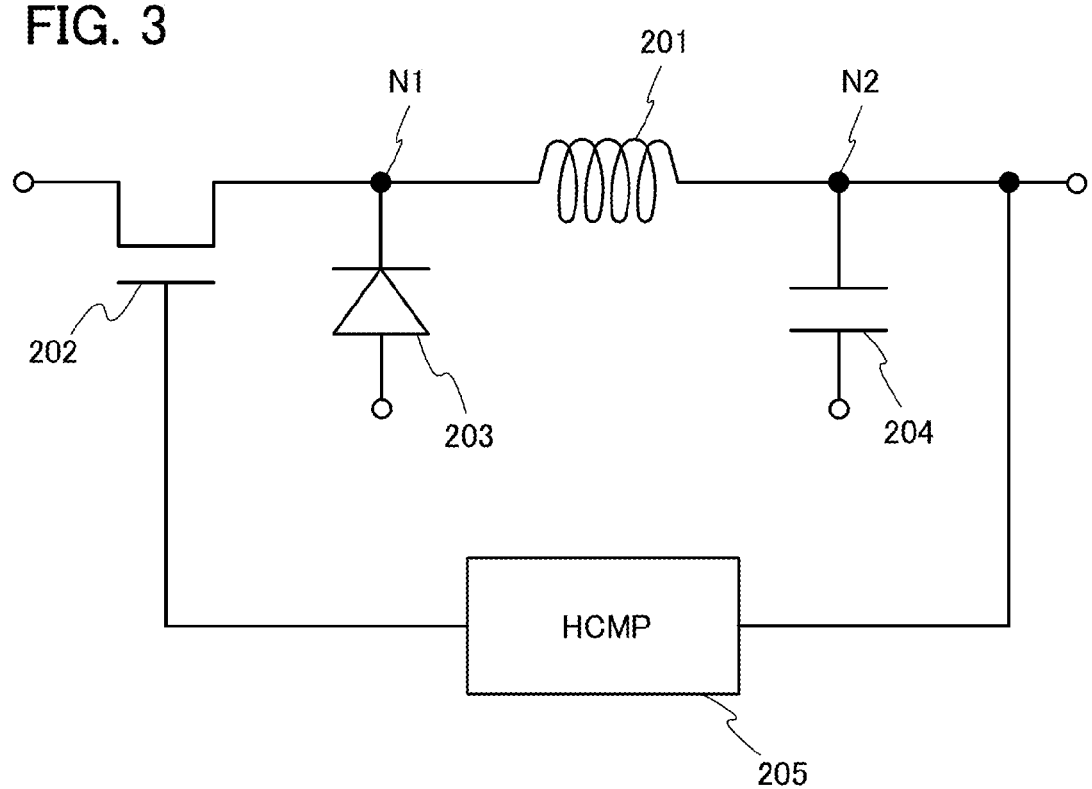
FIG. 3 is a circuit diagram illustrating an example of a circuit configuration of a DC converter circuit.

The DC converter circuit illustrated in FIG. 3 includes a coil 201, a transistor 202, a diode 203, a capacitor 204, and a hysteresis comparator (also referred to as an HCMP) 205.

The coil 201 includes a first terminal and a second terminal. The coil 201 has a function as an inductor.

One of a source and a drain of the transistor 202 is electrically connected to the first terminal of the coil 201.

The transistor 202 includes an oxide semiconductor layer serving as a channel formation layer, for example. In the channel formation layer, the hydrogen concentration is less than or equal to $5 \times 10^{19}$ atoms/cm$^3$, preferably less than or equal to $5 \times 10^{18}$ atoms/cm$^3$, more preferably less than or equal to $5 \times 10^{17}$ atoms/cm$^3$, and the carrier concentration is less than $1 \times 10^{12}$/cm$^3$, preferably less than $1 \times 10^{11}$/cm$^3$.

The diode 203 includes an anode and a cathode. Low power supply voltage (also referred to as voltage VSS or simply VSS) is applied to the anode, and the cathode is electrically connected to the first terminal of the coil 201. The diode 203 has a function as a rectifier.

As the diode 203, a PN diode or a PIN diode can be used, for example. For example, a diode-connected transistor which is applicable to the transistor 202 can be used as the diode 203. In addition, a diode-connected transistor includes an oxide semiconductor layer serving as a channel formation layer, for example. In the oxide semiconductor layer, the hydrogen concentration is less than or equal to $5 \times 10^{19}$ atoms/cm$^3$, preferably less than or equal to $5 \times 10^{18}$ atoms/cm$^3$, more preferably less than or equal to $5 \times 10^{17}$ atoms/cm$^3$, and the carrier concentration is less than $1 \times 10^{12}$/cm$^3$, preferably less than $1 \times 10^{11}$/cm$^3$.

The capacitor 204 includes a first electrode, a second electrode, and a dielectric layer provided between the first electrode and the second electrode. The first electrode is electrically connected to the second terminal of the coil 201 and the low power supply voltage is applied to the second electrode. The capacitor 204 has a function as a smoothing capacitor and a function of smoothing the voltage of a node N2 illustrated in FIG. 3.

For the capacitor 204, for example, a MIS capacitor which uses the oxide semiconductor layer used for the transistor 202, an electric double-layer capacitor, a redox capacitor, or a lithium ion capacitor can be used. In the DC converter circuit which is an embodiment of the present invention, the transistor 202 is turned on and off alternately in a short time, so that step-up operation or step-down operation is performed. Therefore, when the capacitor 204 to which stepped-up voltage or stepped-down voltage is applied is charged or discharged at low speed, step-up operation or step-down operation might be delayed. Thus, for example, a lithium ion capacitor which is thought to be charged or discharged at high speed is used, whereby delay of step-up operation or step-down operation can be reduced. There is no limitation on the lithium ion capacitor. As noted above, a lithium ion capacitor is one example of a kind of capacitor that can be used, and, accordingly, the capacitor 204 is not limited to being a lithium ion capacitor. As the capacitor 204, a capacitor which uses another alkali metal ion or alkaline earth metal ion as a mobile ion may be used. For example, production cost can be reduced with the use of a sodium ion capacitor. In the DC converter circuit illustrated in FIG. 3, the capacitor 204 preferably has large capacitance. The large capacitance of the capacitor 204 makes it possible to further smooth the output voltage of the DC converter circuit illustrated in FIG. 3.

When the output voltage of the DC converter circuit illustrated in FIG. 3 is input as an input signal to the hysteresis comparator 205, the hysteresis comparator 205 detects a ripple of the input signal, generates a pulse signal whose duty ratio is set in accordance with the detected ripple, and outputs the generated pulse signal as a control signal to a gate of the transistor 202.

The hysteresis comparator 205 is formed using logic circuits, and all of the logic circuits can be formed using transistors all having the same conductivity type. Thus, the number of process steps can be reduced.

Figure 4:
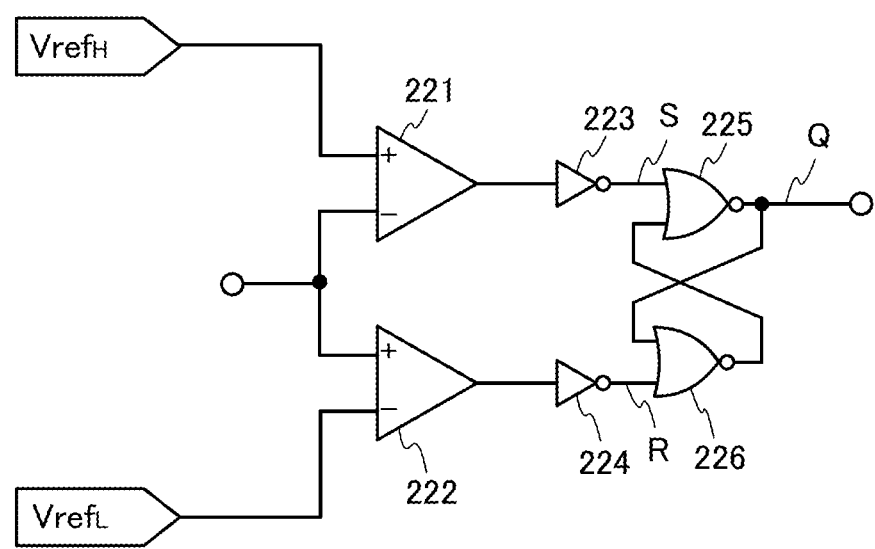
FIG. 4 is a circuit diagram illustrating an example of a circuit configuration of a hysteresis comparator.

Here, an example of a circuit configuration of the hysteresis comparator (the hysteresis comparator 205) illustrated in FIG. 3 will be described with reference to FIG. 4. FIG. 4 is a circuit diagram illustrating an example of the circuit configuration of the hysteresis comparator illustrated in FIG. 3.

The hysteresis comparator illustrated in FIG. 4 includes a comparator 221, a comparator 222, an inverter 223, an inverter 224, a NOR gate 225, and a NOR gate 226.

The comparator 221 includes a first input terminal, a second input terminal, and an output terminal. High voltage (also referred to as reference voltage Vref$_H$ or simply Vref$_H$) to be a reference is applied to the first input terminal, and a signal S22 is input to the second input terminal.

The comparator 222 includes a first input terminal, a second input terminal, and an output terminal. The signal S22 is input to the first input terminal, and low voltage (also referred to as reference voltage Vref$_L$ or simply Vref$_L$) to be a reference is applied to the second input terminal. Note that the value of the reference voltage Vref$_L$ is lower than the value of the reference voltage Vref$_H$.

The inverter 223 includes an input terminal and an output terminal, and the input terminal of the inverter 223 is electrically connected to the output terminal of the comparator 221.

The inverter 224 includes an input terminal and an output terminal, and the input terminal of the inverter 224 is electrically connected to the output terminal of the comparator 222.

The NOR gate 225 includes a first input terminal, a second input terminal, and an output terminal. The first input terminal of the NOR gate 225 is electrically connected to the output terminal of the inverter 223. Note that a connection point of the first input terminal of the NOR gate 225 and the output terminal of the inverter 223 is expressed as a node S.

The NOR gate 226 includes a first input terminal, a second input terminal, and an output terminal. The first input terminal of the NOR gate 226 is electrically connected to the output terminal of the NOR gate 225, the second input terminal of the NOR gate 226 is electrically connected to the output terminal of the inverter 224, and the output terminal of the NOR gate 226 is electrically connected to the second input terminal of the NOR gate 225. Note that a connection point of the first input terminal of the NOR gate 226 and the output terminal of the inverter 224 is expressed as a node R.

Note that each logic circuit (the comparator 221, the comparator 222, the inverter 223, the inverter 224, the NOR gate 225, and the NOR gate 226) includes a transistor, for example. The transistor includes an oxide semiconductor layer serving as a channel formation layer, for example. In the oxide semiconductor layer, the hydrogen concentration is less than or equal to $5 \times 10^{19}$ atoms/cm$^3$, preferably less than or equal to $5 \times 10^{18}$ atoms/cm$^3$, more preferably less than or equal to $5 \times 10^{17}$ atoms/cm$^3$, and the carrier concentration is less than $1 \times 10^{12}$/cm$^3$, preferably less than $1 \times 10^{11}$/cm$^3$. In this embodiment, each logic circuit can be formed using transistors all having the same conductivity type. By forming each logic circuit using transistors all having the same conductivity type, a manufacturing process can be simplified.

As illustrated in FIG. 4 as an example, the hysteresis comparator illustrated in FIG. 3 includes two comparators, compares voltage (output voltage of the DC converter circuit illustrated in FIG. 3) of a signal which is input to the two comparators and reference voltage (reference voltage $Vref_H$ or reference voltage $Vref_L$), and outputs a pulse signal whose duty ratio is set in accordance with a comparison result.

Next, an example of the operation of the hysteresis comparator illustrated in FIG. 4 will be described.

The example of the operation of the hysteresis comparator illustrated in FIG. 4 can be classified into the following cases: the case where voltage (also referred to as voltage $V_{N2}$ or simply $V_{N2}$) of the node N2 illustrated in FIG. 3 which is input as an input signal is higher than the reference voltage $Vref_H$ ($V_{N2}>Vref_H$); the case where the voltage $V_{N2}$ is higher than the reference voltage $Vref_L$ and lower than the reference voltage $Vref_H$ ($Vref_H>V_{N2}>Vref_L$); and the case where the voltage $V_{N2}$ is lower than the reference voltage $Vref_L$ ($Vref_L>V_{N2}$). Each case will be described below.

In the case of $V_{N2}>Vref_H$, the potential of the node S becomes $V_H$, and the potential of the node R becomes $V_L$. At this time, the potential of a node Q becomes $V_L$, and the output signal (also referred to as a signal $OUT_{HCMP}$) of the hysteresis comparator illustrated in FIG. 4 becomes at a low level.

In the case of $Vref_H>V_{N2}>Vref_L$, the potential of the node S becomes $V_L$, and the potential of the node R becomes $V_L$. At this time, the state of the node Q in the previous period is kept in the node Q. For example, when the potential of the node Q is $V_H$ in the previous period, the potential of the node Q is $V_H$, and the output signal of the hysteresis comparator is also kept at a high level. When the potential of the node Q is $V_L$ in the previous period, the potential of the node Q is kept at $V_L$, and the signal $OUT_{HCMP}$ is also kept at a low level.

In the case of $Vref_L>V_{N2}$, the potential of the node S becomes $V_L$, and the potential of the node R becomes $V_H$. At this time, the potential of the node Q becomes $V_H$, and the output signal of the hysteresis comparator becomes at a high level.

Figure 5:
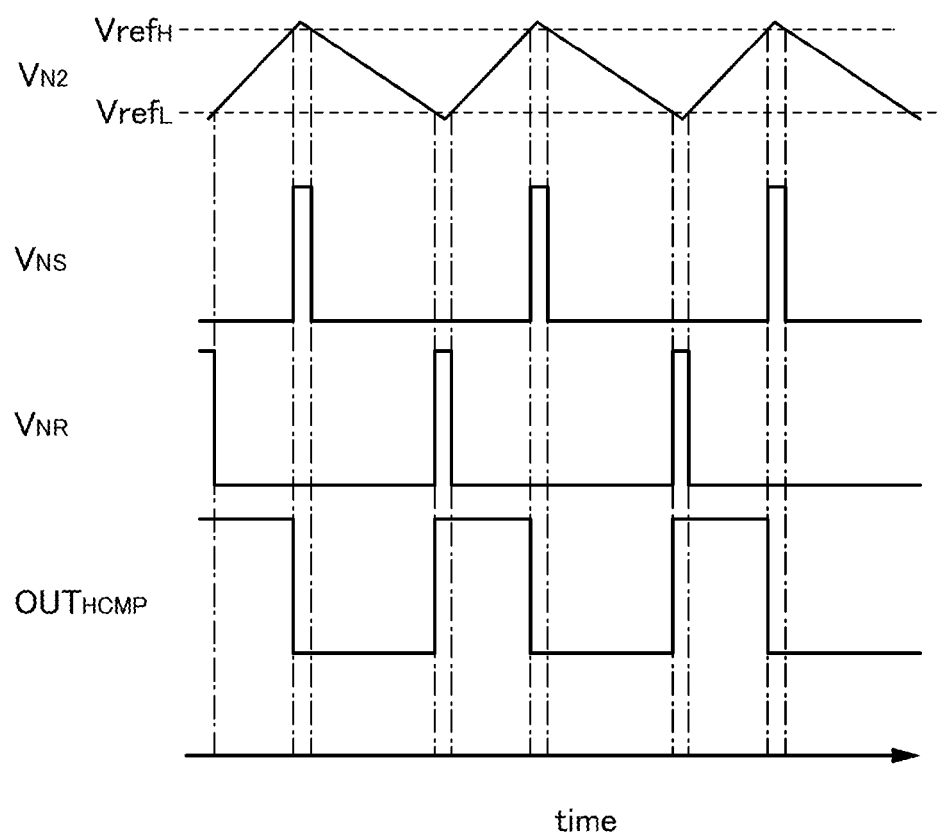
FIG. 5 is a timing chart illustrating an example of the operation of a hysteresis comparator.

Further, an example of the operation of the hysteresis comparator in this embodiment will be described with reference to FIG. 5. FIG. 5 is a timing chart used to describe an example of the operation of the hysteresis comparator in this embodiment. Waveforms of the voltage $V_{N2}$, voltage (also referred to as $V_{NS}$) of the node S, voltage (also referred to as $V_{NR}$) of the node R, and the output signal of the hysteresis comparator are illustrated.

For example, when the voltage $V_{N2}$ is a triangular wave as illustrated in FIG. 5, the voltage of the node S is kept at a low level during $Vref_L>V_{N2}$. Then, the state is changed from $Vref_L>V_{N2}$ to $Vref_L<V_{N2}$, the voltage of the node R is changed from a high level to a low level, and the signal $OUT_{HCMP}$ is kept at a high level during $Vref_H>V_{N2}>Vref_L$. When the state is changed from $Vref_H>V_{N2}>Vref_L$ to $V_{N2}>Vref_H$, the voltage of the node S is changed from a low level to a high level, and the signal $OUT_{HCMP}$ is changed from a high level to a low level. During $V_{N2}>Vref_H$, the voltage of the node S is kept at a high level. When the state is changed from $V_{N2}>Vref_H$ to $Vref_H>V_{N2}$, the voltage of the node S is changed from a high level to a low level. During $Vref_H>V_{N2}>Vref_L$, the signal $OUT_{HCMP}$ is kept at a low level. As described above, a pulse signal based on the voltage $V_{N2}$ which is a triangular wave is generated. That is an example of the operation of the hysteresis comparator illustrated in FIG. 4.

As described above, as illustrated in FIG. 2, FIG. 3, and FIG. 4 as examples, the DC converter circuit of this embodiment includes a coil which functions as an inductor, a transistor which functions as a switching element, a diode which functions as a rectifier, a capacitor which functions as a smoothing capacitor, and a hysteresis comparator which controls on or off of the transistor.

In addition, in the DC converter circuit of this embodiment, a transistor includes an oxide semiconductor layer serving as a channel formation layer, for example. In the oxide semiconductor layer, the hydrogen concentration is less than or equal to $5\times10^{19}$ atoms/cm$^3$, preferably less than or equal to $5\times10^{18}$ atoms/cm$^3$, more preferably less than or equal to $5\times10^{17}$ atoms/cm$^3$, and the carrier concentration is less than $1\times10^{12}$/cm$^3$, preferably less than $1\times10^{11}$/cm$^3$. The transistor with smaller off-state current and higher withstand voltage is provided as compared with a conventional transistor formed using silicon, for example. Accordingly, the transistor is used as a transistor included in the DC converter circuit, so that destruction of the transistor can be suppressed even when high voltage is applied between terminals of the transistor.

Next, an example of the operation of the DC converter circuit illustrated in FIG. 3 will be described.

A DC conversion method of the DC converter circuit of this embodiment is a pulse width modulation control method. The example of the operation of the DC converter circuit illustrated in FIG. 3 can be divided into a period T51 and a period T52. The operation in the period T51 and the operation in the period T52 are repeated alternately, so that the input voltage is stepped-down. Each period will be described below.

In the period T51, the transistor 202 is turned on in accordance with a pulse signal which is input from the hysteresis comparator 205, the voltage of the node N1 comes to be equal to the input voltage of the DC converter circuit illustrated in FIG. 3, and the diode 203 becomes a non-conducting state. The voltage of the node N1 comes to be equal to the input voltage, so that current flows to the coil 201. At this time, electromotive force is generated in the coil 201.

In the period T52, the transistor 202 is turned off in accordance with the pulse signal which is input from the hysteresis comparator 205. At this time, electromotive force V2 in the direction which is opposite to the direction of the electromotive force V1 is generated in the coil 201 in order to suppress a change of its magnetic field, and the diode 203 becomes a conducting state, whereby current flows to the diode 203 and the coil 201. The period T51 and the period T52 are repeated, so that the voltage of the node N2 is decreased. At this time, the output voltage of the DC converter circuit illustrated in FIG. 3 is lower than the input voltage. The value of the output voltage is determined by the ratio of the length of the period T51 to the period T52, in other words, the duty ratio of the pulse signal. For example, in the period T51 and the period T52, when the output voltage is higher than a desired value, the duty ratio of the pulse signal is set to be lower by the hysteresis comparator 205. When the output voltage is lower than a desired value, the duty ratio of the pulse signal is set to be higher by the hysteresis comparator 205. In this way, in the DC converter circuit illustrated in FIG. 3, feedback of the output voltage every unit period to the hysteresis comparator 205 makes it possible to bring the output voltage in a period after the feedback, close to a desired value.

As illustrated in FIG. 3, as an example of the DC converter circuit of this embodiment, the transistor which is electrically connected to the first terminal of the coil is turned on and off alternately in accordance with the duty ratio of the pulse signal which is input from the control circuit, and the input voltage is converted into the voltage with another value to generate the output voltage, whereby the DC converter circuit can function as a step-up circuit or a step-down circuit.

Note that this embodiment can be combined with or replaced by any of the other embodiments as appropriate.

Embodiment 3

In this embodiment, an example of a transistor which can be used as a transistor included in a DC converter circuit disclosed in this specification will be described.

An embodiment of a transistor and a method for manufacturing the transistor of this embodiment will be described with reference to FIGS. 6A and 6B and FIGS. 7A to 7E.

Figure 6A:
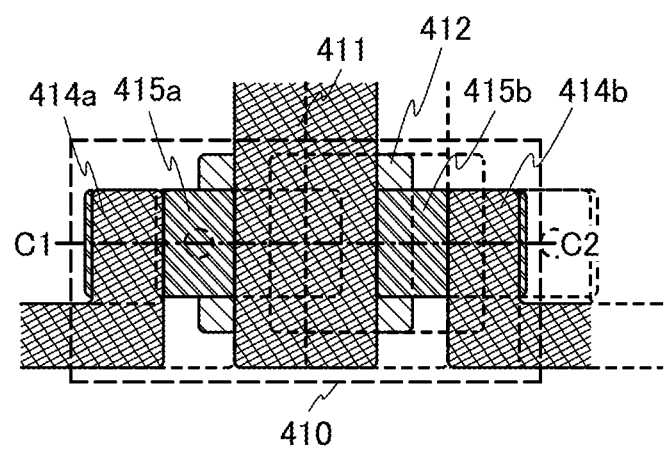
FIGS. 6A and 6B are a plan view and a cross-sectional view illustrating a transistor.
Figure 6B:
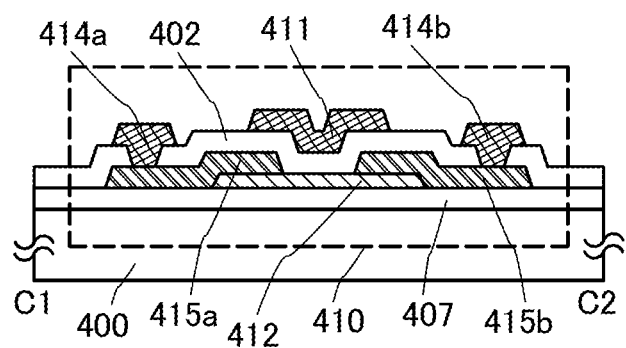

FIGS. 6A and 6B illustrate an example of a planar structure and an example of a cross-sectional structure of a transistor, respectively. A transistor 410 illustrated in FIGS. 6A and 6B is one of top-gate transistors.

FIG. 6A is a plan view of the top-gate transistor 410, and FIG. 6B is a cross-sectional view taken along line C1-C2 of FIG. 6A.

The transistor 410 includes, over a substrate 400 having an insulating surface, an insulating layer 407, an oxide semiconductor layer 412, a source electrode layer 415a, a drain electrode layer 415b, a gate insulating layer 402, and a gate electrode layer 411. A wiring layer 414a and a wiring layer 414b are in contact with the source electrode layer 415a and the drain electrode layer 415b, respectively.

Although the transistor 410 is a single-gate transistor in FIGS. 6A and 6B, a multi-gate transistor including a plurality of channel formation regions may be formed as the transistor of this embodiment.

A process for manufacturing the transistor 410 over the substrate 400 is described below with reference to FIGS. 7A to 7E.

There is no particular limitation on a substrate that can be used as the substrate 400 having an insulating surface as long as it has at least heat resistance to withstand heat treatment. For example, as the substrate 400, a glass substrate of barium borosilicate glass, aluminoborosilicate glass, or the like can be used.

Note that, instead of the glass substrate described above, a substrate formed using an insulator, such as a ceramic substrate, a quartz substrate, or a sapphire substrate, may be used. Alternatively, a crystallized glass substrate or the like can be used. Further alternatively, a plastic substrate or the like can be used as appropriate. Still alternatively, a semiconductor substrate of silicon or the like can be used as the substrate.

First, the insulating layer 407 which serves as a base film is formed over the substrate 400 having an insulating surface. As the insulating layer 407, an oxide insulating layer such as a silicon oxide layer, a silicon oxynitride layer (also referred to as $SiO_xN_y$, x>y>0), an aluminum oxide layer, or an aluminum oxynitride layer is preferably used. Although a plasma enhanced CVD method, a sputtering method, or the like can be used as a formation method of the insulating layer 407, a sputtering method is preferably used so that a large amount of hydrogen is prevented from being contained in the insulating layer 407.

In this embodiment, a silicon oxide layer is formed as the insulating layer 407 by a sputtering method. The substrate 400 is transferred to a treatment chamber and a high-purity sputtering gas from which hydrogen and moisture are removed and which contains oxygen is introduced, whereby a silicon oxide layer is formed as the insulating layer 407 over the substrate 400 using a silicon semiconductor target. The substrate 400 may be at room temperature or may be heated when the insulating layer 407 is formed.

For example, a silicon oxide film is formed by an RF sputtering method, in which quartz (preferably, synthetic quartz) is used as a target for forming the silicon oxide film, the substrate temperature is 108° C., the distance between the target and the substrate (T-S distance) is 60 mm, the pressure is 0.4 Pa, the high-frequency power is 1.5 kW, and an oxygen and argon atmosphere (the flow ratio of oxygen to argon is 1:1 (each flow rate is 25 sccm)) is used. The silicon oxide film has a thickness of 100 nm. Note that instead of quartz (preferably, synthetic quartz), a silicon target can be used as the target for forming the silicon oxide film. As a sputtering gas, oxygen or a mixed gas of oxygen and argon can be used.

In the case where the insulating layer 407 is formed using any one of the materials and any one of the methods, the insulating layer 407 is preferably formed while residual moisture in the treatment chamber is removed so that hydrogen, a hydroxyl group, or moisture is prevented from being contained in the insulating layer 407.

In order to remove residual moisture in the treatment chamber, an entrapment vacuum pump is preferably used. As the entrapment vacuum pump, a cryopump, an ion pump, or a titanium sublimation pump is preferably used, for example. Further, an exhaustion unit may be a turbo pump provided with a cold trap, for example. In a deposition chamber which is evacuated with the cryopump, a hydrogen atom, a compound containing a hydrogen atom (water or the like), and the like are removed, whereby the concentration of an impurity (specifically, hydrogen) contained in the insulating layer 407 formed in the deposition chamber can be reduced.

It is preferable to use a high-purity gas from which an impurity such as hydrogen, water, a hydroxyl group, or hydride is removed to a concentration expressed by a level of ppm or ppb, as a sputtering gas used when the insulating layer 407 is formed.

Examples of a sputtering method include an RF sputtering method in which a high-frequency power source is used as a sputtering power source, a DC sputtering method in which a direct current source is used, a pulsed DC sputtering method in which a bias is applied in a pulsed manner, and the like. An RF sputtering method is mainly used in the case where an insulating film is formed, and a DC sputtering method is mainly used in the case where a metal film is formed.

In addition, as a sputtering apparatus, there is a multi-source sputtering apparatus in which a plurality of targets of different materials can be set. With the multi-source sputtering apparatus, films of different materials can be formed to be stacked in the same chamber, or a film of plural kinds of materials can be formed by electric discharge at the same time in the same chamber.

In addition, as a sputtering apparatus, there are also a sputtering apparatus provided with a magnet system inside the chamber and used for a magnetron sputtering method, and a sputtering apparatus used for an ECR (Electron Cyclotron Resonance) sputtering method in which plasma generated with the use of microwaves is used without using glow discharge.

Furthermore, as a sputtering method, there are also a reactive sputtering method in which a target substance and a sputtering gas component are chemically reacted with each other during deposition to form a thin compound film thereof, and a bias sputtering method in which voltage is also applied to the substrate during deposition.

Further, the insulating layer 407 may have a stacked structure in which, for example, a nitride insulating layer and the oxide insulating layer are stacked in that order from the substrate 400 side. As the nitride insulating layer, for example, a silicon nitride layer, a silicon nitride oxide layer (also referred to as $SiN_xO_y$, x>y>0), an aluminum nitride layer, an aluminum nitride oxide layer, or the like can be used. As the oxide insulating layer, a silicon oxide layer, a silicon oxynitride layer, an aluminum oxide layer, an aluminum oxynitride layer, or the like can be used.

For example, a high-purity sputtering gas from which hydrogen and moisture are removed and which contains nitrogen is introduced and a silicon target is used, whereby a silicon nitride layer is formed over the substrate and a silicon oxide layer is formed over the silicon nitride layer. In that case, the silicon nitride layer is preferably formed in the state where residual moisture in the treatment chamber is removed in a manner similar to that for the silicon oxide layer.

In the case of forming the silicon nitride layer, the substrate 400 may be heated.

In the case where the silicon nitride layer and the silicon oxide layer are stacked to form the insulating layer 407, the silicon nitride layer and the silicon oxide layer can be formed in the same treatment chamber with the same silicon target. First, a sputtering gas containing nitrogen is introduced and a silicon target placed inside the treatment chamber is used to form the silicon nitride layer, and then, the sputtering gas is switched to a sputtering gas containing oxygen and the same silicon target is used to form the silicon oxide layer. Since the substrate 400 is not exposed to the air and the silicon nitride layer and the silicon oxide layer can be formed in succession, an impurity such as hydrogen or moisture can be prevented from being adsorbed on a surface of the silicon nitride layer.

Then, an oxide semiconductor film with a thickness of 2 nm to 200 nm inclusive is formed over the insulating layer 407.

In order for the oxide semiconductor film not to contain an impurity such as hydrogen, a hydroxyl group, or moisture as much as possible, it is preferable to preheat the substrate 400 provided with the insulating layer 407 in a preheating chamber of the sputtering apparatus as pretreatment so that an impurity such as hydrogen or moisture adsorbed on the substrate 400 is removed, and perform exhaustion. Note that a cryopump is preferable as an exhaustion unit provided in the preheating chamber, for example. Note that this preheating treatment can be omitted. Further, this preheating may be similarly performed on the substrate 400 over which the gate insulating layer 402 has not been formed and the substrate 400 over which layers up to and including the source electrode layer 415a and the drain electrode layer 415b have been formed.

Note that before the oxide semiconductor film is formed by a sputtering method, powdery substances (also referred to as particles or dust) which are generated at the time of film formation and attached to a surface of the insulating layer 407 are preferably removed by reverse sputtering in which an argon gas is introduced and plasma is generated. The reverse sputtering refers to a method in which, without application of voltage to a target side, a high-frequency power source is used for application of voltage to the substrate side in an argon atmosphere to generate plasma in the vicinity of the substrate and modify a surface. Note that instead of an argon atmosphere, a nitrogen atmosphere, a helium atmosphere, an oxygen atmosphere, or the like may be used.

The oxide semiconductor film can be formed by a sputtering method. As the oxide semiconductor film, any of the following oxide semiconductor film can be used: an In—Sn—Ga—Zn—O film that is a quaternary metal oxide; an In—Ga—Zn—O film, an In—Sn—Zn—O film, In—Al—Zn—O film, an Sn—Ga—Zn—O film, an Al—Ga—Zn—O film, or an Sn—Al—Zn—O film that is a ternary metal oxide; an In—Zn—O film, an Sn—Zn—O film, an Al—Zn—O film, a Zn—Mg—O film, an Sn—Mg—O film, an In—Mg—O film, or an In—Sn—O film that is a binary metal oxide; an In—O film; an Sn—O film; a Zn—O film; and the like. In addition, the above oxide semiconductor film may contain $SiO_2$.

The oxide semiconductor film can be formed using a film expressed by $InMO_3(ZnO)_m$, (m>0). Here, M represents one or more metal elements selected from Ga, Al, Mn, and Co. For example, Ga, Ga and Al, Ga and Mn, or Ga and Co can be given as M.

In this embodiment, the oxide semiconductor film is formed by a sputtering method with the use of an In—Ga—Zn—O-based metal oxide target as an example. In addition, the oxide semiconductor film can be formed by a sputtering method in a rare gas (typically argon) atmosphere, an oxygen atmosphere, or a mixed atmosphere containing a rare gas (typically argon) and oxygen. In the case of using a sputtering method, a target containing $SiO_2$ at 2 wt % to 10 wt % inclusive may be used for forming a film.

It is preferable to use a high-purity gas from which an impurity such as hydrogen, water, a hydroxyl group, or hydride is removed to a concentration expressed by a level of ppm or ppb, as a sputtering gas used when the oxide semiconductor film is formed.

As a target for forming the oxide semiconductor film by a sputtering method, a metal oxide target containing In, Ga, and Zn (in a composition ratio, $In_2O_3:Ga_2O_3:ZnO=1:1:1$ [mol %], In:Ga:Zn=1:1:0.5 [atom %]) may be used. The proportion of the volume of a portion except for an area occupied by a space and the like with respect to the total volume of the metal oxide target (also referred to as the filling factor) is greater than or equal to 90%, preferably greater than or equal to 95%. With the use of the metal oxide target with high filling factor, a dense oxide semiconductor film is formed.

In this embodiment, as an example, the substrate is held in the treatment chamber kept under reduced pressure, a sputtering gas from which hydrogen and moisture are removed is introduced into the treatment chamber from which residual moisture is being removed, and the oxide semiconductor film is formed over the substrate 400 with the use of a metal oxide as a target. In order to remove residual moisture in the treatment chamber, an entrapment vacuum pump is preferably used. As the entrapment vacuum pump, a cryopump, an ion pump, or a titanium sublimation pump is preferably used, for example. Further, an exhaustion unit may be a turbo pump provided with a cold trap, for example. In the deposition chamber which is evacuated with the cryopump, a hydrogen atom, a compound containing a hydrogen atom, such as water ($H_2O$), (more preferably, also a compound containing a carbon atom), and the like are removed; therefore, film formation is performed in the deposition chamber, whereby the concentration of an impurity in the oxide semiconductor film which is to be formed can be reduced. The substrate may be heated when the oxide semiconductor film is formed.

An example of the deposition conditions is as follows: the substrate temperature is room temperature, the distance between the substrate and the target is 60 mm, the pressure is 0.4 Pa, the DC power is 0.5 kW, and the atmosphere is an atmosphere containing oxygen and argon (the flow ratio of oxygen to argon is 15 sccm:30 sccm). It is preferable that a pulsed DC power supply be used because particles can be reduced and the film thickness can be uniform. The oxide semiconductor film preferably has a thickness of 5 nm to 30 nm inclusive. Note that the appropriate thickness of the oxide semiconductor film depends on an oxide semiconductor material used; therefore, the thickness may be selected as appropriate in accordance with a material.

Figure 7A:
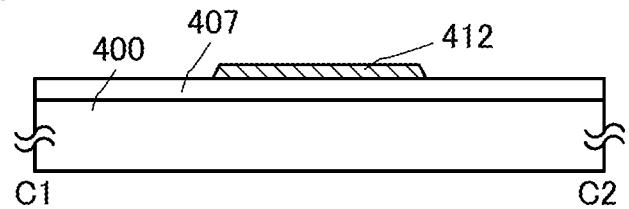
FIGS. 7A to 7E are cross-sectional views illustrating a method for manufacturing a transistor.
Figure 7B:
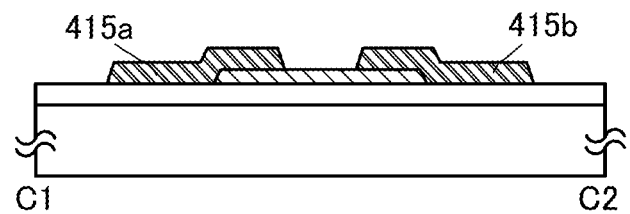

Then, the oxide semiconductor film is processed into the island-shaped oxide semiconductor layer 412 in a first photolithography step (see FIG. 7A). A resist mask for forming the island-shaped oxide semiconductor layer 412 may be formed by an ink-jet method. When the resist mask is formed by an ink-jet method, the manufacturing cost can be reduced.

Note that the etching of the oxide semiconductor film may be dry etching, wet etching, or both dry etching and wet etching.

As an etching gas for dry etching, a gas containing chlorine (chlorine-based gas such as chlorine ($Cl_2$), boron chloride ($BCl_3$), silicon chloride ($SiCl_4$), or carbon tetrachloride ($CCl_4$)) is preferably used.

In addition, a gas containing fluorine (fluorine-based gas such as carbon tetrafluoride ($CF_4$), sulfur hexafluoride ($SF_6$), nitrogen trifluoride (NF), or trifluoromethane ($CHF_3$)); hydrogen bromide (HBr); oxygen ($O_2$); any of these gases to which a rare gas such as helium (He) or argon (Ar) is added; or the like can be used as the etching gas for dry etching.

As a dry etching method, for example, a parallel plate RIE (reactive ion etching) method or an ICP (inductively coupled plasma) etching method can be used. In order to etch the film into a desired shape, the etching conditions (the amount of electric power applied to a coil-shaped electrode, the amount of electric power applied to an electrode on the substrate side, the temperature of the electrode on the substrate side, and the like) are adjusted as appropriate.

As an etchant used for wet etching, for example, a mixed solution of phosphoric acid, acetic acid, and nitric acid, or the like can be used. In addition, ITO07N (produced by KANTO CHEMICAL CO., INC.) may be used.

The etchant after the wet etching is removed by cleaning together with the material removed by etching. The waste liquid including the etchant and the material etched off may be purified and the material removed by etching may be reused. When a material such as indium contained in the oxide semiconductor layer is collected from the waste liquid after the etching and reused, the resources can be efficiently used and the manufacturing cost can be reduced.

The etching conditions (such as an etchant, etching time, and temperature) are appropriately adjusted depending on the material so that the material can be etched into a desired shape in etching.

In this embodiment, the oxide semiconductor film is processed into the island-shaped oxide semiconductor layer 412 by a wet etching method with a mixed solution of phosphoric acid, acetic acid, and nitric acid as an etchant as an example.

Next, the oxide semiconductor layer 412 is subjected to the first heat treatment. The temperature of the first heat treatment is from 400° C. to 750° C. inclusive, preferably higher than or equal to 400° C. and lower than the strain point of the substrate. Here, as an example, the substrate is introduced into an electric furnace which is one of heat treatment apparatuses, heat treatment is performed on the oxide semiconductor layer in a nitrogen atmosphere at 450° C. for 1 hour, and then, the oxide semiconductor layer is not exposed to the air and entry of water and hydrogen into the oxide semiconductor layer is prevented; thus, the oxide semiconductor layer is obtained. Through the first heat treatment, dehydration or dehydrogenation of the oxide semiconductor layer 412 can be conducted.

Note that the atmosphere of the heat treatment apparatus may be switched to an oxygen atmosphere when the temperature is decreased from the heat treatment temperature. When the atmosphere is switched to an oxygen atmosphere in decreasing the temperature, oxygen is supplied to an oxygen-deficient portion in the oxide semiconductor layer. Carriers are generated by oxygen deficiency; however, as the oxygen deficiency disappears, the carriers are remarkably decreased, whereby an oxide semiconductor layer with extremely low carrier concentration can be obtained.

Note that the heat treatment apparatus is not limited to an electric furnace and may have a device for heating an object to be processed by thermal conduction or thermal radiation from a heating element such as a resistance heating element. For example, an RTA (rapid thermal anneal) apparatus such as a GRTA (gas rapid thermal anneal) apparatus or an LRTA (lamp rapid thermal anneal) apparatus can be used. An LRTA apparatus is an apparatus for heating an object to be processed by radiation of light (an electromagnetic wave) emitted from a lamp such as a halogen lamp, a metal halide lamp, a xenon arc lamp, a carbon arc lamp, a high pressure sodium lamp, or a high pressure mercury lamp. A GRTA apparatus is an apparatus with which heat treatment is performed using a high-temperature gas. As the gas, an inert gas which does not react with an object to be processed by heat treatment, like nitrogen or a rare gas such as argon is used.

As the first heat treatment, GRTA treatment may be performed as follows. The substrate is put in an inert gas which has been heated to a temperature of 650° C. to 700° C., heated for several minutes, and taken out of the inert gas which has been heated to a high temperature. The GRTA treatment enables a high-temperature heat treatment for a short time.

Note that in the first heat treatment, it is preferable that water, hydrogen, or the like be not contained in an atmosphere (nitrogen or a rare gas such as helium, neon, or argon) in heat treatment. Alternatively, the purity of nitrogen or a rare gas such as helium, neon, or argon which is introduced into the heat treatment apparatus is preferably greater than or equal to 6 N (99.9999%), more preferably greater than or equal to 7 N (99.99999%) (i.e., the impurity concentration is preferably less than or equal to 1 ppm, more preferably less than or equal to 0.1 ppm).

In addition, the first heat treatment can be performed on the oxide semiconductor film before being processed into the island-shaped oxide semiconductor layer. In that case, the substrate is taken out of the heat treatment apparatus after the first heat treatment; then, a photolithography step is performed.

The heat treatment having an effect of dehydration or dehydrogenation with respect to the oxide semiconductor layer may be performed at any of the following timings: after the oxide semiconductor layer is formed; after a source electrode layer and a drain electrode layer are formed over the oxide semiconductor layer; and after a gate insulating layer is formed over the source electrode layer and the drain electrode layer.

Next, a conductive film is formed over the insulating layer 407 and the oxide semiconductor layer 412. The conductive film may be formed by a sputtering method or a vacuum evaporation method. As a material of the conductive film, an element selected from aluminum, chromium, copper, tantalum, titanium, molybdenum, and tungsten; an alloy containing any of these elements as a main component; an alloy film containing any of these elements in combination; or the like can be used. Further, one or more materials selected from manganese, magnesium, zirconium, beryllium, and yttrium may be used as a material of the conductive film. Further, the conductive film may have a single-layer structure or a stacked structure of two or more layers. For example, a single-layer structure of an aluminum film containing silicon can be given as a single-layer structure. As a stacked structure, a two-layer structure in which a titanium film is stacked over an aluminum film, a three-layer structure in which a titanium film, an aluminum film, and a titanium film are stacked in that order, and the like can be given. Alternatively, a film, an alloy film, or a nitride film which contains aluminum and one or more elements selected from titanium, tantalum, tungsten, molybdenum, chromium, neodymium, and scandium may be used.

Next, a resist mask is formed over the conductive film in a second photolithography step and selective etching is performed, so that the source electrode layer 415a and the drain electrode layer 415b are formed. Then, the resist mask is removed (see FIG. 7B). Note that the source electrode layer 415a and the drain electrode layer 415b which are formed preferably have tapered shapes because coverage with the gate insulating layer stacked over the source electrode layer 415a and the drain electrode layer 415b can be improved.

In this embodiment, a titanium film is formed to have a thickness of 150 nm by a sputtering method, a resist mask is formed over the titanium film, and the titanium film is selectively etched, so that the source electrode layer 415a and the drain electrode layer 415b are formed.

Note that materials and etching conditions of the conductive film and the oxide semiconductor film are adjusted as appropriate so that the oxide semiconductor layer 412 is not removed and the insulating layer 407 under the oxide semiconductor layer 412 is not exposed when the conductive film is etched.

In this embodiment, as an example, a titanium film is used as the conductive film, an In—Ga—Zn—O-based oxide semiconductor film is used as the oxide semiconductor film, and an ammonia hydrogen peroxide solution (a mixture of ammonia, water, and a hydrogen peroxide solution) is used as an etchant.

Note that in the second photolithography step, only part of the oxide semiconductor layer may be etched, whereby the oxide semiconductor layer 412 having a groove (a depressed portion) may be formed. In addition, the resist mask for forming the source electrode layer 415a and the drain electrode layer 415b may be formed by an ink-jet method. Formation of the resist mask by an ink-jet method needs no photomask; thus, manufacturing cost can be reduced.

Ultraviolet light, a KrF laser beam, or an ArF laser beam is used for light exposure for forming the resist mask in the second photolithography step. A channel length L of the transistor to be formed later depends on a width of a distance between a bottom portion of the source electrode layer and a bottom portion of the drain electrode layer which are adjacent to each other over the oxide semiconductor layer 412. Note that when light exposure is performed in the case where the channel length L is shorter than 25 nm, extreme ultraviolet light with extremely short wavelengths of several nanometers to several tens of nanometers is used for light exposure for forming the resist mask in the second photolithography step. Light exposure with extreme ultraviolet light leads to a high resolution and a large depth of focus. Accordingly, the channel length L of the transistor to be formed later can be set to 10 nm to 1000 nm inclusive. Thus, the operation speed of a circuit can be increased, and further, an off-state current can be significantly small, whereby low power consumption can be achieved.

Figure 7C:
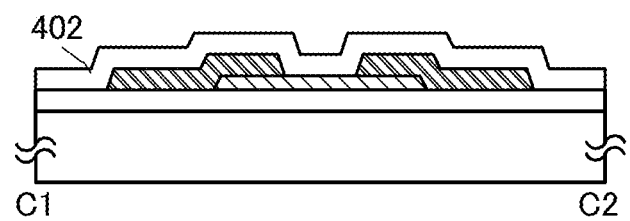

Next, the gate insulating layer 402 is formed over the insulating layer 407, the oxide semiconductor layer 412, the source electrode layer 415a, and the drain electrode layer 415b (see FIG. 7C).

The gate insulating layer 402 can be formed with a single-layer structure or a stacked structure using any of a silicon oxide layer, a silicon nitride layer, a silicon oxynitride layer, a silicon nitride oxide layer, and an aluminum oxide layer by a plasma enhanced CVD method, a sputtering method, or the like. Note that the gate insulating layer 402 is preferably formed by a sputtering method so that the gate insulating layer 402 contains hydrogen as little as possible. In the case where a silicon oxide film is formed by a sputtering method, for example, a silicon target or a quartz target is used as a target and oxygen or a mixed gas of oxygen and argon is used as a sputtering gas.

As the gate insulating layer 402, $HfO_x$ (x>0) or the like can be used, for example. When $HfO_x$ or the like is used for the gate insulating layer 402, leakage current which flows to a gate electrode from the oxide semiconductor layer side can be reduced.

The gate insulating layer 402 may have a structure where a silicon oxide layer and a silicon nitride layer are stacked in that order over the source electrode layer 415a and the drain electrode layer 415b. For example, a silicon oxide layer ($SiO_x$ (x>0)) with a thickness of 5 nm to 300 nm inclusive may be formed as a first gate insulating layer and a silicon nitride layer ($SiN_y$ (y>0)) with a thickness of 50 nm to 200 nm inclusive may be stacked as a second gate insulating layer over the first gate insulating layer by a sputtering method; thus, the gate insulating layer with a thickness of 100 nm may be formed. In this embodiment, as an example, a silicon oxide layer is formed to have a thickness of 100 nm by an RF sputtering method under the following conditions: the pressure is 0.4 Pa; the high frequency power is 1.5 kW; and the atmosphere is an atmosphere containing oxygen and argon (the flow ratio of oxygen to argon is 1:1 (each flow rate is 25 sccm).

Figure 7D:
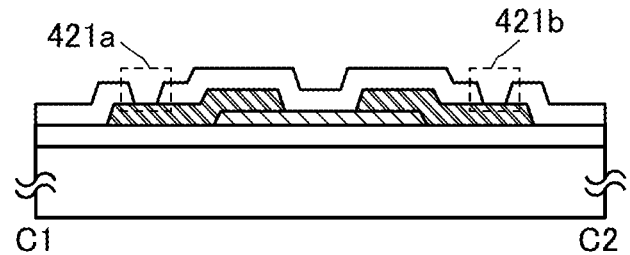

Next, a third photolithography step is performed to form a resist mask, and etching is selectively performed to remove part of the gate insulating layer 402, so that openings 421a and 421b reaching the source electrode layer 415a and the drain electrode layer 415b are formed (see FIG. 7D).

Then, after a conductive film is formed over the gate insulating layer 402 and in the openings 421a and 421b, the gate electrode layer 411 and the wiring layers 414a and 414b are formed in a fourth photolithography step. Note that a resist mask may be formed by an ink-jet method. When the resist mask is formed by an ink-jet method, manufacturing cost can be reduced.

The gate electrode layer 411 and the wiring layers 414a and 414b can be formed to have a single-layer structure or a stacked structure using a metal material such as molybdenum, titanium, chromium, tantalum, tungsten, aluminum, copper, neodymium, or scandium or an alloy material which contains any of these materials as a main component.

As a two-layer structure of each of the gate electrode layer 411 and the wiring layers 414a and 414b, for example, a two-layer structure in which a molybdenum layer is stacked over an aluminum layer, a two-layer structure in which a molybdenum layer is stacked over a copper layer, a two-layer structure in which a titanium nitride layer or a tantalum nitride layer is stacked over a copper layer, or a two-layer structure in which a titanium nitride layer and a molybdenum layer are stacked is preferable. As a three-layer structure, a stacked structure of a tungsten layer or a tungsten nitride layer, an alloy layer of aluminum and silicon or an alloy layer of aluminum and titanium, and a titanium nitride layer or a titanium layer is preferable. Note that the gate electrode layer 411 and the wiring layers 414a and 414b can be formed from a light-transmitting conductive film. As an example of a material of the light-transmitting conductive film, a light-transmitting conductive oxide and the like can be given.

In this embodiment, as an example, a titanium film is formed to have a thickness of 150 nm by a sputtering method, and the gate electrode layer 411 and the wiring layers 414a and 414b are formed using a photolithography method.

Next, the second heat treatment (preferably from 200° C. to 400° C. inclusive, for example, from 250° C. to 350° C.

inclusive) may be performed in an inert gas atmosphere or an oxygen gas atmosphere. In this embodiment, the second heat treatment is performed in a nitrogen atmosphere at 250° C. for 1 hour. The second heat treatment may be performed after a protective insulating layer or a planarization insulating layer is formed over the transistor 410.

Figure 7E:
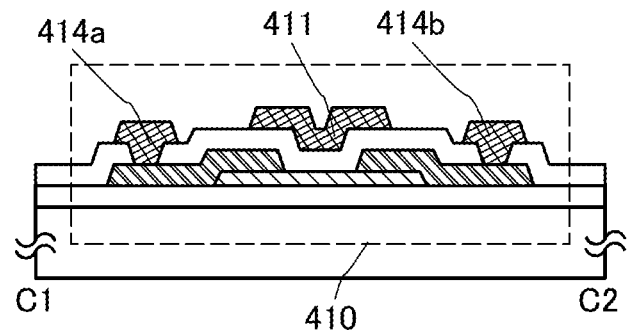

Through the above steps, the transistor 410 including the oxide semiconductor layer 412 in which the concentration of hydrogen, moisture, hydride, or hydroxide is reduced can be formed (see FIG. 7E).

A protective insulating layer or a planarization insulating layer for planarization may be provided over the transistor 410. For example, the protective insulating layer may be formed with a single-layer structure or a stacked structure using any of a silicon oxide layer, a silicon nitride layer, a silicon oxynitride layer, a silicon nitride oxide layer, and an aluminum oxide layer.

The planarization insulating layer can be formed using an organic material having heat resistance, such as polyimide, acrylic, benzocyclobutene, polyamide, or epoxy. Other than such organic materials, it is also possible to use a low-dielectric constant material (a low-k material), a siloxane-based resin, phosphosilicate glass (PSG), borophosphosilicate glass (BPSG), or the like. The planarization insulating layer may be formed by stacking a plurality of insulating films formed of these materials.

Note that the siloxane-based resin corresponds to a resin including a Si—O—Si bond formed using a siloxane-based material as a starting material. The siloxane-based resin may include as a substituent an organic group (e.g., an alkyl group or an aryl group) or a fluoro group. In addition, the organic group may include a fluoro group.

There is no particular limitation on the method for forming the planarization insulating layer, and the planarization insulating layer can be formed, depending on the material, by a method such as a sputtering method, an SOG method, spin coating, dip coating, spray coating, or a droplet discharge method (such as an ink-jet method, screen printing, offset printing, or the like), or a tool (equipment) such as a doctor knife, a roll coater, a curtain coater, or a knife coater.

Residual moisture in an atmosphere is removed as described above in forming the oxide semiconductor film, whereby the concentration of hydrogen and hydride in the oxide semiconductor film can be reduced. Accordingly, characteristics of the transistor can be stabilized.

As described above, the DC converter circuit having a transistor which is formed using an oxide semiconductor layer can have stable electric characteristics and high reliability.

Note that this embodiment can be combined with or replaced by any of the other embodiments as appropriate.

Embodiment 4

In this embodiment, another example of a transistor which can be used as a transistor included in a DC converter circuit disclosed in this specification will be described. The same portions as those in Embodiment 3 and portions having functions similar to those of the portions in Embodiment 3 and steps similar to those in Embodiment 3 may be handled as in Embodiment 3, and repeated description is omitted as appropriate. In addition, detailed description of the same portions is also omitted as appropriate.

An embodiment of a transistor and a method for manufacturing the transistor of this embodiment will be described with reference to FIGS. 8A and 8B and FIGS. 9A to 9E.

Figure 8A:
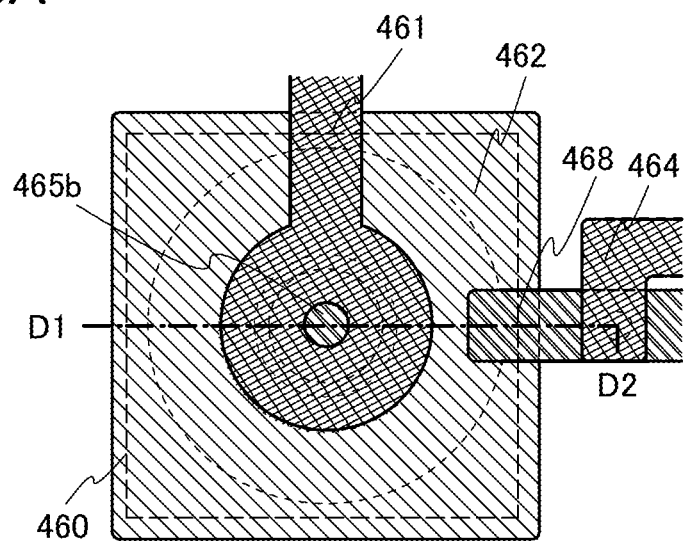
FIGS. 8A and 8B are a plan view and a cross-sectional view illustrating a transistor.
Figure 8B:
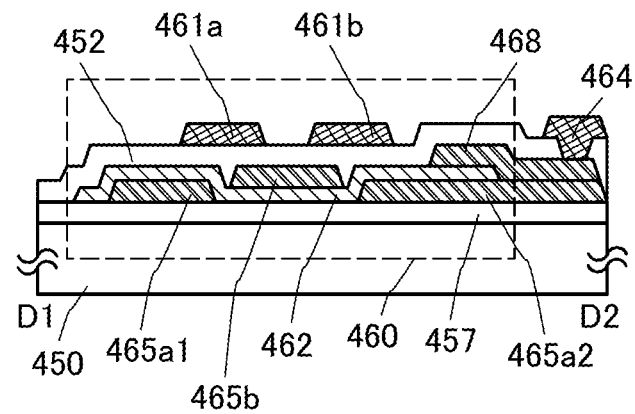

FIGS. 8A and 8B illustrate an example of a planar structure and an example of a cross-sectional structure of a transistor. A transistor 460 illustrated in FIGS. 8A and 8B is one of top gate transistors.

FIG. 8A is a plan view of the transistor 460 having a top-gate structure, and FIG. 8B is a cross-sectional view taken along line D1-D2 in FIG. 8A.

The transistor 460 includes, over a substrate 450 having an insulating surface, an insulating layer 457, electrode layers 465a1 and 465a2 serving as one of a source electrode layer and a drain electrode layer, an oxide semiconductor layer 462, an electrode layer 465b serving as the other of the source electrode layer and the drain electrode layer, a wiring layer 468, a gate insulating layer 452, and a gate electrode layer 461 (461a and 461b). An electrode layer 465a (465a1 and 465a2) is electrically connected to a wiring layer 464 through the wiring layer 468. Although not illustrated, the electrode layer 465b is electrically connected to a wiring layer through an opening formed in the gate insulating layer 452.

A process of manufacturing the transistor 460 over the substrate 450 is described below with reference to FIGS. 9A to 9E.

First, the insulating layer 457 serving as a base film is formed over the substrate 450 having an insulating surface.

In this embodiment, the substrate 450 is transferred to a treatment chamber and a high-purity sputtering gas from which hydrogen and moisture are removed and which contains oxygen is introduced, and a silicon oxide layer is formed as an example of the insulating layer 457 over the substrate 450 with the use of a silicon target or a quartz (preferably, synthetic quartz) by a sputtering method. As a sputtering gas, oxygen or a mixed gas of oxygen and argon is used.

In this embodiment, for example, a silicon oxide film is formed by an RF sputtering method under the following conditions: quartz (preferably, synthetic quartz) with a purity of 6N is used as a target; the substrate temperature is 108° C.; the distance between the substrate and the target (the T-S distance) is 60 mm; the pressure is 0.4 Pa; the high frequency power is 1.5 kW; and the atmosphere is an atmosphere containing oxygen and argon (the flow ratio of oxygen to argon is 1:1 (each flow rate is 25 sccm). The thickness of the silicon oxide film is 100 nm. Note that instead of quartz (preferably, synthetic quartz), a silicon target can be used as a target when the silicon oxide film is formed.

In the case where the insulating layer 457 is formed using any of the materials and any of the methods, the insulating layer 457 is preferably formed removing residual moisture in the treatment chamber. This is for preventing hydrogen, a hydroxyl group, or moisture from being contained in the insulating layer 457.

In order to remove residual moisture in the treatment chamber, an entrapment vacuum pump is preferably used. As the entrapment vacuum pump, a cryopump, an ion pump, or a titanium sublimation pump is preferably used, for example. Further, an exhaustion unit may be a turbo pump provided with a cold trap, for example. In the deposition chamber which is evacuated with the cryopump, a hydrogen atom, a compound containing a hydrogen atom (water or the like), and the like are removed, whereby the concentration of an impurity contained in the insulating layer 457 formed in the deposition chamber can be reduced.

It is preferable to use a high-purity gas from which an impurity such as hydrogen, water, a hydroxyl group, or hydride is removed to a concentration expressed by a level of ppm or ppb, as a sputtering gas used when the insulating layer 457 is formed.

Further, the insulating layer 457 may have a stacked structure in which, for example, a nitride insulating layer and the oxide insulating layer are stacked in that order from the substrate 450 side. For example, as the nitride insulating layer, a silicon nitride layer, a silicon nitride oxide layer, an aluminum nitride layer, an aluminum nitride oxide layer, or the like can be used. As the oxide insulating layer, a silicon oxide layer, a silicon oxynitride layer, an aluminum oxide layer, an aluminum oxynitride layer, or the like can be used.

For example, a high-purity sputtering gas from which hydrogen and moisture are removed and which contains nitrogen is introduced and a silicon target is used, whereby a silicon nitride layer is formed over the substrate and a silicon oxide layer is formed over the silicon nitride layer. In that case, the silicon nitride layer is preferably formed in the state where residual moisture in the treatment chamber is removed in a manner similar to that for the silicon oxide layer.

Next, a conductive film is formed over the insulating layer 457. A resist mask is formed over the conductive film in a first photolithography step and selective etching is performed, so that the electrode layers 465a1 and 465a2 are formed. Then, the resist mask is removed (see FIG. 9A). It seems in cross section as if the electrode layers 465a1 and 465a2 are divided; however, the electrode layers 465a1 and 465a2 are a continuous layer. Note that the source electrode layer and the drain electrode layer preferably have tapered shapes in end portions because coverage with the gate insulating layer stacked thereover can be improved.

As a material of the electrode layers 465a1 and 465a2, an element selected from aluminum, chromium, copper, tantalum, titanium, molybdenum, and tungsten; an alloy containing any of these elements as a main component; an alloy film containing any of these elements in combination; or the like can be used. Further, one or more materials selected from manganese, magnesium, zirconium, beryllium, and yttrium may be used as a material of the electrode layers 465a1 and 465a2. Further, the conductive film may have a single-layer structure or a stacked structure of two or more layers. For example, a single-layer structure of an aluminum film containing silicon can be given as a single-layer structure. As a stacked structure, a two-layer structure in which a titanium film is stacked over an aluminum film, a three-layer structure in which a titanium film, an aluminum film, and a titanium film are stacked in that order, and the like can be given. Alternatively, a film, an alloy film, or a nitride film which contains aluminum and one or more elements selected from titanium, tantalum, tungsten, molybdenum, chromium, neodymium, and scandium may be used.

In this embodiment, a titanium film is formed to have a thickness of 150 nm by a sputtering method for the electrode layers 465a1 and 465a2.

Then, an oxide semiconductor film is formed to have a thickness of 2 nm to 200 nm inclusive over the insulating layer 457.

Figure 9A:
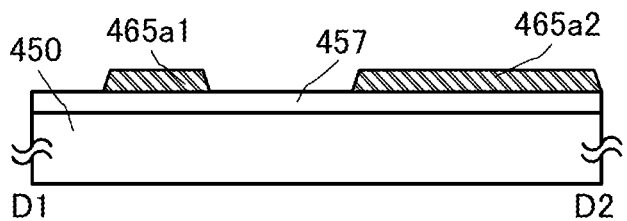
FIGS. 9A to 9E are cross-sectional views illustrating a method for manufacturing a transistor.
Figure 9B:
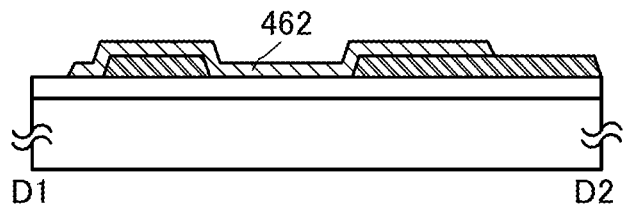
Figure 9C:
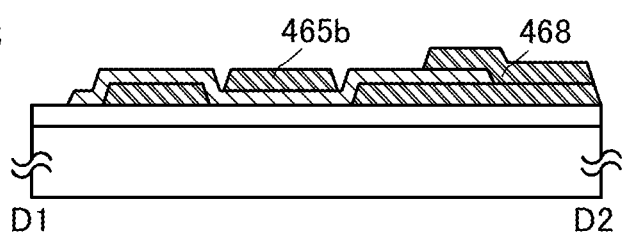

Then, the oxide semiconductor film is processed into the island-shaped oxide semiconductor layer 462 in a second photolithography step (see FIG. 9B). In this embodiment, the oxide semiconductor film is formed by a sputtering method with the use of an In—Ga—Zn—O-based metal oxide target.

In this embodiment, as an example, the substrate is held in the treatment chamber kept under reduced pressure, a sputtering gas from which hydrogen and moisture are removed is introduced into the treatment chamber from which residual moisture is being removed, and the oxide semiconductor film is formed over the substrate 450 with the use of a metal oxide as a target. In order to remove residual moisture in the treatment chamber, an entrapment vacuum pump is preferably used. As the entrapment vacuum pump, a cryopump, an ion pump, or a titanium sublimation pump is preferably used, for example. Further, an exhaustion unit may be a turbo pump provided with a cold trap, for example. In the deposition chamber which is evacuated with the cryopump, a hydrogen atom, a compound containing a hydrogen atom, such as water ($H_2O$), (more preferably, also a compound containing a carbon atom), and the like are removed, whereby the concentration of an impurity in the oxide semiconductor film formed in the deposition chamber can be reduced. The substrate may be heated when the oxide semiconductor film is formed.

It is preferable to use a high-purity gas from which an impurity such as hydrogen, water, a hydroxyl group, or hydride is removed to a concentration expressed by a level of ppm or ppb, as a sputtering gas used when the oxide semiconductor film is formed.

An example of the deposition conditions is as follows: the substrate temperature is room temperature, the distance between the substrate and the target is 60 mm, the pressure is 0.4 Pa, the DC power is 0.5 kW, and the atmosphere is an atmosphere containing oxygen and argon (the flow ratio of oxygen to argon is 15 sccm:30 sccm). It is preferable that a pulsed DC power supply be used because particles can be reduced and the film thickness can be uniform. The oxide semiconductor film preferably has a thickness of 5 nm to 30 nm inclusive. Note that the appropriate thickness of the oxide semiconductor film depends on an oxide semiconductor material used; therefore, the thickness may be selected as appropriate in accordance with a material.

In this embodiment, as an example, the oxide semiconductor film is processed into the island-shaped oxide semiconductor layer 462 by a wet etching method with a mixed solution of phosphoric acid, acetic acid, and nitric acid as an etchant.

Next, the oxide semiconductor layer 462 is subjected to the first heat treatment. The temperature of the first heat treatment is from 400° C. to 750° C. inclusive, preferably higher than or equal to 400° C. and lower than the strain point of the substrate. Here, as an example, the substrate is introduced into an electric furnace which is one of heat treatment apparatuses, heat treatment is performed on the oxide semiconductor layer in a nitrogen atmosphere at 450° C. for 1 hour, and then, the oxide semiconductor layer is not exposed to the air and entry of water and hydrogen into the oxide semiconductor layer is prevented; thus, the oxide semiconductor layer is obtained. Through the first heat treatment, dehydration or dehydrogenation of the oxide semiconductor layer 462 can be conducted.

Note that the atmosphere of the heat treatment apparatus may be switched to an oxygen atmosphere when the temperature is decreased from the heat treatment temperature. When the atmosphere is switched to an oxygen atmosphere in decreasing the temperature, oxygen is supplied to an oxygen-deficient portion in the oxide semiconductor layer. Carriers are generated by oxygen deficiency; however, as the oxygen deficiency disappears, the carriers are remarkably decreased, whereby an oxide semiconductor layer with extremely low carrier concentration can be obtained.

Note that the heat treatment apparatus is not limited to an electric furnace and may have a device for heating an object to be processed by thermal conduction or thermal radiation from a heating element such as a resistance heating element. For example, an RTA apparatus such as a GRTA apparatus or an LRTA apparatus can be used. For example, as the first heat treatment, GRTA may be performed as follows. The substrate is transferred in an inert gas which has been heated to a high temperature of 650° C. to 700° C., heated for several minutes, and transferred and taken out of the inert gas which has been heated to a high temperature. GRTA enables a high-temperature heat treatment for a short time.

Note that in the first heat treatment, it is preferable that water, hydrogen, or the like be not contained in nitrogen or a rare gas such as helium, neon, or argon. Alternatively, the purity of nitrogen or a rare gas such as helium, neon, or argon which is introduced into the heat treatment apparatus is greater than or equal to 6 N (99.9999%), preferably greater than or equal to 7 N (99.99999%) (i.e., the impurity concentration is less than or equal to 1 ppm, preferably less than or equal to 0.1 ppm).

In addition, the first heat treatment on the oxide semiconductor layer can be performed on the oxide semiconductor film before being processed into the island-shaped oxide semiconductor layer. In that case, the substrate is taken out of the heat treatment apparatus after the first heat treatment; then a photolithography step is performed.

The heat treatment having an effect of dehydration or dehydrogenation with respect to the oxide semiconductor layer may be performed at any of the following timings: after the oxide semiconductor layer is formed; after a source electrode layer and a drain electrode layer are formed over the oxide semiconductor layer; and after a gate insulating layer is formed over the source electrode layer and the drain electrode layer.

Next, a conductive film is formed over the insulating layer 457 and the oxide semiconductor layer 462. A resist mask is formed over the conductive film in a third photolithography step and selective etching is performed, so that the electrode layer 465b and the wiring layer 468 are formed. Then, the resist mask is removed (see FIG. 9C). The electrode layer 465b and the wiring layer 468 may be formed using a material and steps similar to those of the electrode layers 465a1 and 465a2.

In this embodiment, as an example, a titanium film is formed to have a thickness of 150 nm by a sputtering method, a resist mask is formed over the titanium film in a third photolithography step, and a selective etching is performed to form the electrode layer 465b and the wiring layer 468. In this embodiment, the same titanium film is used for the electrode layers 465a1 and 465a2 and the electrode layer 465b, so that the etching rate of the electrode layers 465a1 and 465a2 is the same or substantially the same as that of the electrode layer 465b. Therefore, the wiring layer 468 is provided over a portion of the electrode layer 465a2, which is not covered with the oxide semiconductor layer 462, to prevent the electrode layers 465a1 and 465a2 from being etched when the electrode layer 465b is etched. In the case of using different materials which provide high selectivity ratio of the electrode layer 465b to the electrode layer 465a1 and 465a2 in the etching step, the wiring layer 468 which protects the electrode layer 465a2 in etching is not necessarily provided.

Note that the material and the etching conditions of the conductive film and the oxide semiconductor film are adjusted as appropriate so that the oxide semiconductor layer 462 is not removed in etching of the conductive film.

In this embodiment, as an example, a titanium film is used as the conductive film, an In—Ga—Zn—O-based oxide semiconductor film is used as the oxide semiconductor film, and an ammonia hydrogen peroxide solution (a mixture of ammonia, water, and a hydrogen peroxide solution) is used as an etchant.

Note that in the third photolithography step, only part of the oxide semiconductor layer 462 may be etched, whereby the oxide semiconductor layer 462 having a groove (a depressed portion) may be formed. A resist mask for forming the electrode layer 465b and the wiring layer 468 may be formed by an ink-jet method. Formation of the resist mask by an ink-jet method needs no photomask; thus, manufacturing cost can be reduced.

Next, the gate insulating layer 452 is formed over the insulating layer 457, the oxide semiconductor layer 462, the electrode layer 465a1 and 465a2, the electrode layer 465b, and the wiring layer 468.

The gate insulating layer 452 can be formed with a single-layer structure or a stacked structure using any of a silicon oxide layer, a silicon nitride layer, a silicon oxynitride layer, a silicon nitride oxide layer, and an aluminum oxide layer by a plasma enhanced CVD method, a sputtering method, or the like. Note that the gate insulating layer 452 is preferably formed by a sputtering method so that the gate insulating layer 452 contains hydrogen as little as possible. In the case where a silicon oxide film is formed by a sputtering method, for example, a silicon target or a quartz target is used as a target and oxygen or a mixed gas of oxygen and argon is used as a sputtering gas.

As the gate insulating layer 452, for example, $HfO_x$ or the like can also be used. When $HfO_x$ or the like is used for the gate insulating layer 452, leakage current which flows to a gate electrode from the oxide semiconductor layer side can be reduced.

The gate insulating layer 452 may have a structure where a silicon oxide layer and a silicon nitride layer are stacked in that order over the electrode layers 465a1 and 465a2 and the electrode layer 465b. In this embodiment, as an example, a silicon oxide layer is formed to have a thickness of 100 nm by an RF sputtering method under the following conditions: the pressure is 0.4 Pa; the high frequency power is 1.5 kW; and the atmosphere is an atmosphere containing oxygen and argon (the flow ratio of oxygen to argon is 1:1 (each flow rate is 25 sccm).

Figure 9D:
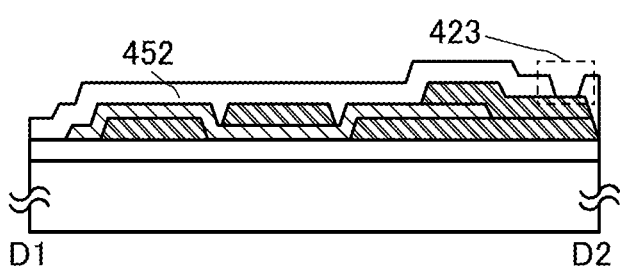

Next, a resist mask is formed in a fourth photolithography step and selective etching is performed to remove part of the gate insulating layer 452, so that an opening 423 reaching the wiring layer 468 is formed (see FIG. 9D). Although not illustrated, in forming the opening 423, an opening reaching the electrode layer 465b may be formed. In this embodiment, the opening reaching the electrode layer 465b is formed after an interlayer insulating layer is further stacked, and a wiring layer which is electrically connected to the electrode layer 465b is formed in the opening as an example.

Then, after a conductive film is formed over the gate insulating layer 452 and in the opening 423, the gate electrode layer 461 (461a and 461b) and the wiring layer 464 are formed in a fifth photolithography step. Note that a resist mask may be formed by an ink-jet method. When the resist mask is formed by an ink-jet method, the manufacturing cost can be reduced.

The conductive film for forming the gate electrode layer 461 (461a and 461b) and the wiring layer 464 can be formed with a single layer or stacked layers using a metal material such as molybdenum, titanium, chromium, tantalum, tungsten, aluminum, copper, neodymium, or scandium, or an alloy material containing any of these materials as a main component.

In this embodiment, for example, a titanium film is formed to have a thickness of 150 nm by a sputtering method, and the gate electrode layers 461a and 461b and the wiring layer 464 are formed using the fifth photolithography step.

Next, the second heat treatment (preferably from 200° C. to 400° C. inclusive, for example, from 250° C. to 350° C. inclusive) may be performed in an inert gas atmosphere or an oxygen gas atmosphere. In this embodiment, the second heat treatment is performed in a nitrogen atmosphere at 250° C. for 1 hour. The second heat treatment may be performed after a protective insulating layer or a planarization insulating layer is formed over the transistor 460.

Figure 9E:
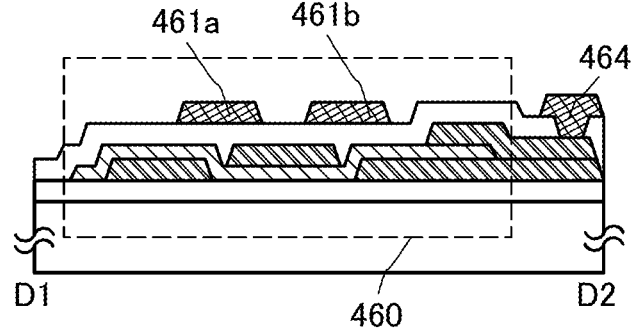

Through the above steps, the transistor 460 including the oxide semiconductor layer 462 in which the concentration of hydrogen, moisture, hydride, or hydroxide is reduced can be formed (see FIG. 9E).

A protective insulating layer or a planarization insulating layer for planarization may be provided over the transistor 460. Although not illustrated, an opening reaching the electrode layer 465*b* is formed in the gate insulating layer 452 and the protective insulating layer and/or the planarization insulating layer, and a wiring layer which is electrically connected to the electrode layer 465*b* is formed in the opening.

This embodiment can be implemented by being combined with any of other embodiments as appropriate.

Residual moisture in an atmosphere is removed as described above in forming the oxide semiconductor film, whereby the concentration of hydrogen and hydride in the oxide semiconductor film can be reduced. Accordingly, the oxide semiconductor film can be stable.

Thus, the DC converter circuit having the transistor including the oxide semiconductor layer can have stable electric characteristics and high reliability.

Embodiment 5

In this embodiment, an example of a transistor which can be used as a transistor included in a DC converter circuit of an embodiment of the present invention will be described. The same portions as those in Embodiment 3 or 4 and portions having functions similar to those of the portions in Embodiment 3 or 4 and steps similar to those in Embodiment 3 or 4 may be handled as in Embodiment 3 or 4, and repeated description is omitted as appropriate. In addition, detailed description of the same portions is also omitted as appropriate.

The transistors of this embodiment will be described with reference to FIGS. 10A and 10B.

Figure 10A:
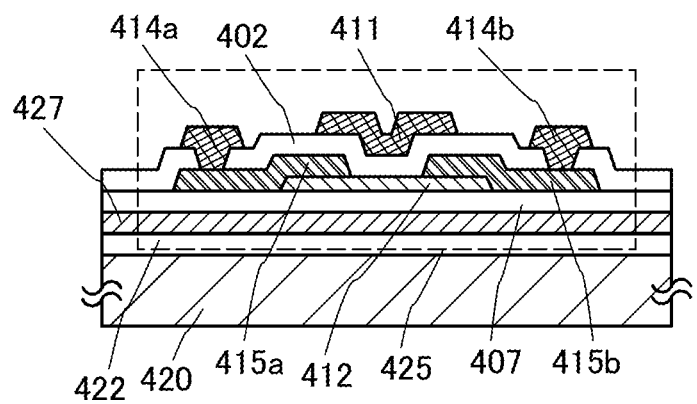
FIGS. 10A and 10B are cross-sectional views illustrating a transistor.
Figure 10B:
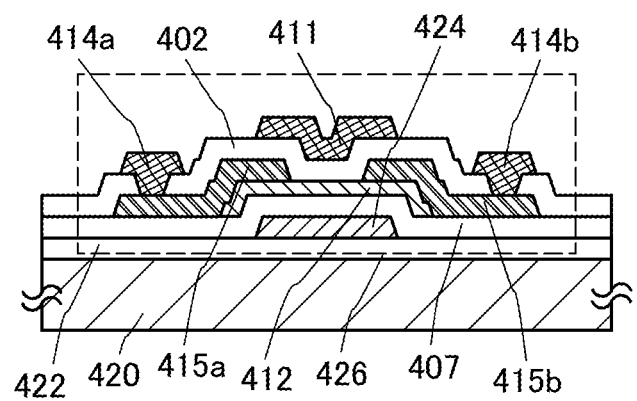

FIGS. 10A and 10B illustrate examples of cross-sectional structures of the transistors. Transistors 425 and 426 in FIGS. 10A and 10B are each one of transistors where an oxide semiconductor layer is sandwiched between a conductive layer and a gate electrode layer.

In addition, in FIGS. 10A and 10B, a silicon substrate is used as a substrate and each of the transistors 425 and 426 is provided over an insulating layer 422 which is formed over a silicon substrate 420.

In FIG. 10A, a conductive layer 427 is formed between the insulating layer 422 and the insulating layer 407 over the silicon substrate 420 so as to overlap with at least the whole oxide semiconductor layer 412.

Note that FIG. 10B illustrates an example where the conductive layer between the insulating layer 422 and the insulating layer 407 is processed like a conductive layer 424 by etching and overlaps with part of the oxide semiconductor layer 412, which includes at least a channel formation region.

The conductive layers 427 and 424 may each be formed using a metal material which can resist temperature for heat treatment to be performed later: an element selected from titanium, tantalum, tungsten, molybdenum, chromium, neodymium, and scandium, an alloy containing any of these elements as a component, an alloy film containing any of these elements in combination, a nitride containing any of the above elements as a component, or the like. Further, the conductive layers 427 and 424 may each have either a single-layer structure or a stacked structure, and for example, a single layer of a tungsten layer or a stacked structure of a tungsten nitride layer and a tungsten layer can be used.

A potential of the conductive layers 427 and 424 may be the same as or different from that of the gate electrode layer 411 of the transistors 425 and 426. Each of the conductive layers 427 and 424 can also function as a second gate electrode layer. The potential of the conductive layers 427 and 424 may be a fixed potential such as GND or 0 V.

Electric characteristics of the transistors 425 and 426 can be controlled by the conductive layers 427 and 424.

This embodiment is not limited to the structure in which the second gate electrode layer is formed by providing the conductive layer. When a semiconductor substrate is used as the substrate, the substrate is subjected to thermal oxidation to form a region in the substrate, and the region can also function as the second gate electrode layer.

This embodiment can be combined with or replaced by any of the other embodiments as appropriate.

Embodiment 6

In this embodiment, an example of a transistor which can be used as the transistor included in a DC converter circuit of an embodiment of the present invention will be described.

An example of a transistor and a method for manufacturing the transistor of this embodiment will be described with reference to FIGS. 11A to 11E.

FIGS. 11A to 11E illustrate an example of a method for manufacturing a transistor. A transistor illustrated in FIGS. 11A to 11E is one of bottom gate transistors and is also referred to as an inverted staggered transistor.

A transistor 390 is a single-gate transistor; a multi-gate transistor including a plurality of channel formation regions may be used as a transistor of this embodiment.

A process of manufacturing the transistor 390 over a substrate 394 is described below with reference to FIGS. 11A to 11E.

First, after a conductive film is formed over the substrate 394 having an insulating surface, a first photolithography step is performed to form a resist mask over the conductive film, and the conductive film is selectively etched, so that a gate electrode layer 391 is formed. End portions of the gate electrode layer 391 are preferably tapered. When the end portions of the gate electrode layer 391 have tapered shapes, coverage with a gate insulating layer stacked thereover can be improved. Note that a resist mask may be formed by an ink-jet method. When the resist mask is formed by an ink-jet method, manufacturing cost can be reduced.

There is no particular limitation on a substrate that can be used as the substrate 394 having an insulating surface as long as it has at least heat resistance to withstand heat treatment performed later. For example, a glass substrate formed using barium borosilicate glass, aluminoborosilicate glass, or the like can be used as the substrate 394.

Note that, instead of the glass substrate described above, a substrate formed using an insulator, such as a ceramic substrate, a quartz substrate, or a sapphire substrate, may be used. Alternatively, a crystallized glass substrate or the like can be used. Further alternatively, a plastic substrate or the like can be used as appropriate. Still alternatively, a semiconductor substrate of silicon or the like can be used as the substrate.

An insulating film serving as a base film may be provided between the substrate 394 and the gate electrode layer 391. The base film has a function of preventing diffusion of an impurity element from the substrate 394, and can be formed with a single-layer structure or a stacked structure using one or more of a silicon nitride film, a silicon oxide film, a silicon nitride oxide film, and a silicon oxynitride film.

The gate electrode layer 391 can be formed with a single layer or stacked layers using a metal material such as molybdenum, titanium, chromium, tantalum, tungsten, aluminum, copper, neodymium, or scandium, or an alloy material which contains any of these materials as a main component.

As a two-layer structure of the gate electrode layer 391, for example, a two-layer structure in which a molybdenum layer is stacked over an aluminum layer, a two-layer structure in which a molybdenum layer is stacked over a copper layer, a two-layer structure in which a titanium nitride layer or a tantalum nitride layer is stacked over a copper layer, a two-layer structure in which a titanium nitride layer and a molybdenum layer are stacked, or a two-layer structure in which a tungsten nitride layer and a tungsten layer are stacked is preferable. As a three-layer structure, a stacked structure of a tungsten layer or a tungsten nitride layer, an alloy layer of aluminum and silicon or an alloy layer of aluminum and titanium, and a titanium nitride layer or a titanium layer is preferable. Note that the gate electrode layer 391 can be formed using a light-transmitting conductive film. A light-transmitting conductive oxide and the like can be given as an example of the light-transmitting conductive film.

Then, a gate insulating layer 397 is formed over the gate electrode layer 391.

An oxide semiconductor (a highly purified oxide semiconductor) which is made to be i-type or substantially i-type by removal of an impurity is highly sensitive to an interface state and interface electric charge; thus, an interface between the oxide semiconductor and the gate insulating layer is important. Therefore, the gate insulating layer (GI) which is in contact with the highly purified oxide semiconductor layer needs high quality.

For example, high-density plasma enhanced CVD using microwaves (2.45 GHz) is preferable because a dense high-quality insulating film having high withstand voltage can be formed. This is because when the highly purified oxide semiconductor layer is closely in contact with the high-quality gate insulating film, the interface state can be reduced and interface characteristics can be favorable. Here, as a high-density plasma apparatus, an apparatus which can realize a plasma density of greater than or equal to $1\times10^{11}/\text{cm}^3$ can be used.

For example, plasma is generated by applying a microwave power of 3 kW to 6 kW, and the insulating film is formed. A monosilane gas ($SiH_4$), nitrous oxide ($N_2O$), and a rare gas are introduced into a chamber as a source gas to generate high-density plasma at a pressure of 10 Pa to 30 Pa, and the insulating film is formed over the substrate having an insulating surface, such as a glass substrate. After that, the supply of a monosilane gas is stopped, and nitrous oxide ($N_2O$) and a rare gas are introduced without exposure to the air, so that plasma treatment may be performed on a surface of the insulating film. The plasma treatment performed on the surface of the insulating film by introducing nitrous oxide ($N_2O$) and a rare gas is performed at least after the insulating film is formed. The flow ratio of a monosilane gas ($SiH_4$) to nitrous oxide ($N_2O$) which are introduced into the chamber is in the range of 1:10 to 1:200. In addition, as a rare gas which is introduced into the chamber, helium, argon, krypton, xenon, or the like can be used. In particular, argon, which is inexpensive, is preferably used.

Needless to say, a different deposition method such as a sputtering method or a plasma enhanced CVD method can be used as long as a high-quality insulating film can be formed as the gate insulating layer 397. Further, an insulating film whose film quality and characteristic of an interface between the insulating film and an oxide semiconductor are improved by heat treatment which is performed after formation of the insulating film may be formed as a gate insulating film. In any case, any insulating film can be used as long as film quality as a gate insulating film is high, interface state density with an oxide semiconductor is decreased, and a favorable interface can be formed.

For example, in a gate-bias thermal stress test (BT test) at 85° C., at a voltage applied to the gate of $2\times10^6$ V/cm for 12 hours, if an impurity has been added to an oxide semiconductor, the bond between the impurity and the main component of the oxide semiconductor is broken by a high electric field (B: bias) and high temperature (T: temperature), so that a generated dangling bond induces a shift in the threshold voltage ($V_{th}$). As a countermeasure against this, in the transistor which is used in a DC converter circuit of an embodiment of the present invention, the impurity in the oxide semiconductor, particularly, hydrogen, water, or the like is removed as much as possible so that the characteristics of an interface between the oxide semiconductor layer and the gate insulating layer are favorable as described above. Accordingly, it is possible to obtain a transistor which is stable with respect to the BT test.

As the gate insulating layer 397, a single layer or stacked layer can be formed using one or more of a silicon oxide layer, a silicon nitride layer, a silicon oxynitride layer, a silicon nitride oxide layer, and an aluminum oxide layer.

As the gate insulating layer 397, $HfO_x$ or the like can be used, for example. When $HfO_x$ or the like is used for the gate insulating layer 397, leakage current which flows to a gate electrode from the oxide semiconductor layer side can be reduced.

In addition, the gate insulating layer 397 can have a structure in which a silicon oxide layer and a silicon nitride layer are stacked. In this embodiment, for example, a silicon oxynitride layer with a thickness of 100 nm is formed by a high-density plasma enhanced CVD method with a pressure of 30 Pa and a microwave power of 6 kW. The flow ratio of a monosilane gas ($SiH_4$) to nitrous oxide ($N_2O$) which are introduced into the chamber is in the range of 1:10 to 1:200.

Further, in order that hydrogen, a hydroxyl group, and moisture might be contained in the gate insulating layer 397 and an oxide semiconductor film 393 as little as possible, it is preferable that the substrate 394 over which the gate electrode layer 391 is formed or the substrate 394 over which layers up to and including the gate insulating layer 397 are formed be preheated in a preheating chamber of a sputtering apparatus as pretreatment for film formation so that an impurity such as hydrogen and moisture adsorbed to the substrate 394 is removed and exhaustion is performed. The temperature for the preheating is 100° C. to 400° C. inclusive, preferably 150° C. to 300° C. inclusive. Note that a cryopump is preferable as an exhaustion unit provided in the preheating chamber, for example. Note that this preheating treatment can be omitted. Further, this preheating may be similarly performed on the substrate 394 over which layers up to and including a source electrode layer and a drain electrode layer have been formed, before formation of an oxide insulating layer.

Figure 11A:
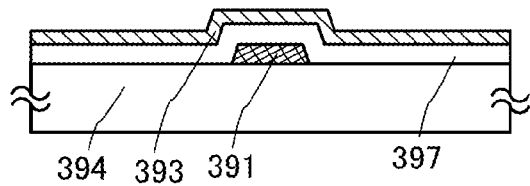
FIGS. 11A to 11E are cross-sectional views illustrating a method for manufacturing a transistor.

Then, the oxide semiconductor film 393 is formed to have a thickness of 2 nm to 200 nm inclusive over the gate insulating layer 397 (see FIG. 11A).

Note that before the oxide semiconductor film 393 is formed, particles attached to a surface of the gate insulating layer 397 are preferably removed by reverse sputtering in which an argon gas is introduced and plasma is generated.

The oxide semiconductor film 393 is formed by a sputtering method, for example. As the oxide semiconductor film 393, any of the following oxide semiconductor films can be used: an In—Sn—Ga—Zn—O film that is a quaternary metal oxide; an In—Ga—Zn—O film, an In—Sn—Zn—O film, In—Al—Zn—O film, an Sn—Ga—Zn—O film, an Al—Ga—Zn—O film, or an Sn—Al—Zn—O film that is a ternary metal oxide; an In—Zn—O film, an Sn—Zn—O film, an Al—Zn—O film, a Zn—Mg—O film, an Sn—Mg—O film, an In—Mg—O film, or In—Sn—O film that is a binary metal oxide; an In—O film; an Sn—O film; a Zn—O film; and the like. In addition, the above oxide semiconductor film may contain $SiO_2$.

The oxide semiconductor film 393 can be formed using a film expressed by $InMO_3(ZnO)_m$ (m>0). Here, M represents one or more metal elements selected from Ga, Al, Mn, and Co. For example, Ga, Ga and Al, Ga and Mn, or Ga and Co can be given as M.

In this embodiment, the oxide semiconductor film 393 is formed by a sputtering method with the use of an In—Ga—Zn—O-based metal oxide target as an example. In addition, the oxide semiconductor film 393 can be formed by a sputtering method in a rare gas (typically argon) atmosphere, an oxygen atmosphere, or an atmosphere containing a rare gas (typically argon) and oxygen. In the case of using a sputtering method, a target containing $SiO_2$ at 2 wt % to 10 wt % inclusive may be used for forming a film.

As a target for forming the oxide semiconductor film 393 by a sputtering method, a metal oxide target containing zinc oxide as a main component can be used. As another example of a metal oxide target, a metal oxide target containing In, Ga, and Zn (in a composition ratio, $In_2O_3:Ga_2O_3:ZnO=1:1:1$ [mol %], In:Ga:Zn=1:1:0.5 [atom %]) can be used. The filling factor of the metal oxide target is greater than or equal to 90%, preferably greater than or equal to 95%. With the use of the metal oxide target with high filling factor, a dense oxide semiconductor film is formed.

In this embodiment, as an example, the substrate is held in a treatment chamber kept under reduced pressure, and the substrate is heated to room temperature or a temperature of lower than 400° C. Then, a sputtering gas from which hydrogen and moisture are removed is introduced into the treatment chamber from which residual moisture is being removed, and the oxide semiconductor film 393 is formed over the substrate 394 with the use of a metal oxide as a target. In order to remove residual moisture in the treatment chamber, an entrapment vacuum pump is preferably used. As the entrapment vacuum pump, a cryopump, an ion pump, or a titanium sublimation pump is preferably used, for example. Further, an exhaustion unit may be a turbo pump provided with a cold trap, for example. In the deposition chamber which is evacuated with the cryopump, a hydrogen atom, a compound containing a hydrogen atom, such as water ($H_2O$), (more preferably, also a compound containing a carbon atom), and the like are removed; therefore, film formation is performed in the deposition chamber, whereby the concentration of an impurity in the oxide semiconductor film can be reduced. By performing deposition by sputtering while removing residual moisture left in the treatment chamber using a cryopump, the substrate temperature when the oxide semiconductor film 393 is formed can be higher than or equal to room temperature and lower than 400° C.

An example of the deposition conditions is as follows: the distance between the substrate and the target is 60 mm, the pressure is 0.6 Pa, the DC power is 0.5 kW, and the atmosphere is an oxygen atmosphere (the flow rate of oxygen is 100%). It is preferable that a pulsed DC power supply be used because particles can be reduced and the film thickness can be uniform. The oxide semiconductor film preferably has a thickness of 5 nm to 30 nm inclusive. Note that the appropriate thickness of the oxide semiconductor film depends on an oxide semiconductor material used; therefore, the thickness may be selected as appropriate in accordance with a material.

Figure 11B:
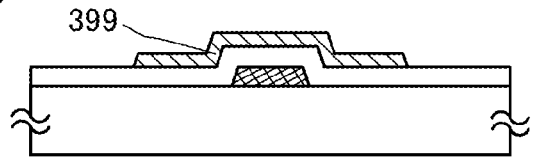
Figure 11C:
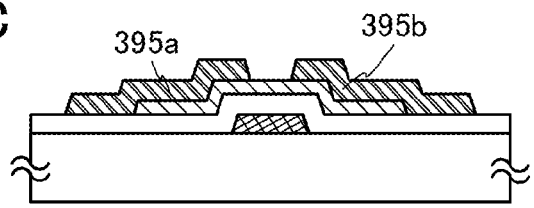

Next, the oxide semiconductor film is processed into an island-shaped oxide semiconductor layer 399 in a second photolithography step (see FIG. 11B). Further, a resist mask for forming the island-shaped oxide semiconductor layer 399 may be formed by an ink-jet method. When the resist mask is formed by an ink-jet method, the manufacturing cost can be reduced.

In the case of forming a contact hole in the gate insulating layer 397, the step may be performed in forming the oxide semiconductor layer 399.

Note that the etching of the oxide semiconductor film 393 may be dry etching, wet etching, or both dry etching and wet etching.

As an etching gas for dry etching, a gas containing chlorine (chlorine-based gas such as chlorine ($CL_2$), boron chloride ($BCl_3$), silicon chloride ($SiCl_4$), or carbon tetrachloride ($CCl_4$)) is preferably used.

In addition, a gas containing fluorine (fluorine-based gas such as carbon tetrafluoride ($CF_4$), sulfur hexafluoride ($SF_6$), nitrogen trifluoride (NF), or trifluoromethane ($CHF_3$)); hydrogen bromide (HBr); oxygen ($O_2$); any of these gases to which a rare gas such as helium (He) or argon (Ar) is added; or the like can be used as the etching gas for dry etching.

As a dry etching method, a parallel plate RIE (reactive ion etching) method or an ICP (inductively coupled plasma) etching method can be used. In order to etch the film into a desired shape, the etching conditions (the amount of electric power applied to a coil-shaped electrode, the amount of electric power applied to an electrode on the substrate side, the temperature of the electrode on the substrate side, and the like) are adjusted as appropriate.

As an etchant used for wet etching, for example, a mixed solution of phosphoric acid, acetic acid, and nitric acid, or the like can be used. In addition, ITO07N (produced by KANTO CHEMICAL CO., INC.) may be used.

The etchant after the wet etching is removed together with the material etched off by cleaning. The waste liquid including the etchant and the material etched off may be purified and the material may be reused. When a material such as indium contained in the oxide semiconductor layer is collected from the waste liquid after the etching and reused, the resources can be efficiently used and the cost can be reduced.

The etching conditions (such as an etchant, etching time, and temperature) are appropriately adjusted depending on the material so that the material can be etched into a desired shape in etching.

In this embodiment, it is preferable to perform reverse sputtering before formation of a conductive film in the following step so that a resist residue and the like attached to surfaces of the oxide semiconductor layer 399 and the gate insulating layer 397 can be removed.

Next, a conductive film is formed over the gate insulating layer 397 and the oxide semiconductor layer 399. The conductive film may be formed by a sputtering method or a vacuum evaporation method. As a material of the conductive film, an element selected from aluminum, chromium, copper, tantalum, titanium, molybdenum, and tungsten; an alloy containing any of these elements as a component; an alloy film containing any of these elements in combination; or the like can be used. Further, one or more materials selected from manganese, magnesium, zirconium, beryllium, and yttrium may be used as a material of the conductive film. Further, the conductive film may have a single-layer structure or a stacked structure of two or more layers. For example, a single-layer structure of an aluminum film containing silicon can be given as a single-layer structure. As a stacked structure, a two-layer structure in which a titanium film is stacked over an aluminum film, a three-layer structure in which a titanium film, an aluminum film, and a titanium film are stacked in that order, and the like can be given. Alternatively, a film, an alloy film, or a nitride film which contains aluminum and one or more elements selected from titanium, tantalum, tungsten, molybdenum, chromium, neodymium, and scandium may be used.

Next, a resist mask is formed over the conductive film in a third photolithography step and selective etching is performed, so that a source electrode layer 395a and a drain electrode layer 395b are formed. Then, the resist mask is removed (see FIG. 11C).

Ultraviolet light, a KrF laser beam, or an ArF laser beam is used for light exposure for forming the resist mask in the third photolithography step. A channel length L of the transistor to be formed later depends on a width of a distance between a bottom portion of the source electrode layer and a bottom portion of the drain electrode layer which are adjacent to each other over the oxide semiconductor layer 399. Note that when light exposure is performed in the case where the channel length L is shorter than 25 nm, extreme ultraviolet light with extremely short wavelengths of several nanometers to several tens of nanometers is used for light exposure for forming the resist mask in the third photolithography step. Light exposure with extreme ultraviolet light leads to a high resolution and a large depth of focus. Accordingly, the channel length L of the transistor to be formed later can be set to 10 nm to 1000 nm inclusive. Thus, the operation speed of a circuit can be increased, and further, an off-state current can be significantly small, whereby low power consumption can be achieved.

Note that the material and the etching conditions of the conductive film and the oxide semiconductor film are adjusted as appropriate so that the oxide semiconductor layer 399 is not removed by etching of the conductive film.

In this embodiment, as an example, a titanium film is used as the conductive film, an In—Ga—Zn—O-based oxide semiconductor layer is used as the oxide semiconductor layer 399, and an ammonia hydrogen peroxide solution (a mixture of ammonia, water, and a hydrogen peroxide solution) is used as an etchant.

In the third photolithography step, part of the oxide semiconductor layer 399 may be etched off, whereby the oxide semiconductor layer 399 having a groove (a depression portion) may be formed. Note that a resist mask used for forming the source electrode layer 395a and the drain electrode layer 395b may be formed by an ink-jet method. When the resist mask is formed by an ink-jet method, the manufacturing cost can be reduced.

In order to reduce the number of photomasks and steps in a photolithography step, etching may be performed with the use of a resist mask formed using a multi-tone mask which is a light-exposure mask through which light is transmitted so as to have a plurality of intensities. Since a resist mask formed using a multi-tone mask has a plurality of thicknesses and can be further changed in shape by performing etching, the resist mask can be used in a plurality of etching steps to provide different patterns. Therefore, a resist mask corresponding to at least two kinds of different patterns can be formed by using one multi-tone mask. Thus, the number of light-exposure masks can be reduced and the number of corresponding photolithography steps can be also reduced, whereby simplification of a process can be realized.

With plasma treatment using a gas such as $N_2O$, $N_2$, or Ar, water or the like adsorbed to a surface of an exposed portion of the oxide semiconductor layer may be removed. Alternatively, plasma treatment may be performed using a mixed gas of oxygen and argon.

Figure 11D:
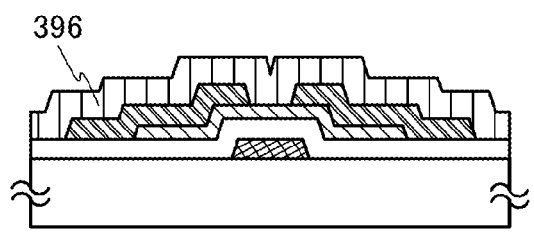

In the case of performing the plasma treatment, an oxide insulating layer 396 is formed without exposure to the air as an oxide insulating layer which is to serve as a protective insulating layer and is in contact with part of the oxide semiconductor layer (see FIG. 11D). In this embodiment, the oxide insulating layer 396 is formed in contact with the oxide semiconductor layer 399 in a region where the oxide semiconductor layer 399 does not overlap with the source electrode layer 395a and the drain electrode layer 395b.

In this embodiment, the substrate 394 over which layers up to and including the island-shaped oxide semiconductor layer 399, the source electrode layer 395a, and the drain electrode layer 395b have been formed is heated to room temperature or a temperature of lower than 100° C. and a high-purity sputtering gas from which hydrogen and moisture are removed and which contains oxygen is introduced, and a silicon semiconductor target is used, whereby a silicon oxide layer having a defect is formed as the oxide insulating layer 396.

In this embodiment, for example, the silicon oxide film is formed by a pulsed DC sputtering method in which the purity is 6N, a boron-doped silicon target (the resistivity is 0.01 Ωcm) is used, the distance between the substrate and the target (T-S distance) is 89 mm, the pressure is 0.4 Pa, the DC power is 6 kW, and the atmosphere is an oxygen atmosphere (the oxygen flow rate is 100%). The thickness of the silicon oxide film is 300 nm. Note that instead of a silicon target, quartz (preferably, synthetic quartz) can be used as a target when the silicon oxide film is formed. As a sputtering gas, oxygen or a mixed gas of oxygen and argon is used, for example.

In the case where the oxide insulating layer 396 is formed using any of the materials and any of the methods, the oxide insulating layer 396 is preferably formed removing residual moisture in the treatment chamber. This is for preventing hydrogen, a hydroxyl group, or moisture from being contained in the oxide semiconductor layer 399 and the oxide insulating layer 396.

In order to remove residual moisture in the treatment chamber, an entrapment vacuum pump is preferably used. As the entrapment vacuum pump, a cryopump, an ion pump, or a titanium sublimation pump is preferably used, for example. Further, an exhaustion unit may be a turbo pump provided with a cold trap. In the deposition chamber which is evacuated with the cryopump, a hydrogen atom, a compound containing a hydrogen atom (water or the like), and the like are removed, whereby the concentration of an impurity contained in the oxide insulating layer 396 formed in the deposition chamber can be reduced.

Note that as the oxide insulating layer 396, a silicon oxynitride layer, an aluminum oxide layer, an aluminum oxynitride layer, or the like may be used instead of the silicon oxide layer.

Further, heat treatment may be performed at 100° C. to 400° C. while the oxide insulating layer 396 and the oxide semiconductor layer 399 are in contact with each other. Since the oxide insulating layer 396 in this embodiment has a lot of defects, with this heat treatment, an impurity such as hydrogen, moisture, a hydroxyl group, or hydride contained in the oxide semiconductor layer 399 can be diffused to the oxide insulating layer 396 so that the impurity in the oxide semiconductor layer 399 can be further reduced.

Figure 11E:
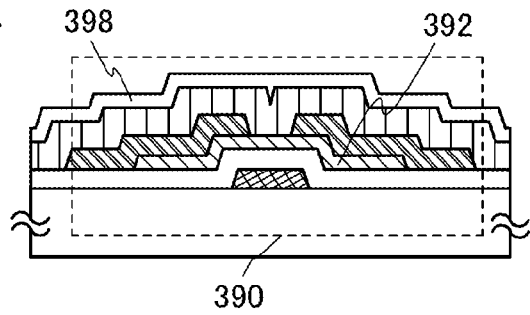

Through the above steps, the transistor 390 including an oxide semiconductor layer 392 in which the concentration of hydrogen, moisture, a hydroxyl group, or hydride is reduced can be formed (see FIG. 11E).

Residual moisture in an atmosphere is removed as described above in forming the oxide semiconductor film, whereby the concentration of hydrogen and hydride in the oxide semiconductor film can be reduced. Accordingly, the oxide semiconductor film can be stable.

Note that a protective insulating layer may be provided over the oxide insulating layer. In this embodiment, a protective insulating layer 398 is formed over the oxide insulating layer 396. As the protective insulating layer 398, a silicon nitride film, a silicon nitride oxide film, an aluminum nitride film, an aluminum nitride oxide film, or the like is used.

In this embodiment, as an example, the substrate 394 over which layers up to and including the oxide insulating layer 396 have been formed is heated to a temperature of 100° C. to 400° C., a high-purity sputtering gas from which hydrogen and moisture are removed and which contains nitrogen is introduced, and a silicon semiconductor target is used, whereby a silicon nitride film is formed as the protective insulating layer 398. In that case, the protective insulating layer 398 is preferably formed removing residual moisture in the treatment chamber, similarly to the oxide insulating layer 396.

In the case where the protective insulating layer 398 is formed, the substrate 394 is heated to 100° C. to 400° C. in forming the protective insulating layer 398, whereby hydrogen or moisture contained in the oxide semiconductor layer 399 can be diffused to the oxide insulating layer 396. In that case, heat treatment is not necessarily performed after formation of the oxide insulating layer 396.

In the case where the silicon oxide layer is formed as the oxide insulating layer 396 and the silicon nitride layer is stacked thereover as the protective insulating layer 398, the silicon oxide layer and the silicon nitride layer can be formed with the use of a common silicon target in the same treatment chamber. After a sputtering gas containing oxygen is introduced first, a silicon oxide layer is formed using a silicon target mounted in the treatment chamber, and then, the sputtering gas is switched to a sputtering gas containing nitrogen and the same silicon target is used to form a silicon nitride layer. Since the silicon oxide layer and the silicon nitride layer can be formed successively without being exposed to the air, an impurity such as hydrogen and moisture can be prevented from adsorbing onto a surface of the silicon oxide layer. In that case, after the silicon oxide layer is formed as the oxide insulating layer 396 and the silicon nitride layer is stacked thereover as the protective insulating layer 398, heat treatment (at a temperature of 100° C. to 400° C.) for diffusing hydrogen or moisture contained in the oxide semiconductor layer to the oxide insulating layer 396 is preferably performed.

Residual moisture in an atmosphere is removed in forming the oxide semiconductor layer including a channel formation region over the gate insulating layer, whereby the concentration of hydrogen and hydride in the oxide semiconductor layer can be reduced.

Since the above steps can be performed at a temperature of lower than or equal to 400° C., they can also be applied to manufacturing steps where a glass substrate with a thickness of less than or equal to 1 mm and a side of greater than 1 m is used. In addition, all of the above steps can be performed at a treatment temperature of lower than or equal to 400° C.

An electrical conduction mechanism of a transistor including an oxide semiconductor will be described with reference to FIG. 12, FIGS. 13A and 13B, FIGS. 14A and 14B, and FIG. 15. Note that the following description is based on the assumption of an ideal situation for simplification and does not entirely reflect a real situation. In addition, the following description is only an examination.

Figure 12:
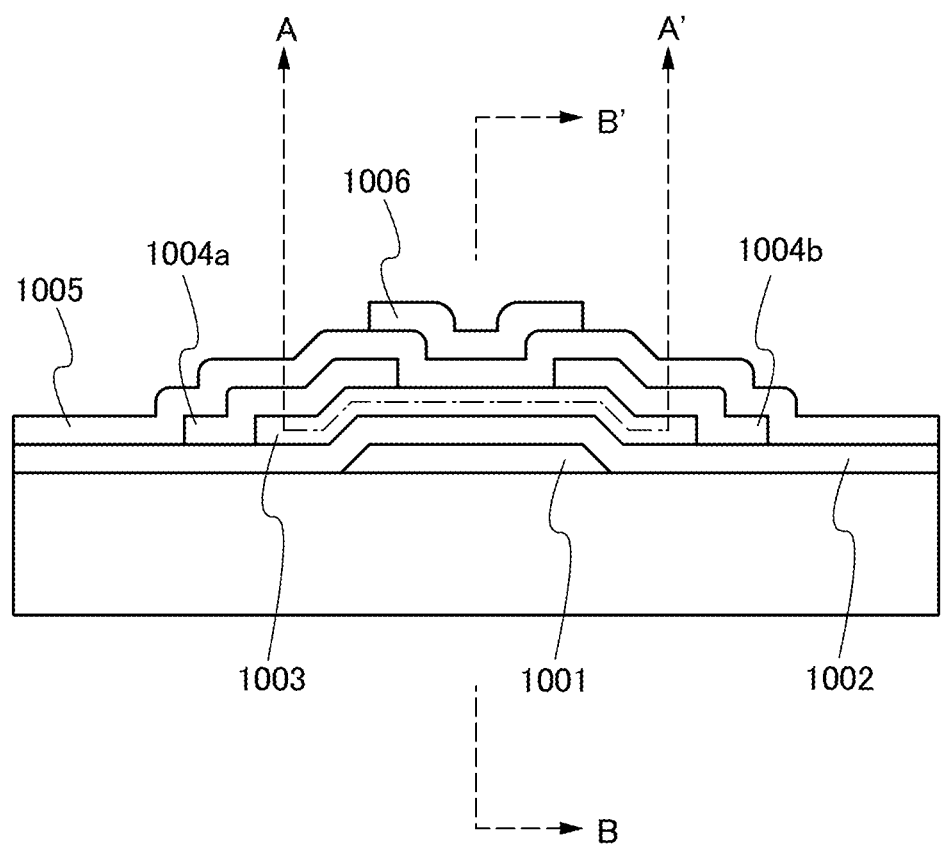
FIG. 12 is a longitudinal cross-sectional view of an inverted staggered transistor formed using an oxide semiconductor.

FIG. 12 is a cross-sectional view of an inverted staggered transistor including an oxide semiconductor. An oxide semiconductor layer 1003 is provided over a gate electrode 1001 with a gate insulating film 1002 therebetween, a source electrode 1004a and a drain electrode 1004b are provided thereover, an oxide insulating layer 1005 is provided over the source electrode 1004a and the drain electrode 1004b, and a conductive layer 1006 is provided over the oxide semiconductor layer 1003 with the oxide insulating layer 1005 therebetween.

Figure 13A:
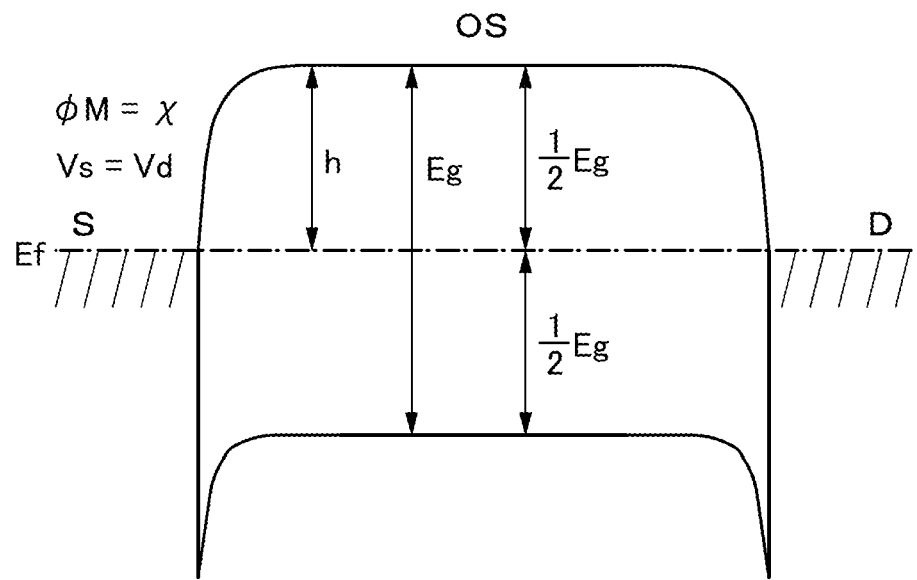
FIGS. 13A and 13B are energy band diagrams (schematic diagrams) of a cross section taken along line A-A' in FIG. 12.
Figure 13B:
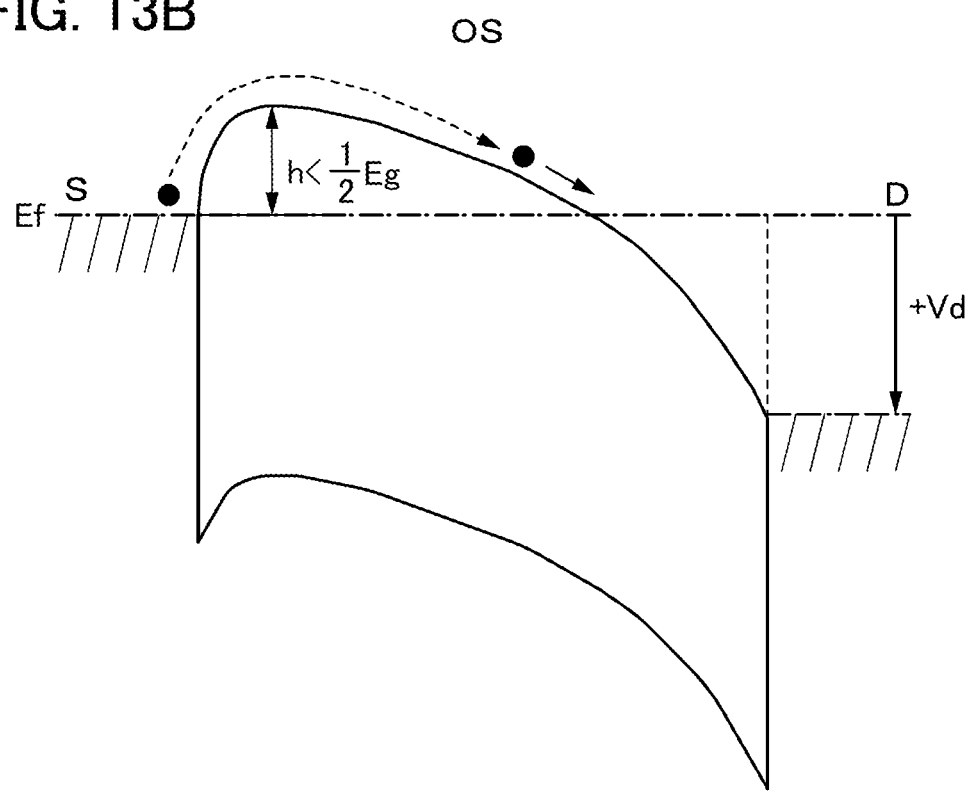

FIGS. 13A and 13B are energy band diagrams (schematic diagrams) of a cross section taken along line A-A' in FIG. 12. FIG. 13A illustrates the case where the voltage between a source and a drain is zero (Vd=0 V, the potential of the source and the potential of the drain are the same), and FIG. 13B illustrates the case where a potential (Vd>0), which is positive when the potential of the source is used as a reference potential, is applied to the drain and a positive potential (Vg>0) is applied to a gate.

Figure 14A:
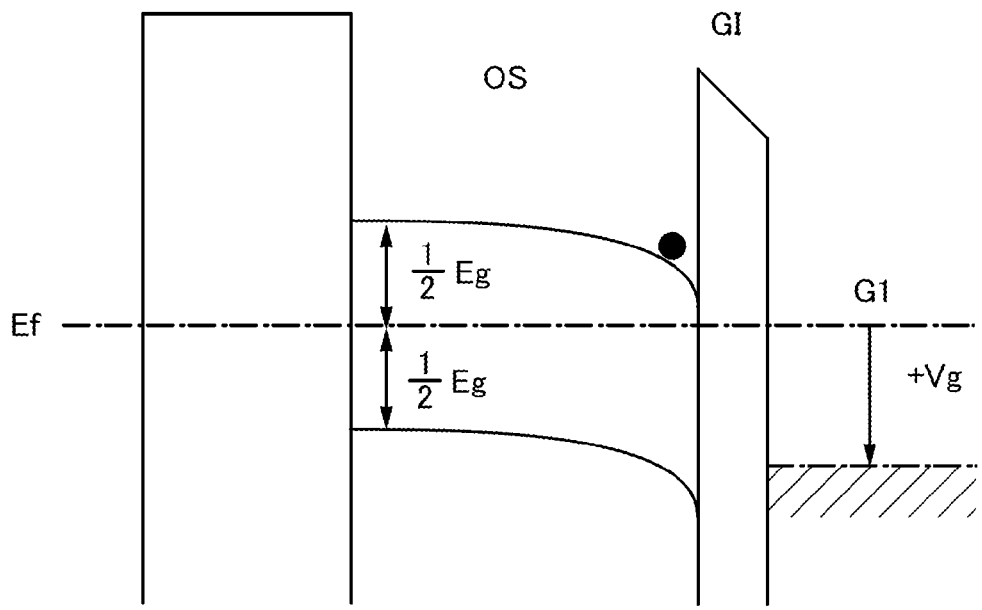
FIG. 14A is a diagram illustrating a state in which a positive potential (+Vg) is applied to a gate electrode 1001.
Figure 14B:
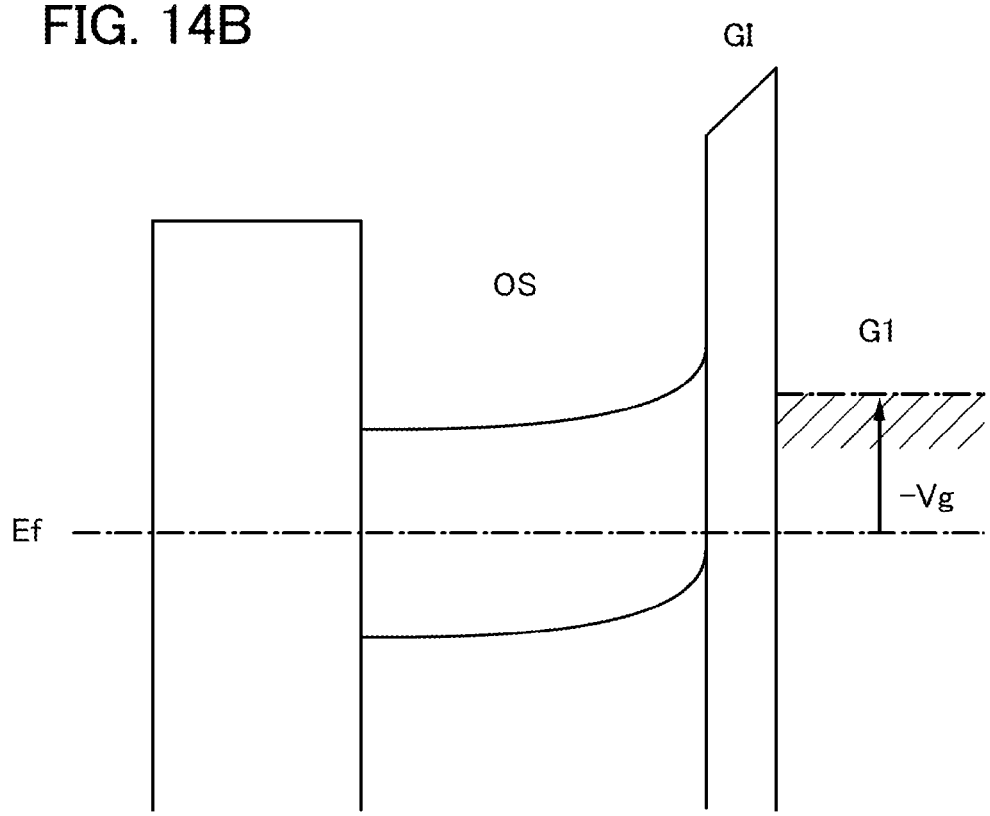
FIG. 14B is a diagram illustrating a state in which a negative potential (−Vg) is applied to the gate electrode 1001.

FIGS. 14A and 14B are energy band diagrams (schematic diagrams) of a cross section taken along line B-B' illustrated in FIG. 12. FIG. 14A illustrates an on state in which a positive potential (+Vg) is applied to the gate (G1) and carriers (electrons) flow between the source and the drain. FIG. 14B illustrates an off state in which a negative potential (−Vg) is applied to the gate (G1) and minority carriers do not flow.

Figure 15:
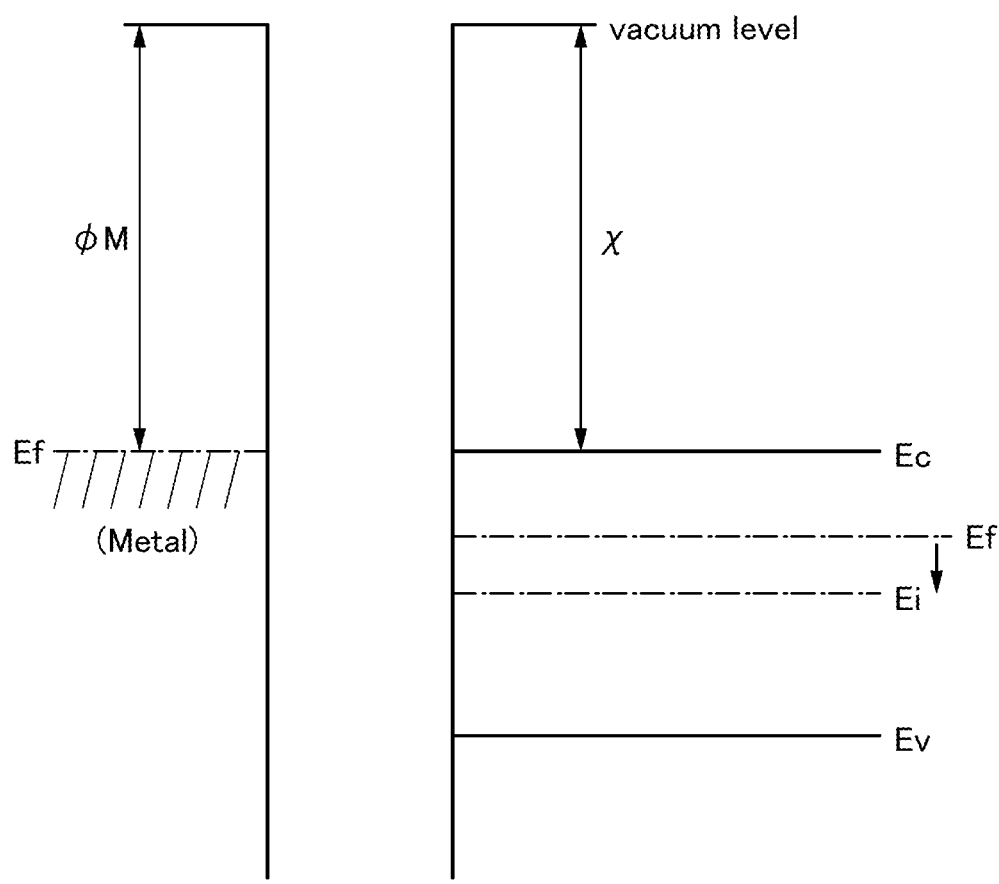
FIG. 15 is a diagram illustrating relationships among the vacuum level, the metal work function ($\phi_M$), and the electron affinity ($\chi$) of an oxide semiconductor.
Figure 16A:
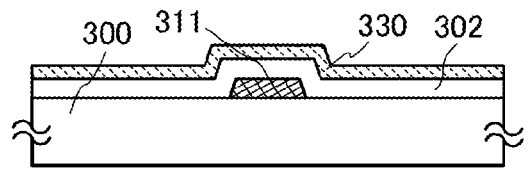
FIGS. 16A to 16E are cross-sectional views illustrating a method for manufacturing a transistor.
Figure 16B:
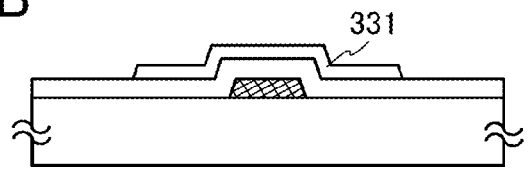
Figure 16C:
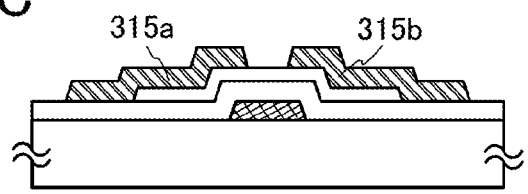
Figure 16D:
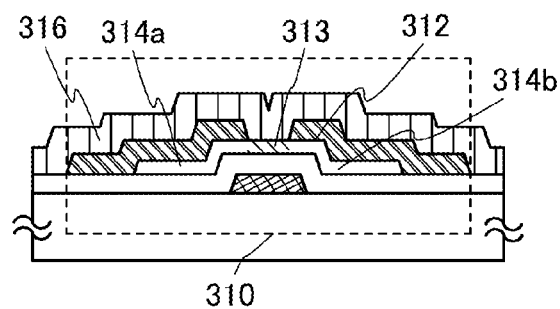
Figure 16E:
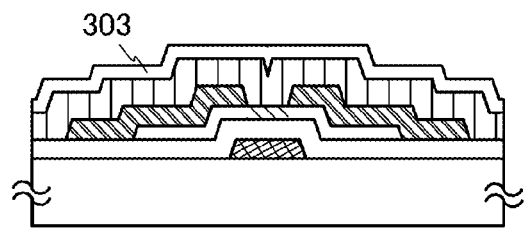
Figure 17A:
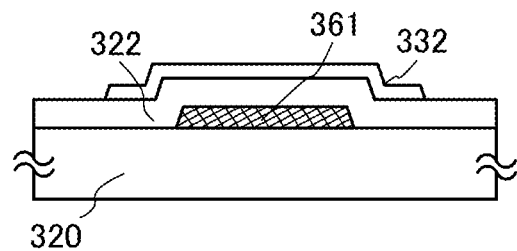
FIGS. 17A to 17D are cross-sectional views illustrating a method for manufacturing a transistor.
Figure 17B:
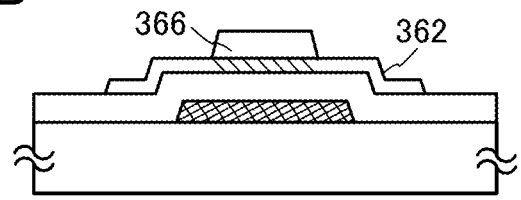
Figure 17C:
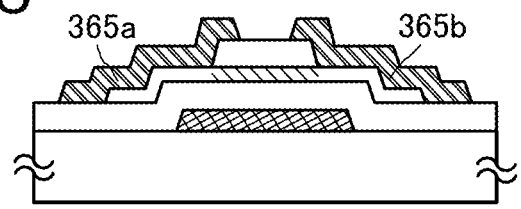
Figure 17D:
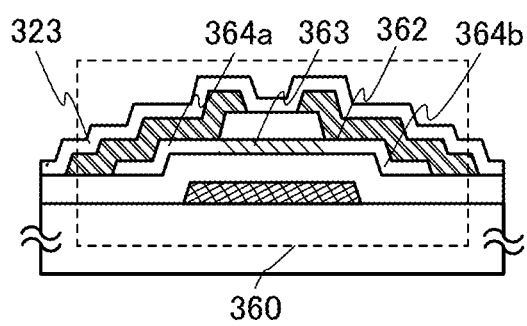

FIG. 15 illustrates the relationships among the vacuum level, the work function of a metal ($\phi$M), and the electron affinity ($\chi$) of an oxide semiconductor.

Since a metal degenerates, a Fermi level exists in the conduction band. On the other hand, a conventional oxide semiconductor is typically an n-type semiconductor, in which case the Fermi level (Ef) is away from the intrinsic Fermi level (Ei) located in the middle of a band gap and is located closer to the conduction band. Although it depends on the deposition method, the oxide semiconductor layer contains a certain amount of hydrogen or water, and part of hydrogen or water serves as a donor which supplies electrons, which is known as a factor to make the oxide semiconductor layer n-type.

On the other hand, an oxide semiconductor which is included in a transistor of a DC converter circuit of the present invention is an intrinsic (i-type) or a substantially intrinsic oxide semiconductor which is obtained by removing hydrogen that is an n-type impurity from an oxide semiconductor and highly purifying the oxide semiconductor such that an impurity other than a main component of the oxide semiconductor is prevented from being contained therein as much as possible. In other words, the oxide semiconductor has a feature in that it is made to be an i-type (intrinsic) semiconductor or made to be close thereto by being highly purified not by addition of an impurity but by removal of impurities such as hydrogen or water as much as possible. This enables the Fermi level to be at the same level as the intrinsic Fermi level.

In the case where the band gap (Eg) of an oxide semiconductor is 3.15 eV, the electron affinity ($\chi$) is said to be 4.3 eV. The work function of titanium (Ti) contained in the source electrode and the drain electrode is substantially equal to the electron affinity ($\chi$) of the oxide semiconductor. In that case, a Schottky barrier to electrons is not formed at an interface between the metal and the oxide semiconductor.

In other words, in the case where the work function of the metal and the electron affinity of the oxide semiconductor are equal to each other and the metal and the oxide semiconductor are in contact with each other, an energy band diagram (a schematic diagram) as illustrated in FIG. 13A is obtained.

In FIG. 13B, a black circle (•) represents an electron, and when a positive potential is applied to the drain, the electron is injected into the oxide semiconductor over the barrier (h) and flows to the drain. In that case, the height of the barrier (h) changes depending on the gate voltage and the drain voltage; in the case where positive drain voltage is applied, the height of the barrier (h) is smaller than the height of the barrier in FIG. 13A where no voltage is applied, i.e., ½ of the band gap (Eg).

At this time, the electron moves along the lowest part of the oxide semiconductor, which is energetically stable, at the interface between the gate insulating film and the highly purified oxide semiconductor as illustrated in FIG. 14A.

In FIG. 14B, when a negative potential (reverse bias) is applied to the gate electrode 1001, holes which are minority carriers are substantially zero; therefore, current is substantially close to zero.

For example, even when a transistor has a channel width W of $1\times10^4$ μm and a channel length of 3 μm, the off-state current is less than or equal to $10^{-13}$ A and the subthreshold swing (S value) is 0.1 V/dec (the thickness of the gate insulating film: 100 nm).

In such a manner, not only by simply using an oxide semiconductor with a wide band gap for a transistor, but also by reducing an impurity to be a donor, such as hydrogen, and thus preferably setting the carrier density to less than $1\times10^{12}/cm^3$, more preferably less than $1.45\times10^{10}/cm^3$, carriers excited by heat applied to the transistor at practical operation temperatures can be removed, so that a transistor can be operated by only carriers injected from the source side. Accordingly, it is possible to obtain a transistor whose off-state current is reduced to $1\times10^{-13}$ [A] or less and is hardly changed due to temperature change, whereby the transistor can be operated in an extremely stable manner.

As described above, the transistor including the oxide semiconductor layer can have stable electric characteristics and high reliability.

Note that this embodiment can be combined with or replaced by any of the other embodiments as appropriate.

Embodiment 7

In this embodiment, an example of a transistor which can be used as a transistor included in a DC converter circuit of an embodiment of the present invention will be described.

An example of a transistor and a method for manufacturing the transistor of this embodiment will be described with reference to FIGS. 16A to 16E.

FIGS. 16A to 16E illustrate an example of a method for manufacturing a transistor. A transistor illustrated in FIGS. 16A to 16E is one of bottom gate transistors and is also referred to as an inverted staggered transistor.

A transistor 310 is a single-gate transistor; a multi-gate transistor including a plurality of channel formation regions may be used as a transistor of this embodiment.

A process for forming the transistor 310 over a substrate 300 is described below with reference to FIGS. 16A to 16E.

First, a conductive film is formed over the substrate 300 having an insulating surface, and a first photolithography step is performed thereon, so that a gate electrode layer 311 is formed. Note that a resist mask may be formed by an ink-jet method. When the resist mask is formed by an ink-jet method, the manufacturing cost can be reduced.

There is no particular limitation on a substrate that can be used as the substrate 300 having an insulating surface as long as it has at least heat resistance to withstand heat treatment performed later. For example, a glass substrate formed using barium borosilicate glass, aluminoborosilicate glass, or the like can be used as the substrate 300.

Note that, instead of the glass substrate described above, a substrate formed using an insulator, such as a ceramic substrate, a quartz substrate, or a sapphire substrate, may be used. Alternatively, a crystallized glass substrate or the like may be used. Further alternatively, a semiconductor substrate of silicon or the like can be used as the substrate.

Further, an insulating film serving as a base film may be provided between the substrate 300 and the gate electrode layer 311. The base film has a function of preventing diffusion of an impurity element from the substrate 300, and can be formed to have a single-layer or stacked structure using one or more of a silicon nitride film, a silicon oxide film, a silicon nitride oxide film, and a silicon oxynitride film.

The gate electrode layer 311 can be formed with a single layer or stacked layers using a metal material such as molybdenum, titanium, chromium, tantalum, tungsten, aluminum, copper, neodymium, or scandium, or an alloy material which contains any of these materials as a main component.

As a two-layer structure of the gate electrode layer 311, for example, a two-layer structure in which a molybdenum layer is stacked over an aluminum layer, a two-layer structure in which a molybdenum layer is stacked over a copper layer, a two-layer structure in which a titanium nitride layer or a tantalum nitride layer is stacked over a copper layer, a two-layer structure in which a titanium nitride layer and a molybdenum layer are stacked, or a two-layer structure in which a tungsten nitride layer and a tungsten layer are stacked is preferable. As a three-layer structure, a stacked structure of a tungsten layer or a tungsten nitride layer, an alloy layer of aluminum and silicon or an alloy layer of aluminum and titanium, and a titanium nitride layer or a titanium layer is preferable.

Then, a gate insulating layer 302 is formed over the gate electrode layer 311.

An oxide semiconductor (a highly purified oxide semiconductor) which is made to be i-type or substantially i-type by removal of an impurity is highly sensitive to an interface state and interface electric charge; thus, an interface between the oxide semiconductor and the gate insulating layer is important. Therefore, the gate insulating layer (GI) which is in contact with the highly purified oxide semiconductor layer needs high quality.

For example, high-density plasma enhanced CVD using microwaves (2.45 GHz) is preferable because a dense high-quality insulating film having high withstand voltage can be formed. This is because when the highly purified oxide semiconductor layer is closely in contact with the high-quality gate insulating film, the interface state can be reduced and interface characteristics can be favorable. Here, as a high-density plasma apparatus, an apparatus which can realize a plasma density of greater than or equal to $1\times10^{11}/cm^3$ can be used.

For example, plasma is generated by applying a microwave power of 3 kW to 6 kW, and the insulating film is formed. A monosilane gas ($SiH_4$), nitrous oxide ($N_2O$), and a rare gas are introduced into a chamber as a source gas to generate high-density plasma at a pressure of 10 Pa to 30 Pa, and the insulating film is formed over the substrate having an insulating surface, such as a glass substrate. After that, the supply of a monosilane gas is stopped, and nitrous oxide ($N_2O$) and a rare gas are introduced without exposure to the air, so that plasma treatment may be performed on a surface of the insulating film. The plasma treatment performed on the surface of the insulating film by introducing nitrous oxide ($N_2O$) and a rare gas is performed at least after the insulating film is formed. The flow ratio of a monosilane gas ($SiH_4$) to nitrous oxide ($N_2O$) which are introduced into the chamber is in the range of 1:10 to 1:200. In addition, as a rare gas which is introduced into the chamber, helium, argon, krypton, xenon, or the like can be used. In particular, argon, which is inexpensive, is preferably used.

Needless to say, a different deposition method such as a sputtering method or a plasma enhanced CVD method can be used as long as a high-quality insulating film can be formed as the gate insulating layer 302. Further, an insulating film whose film quality and characteristic of an interface between the insulating film and an oxide semiconductor are improved by heat treatment which is performed after formation of the insulating film may be formed as a gate insulating film. In any case, any insulating film can be used as long as film quality as a gate insulating film is high, interface state density with an oxide semiconductor is decreased, and a favorable interface can be formed.

In a gate-bias thermal stress test (BT test) at 85° C., at a voltage applied to the gate of $2 \times 10^6$ V/cm for 12 hours, if an impurity has been added to an oxide semiconductor, the bond between the impurity and the main component of the oxide semiconductor is broken by a high electric field (B: bias) and high temperature (T: temperature), so that a generated dangling bond induces a shift in the threshold voltage ($V_{th}$). As a countermeasure against this, in the transistor which is used in a DC converter circuit of an embodiment of the present invention, the impurity in the oxide semiconductor, particularly, hydrogen, water, or the like is removed as much as possible so that the characteristics of an interface between the oxide semiconductor layer and the gate insulating layer are favorable as described above. Accordingly, it is possible to obtain a transistor which is stable with respect to the BT test.

As the gate insulating layer 302, a single layer or stacked layers can be formed using one or more of a silicon oxide layer, a silicon nitride layer, a silicon oxynitride layer, a silicon nitride oxide layer, and an aluminum oxide layer.

As the gate insulating layer 302, $HfO_x$ or the like can be used, for example. When $HfO_x$ or the like is used for the gate insulating layer 302, leakage current which flows to a gate electrode from the oxide semiconductor layer side can be reduced.

In addition, the gate insulating layer 302 can have a structure in which a silicon oxide layer and a silicon nitride layer are stacked. In this embodiment, for example, a silicon oxynitride layer with a thickness of 100 nm is formed by a high-density plasma enhanced CVD method with a pressure of 30 Pa and a microwave power of 6 kW. The flow ratio of a monosilane gas ($SiH_4$) to nitrous oxide ($N_2O$) which are introduced into the chamber is in the range of 1:10 to 1:200.

Then, an oxide semiconductor film 330 is formed to have a thickness of 2 nm to 200 nm inclusive over the gate insulating layer 302.

Note that before the oxide semiconductor film 330 is formed by a sputtering method, particles attached to a surface of the gate insulating layer 302 are preferably removed by reverse sputtering in which an argon gas is introduced and plasma is generated. Note that instead of an argon atmosphere, a nitrogen atmosphere, a helium atmosphere, an oxygen atmosphere, or the like may be used.

As the oxide semiconductor film 330, any of the following oxide semiconductor films can be used: an In—Sn—Ga—Zn—O film that is a quaternary metal oxide; an In—Ga—Zn—O film, an In—Sn—Zn—O film, In—Al—Zn—O film, an Sn—Ga—Zn—O film, an Al—Ga—Zn—O film, or an Sn—Al—Zn—O film that is a ternary metal oxide; an In—Zn—O film, an Sn—Zn—O film, an Al—Zn—O film, a Zn—Mg—O film, an Sn—Mg—O film, an In—Mg—O film, or In—Sn—O film that is a binary metal oxide; an In—O film; an Sn—O film; a Zn—O film; and the like. In addition, the above oxide semiconductor film may contain $SiO_2$.

The oxide semiconductor film 330 can be formed using a film expressed by $InMO_3 (ZnO)_m$ (m>0). Here, M represents one or more metal elements selected from Ga, Al, Mn, and Co. For example, Ga, Ga and Al, Ga and Mn, or Ga and Co can be given as M.

As a target for forming the oxide semiconductor film 330 by a sputtering method, a metal oxide target containing zinc oxide as a main component can be used. As another example of a metal oxide target, a metal oxide target containing In, Ga, and Zn (in a composition ratio, $In_2O_3:Ga_2O_3:ZnO=1:1:1$ [mol %], In:Ga:Zn=1:1:0.5 [atom %]) can be used. As a metal oxide target containing In, Ga, and Zn, a target with a composition ratio of In:Ga:Zn=1:1:1 [atom %] or 1:1:2 [atom %] can be used. The filling factor of the metal oxide target is greater than or equal to 90%, preferably greater than or equal to 95%. With the use of the metal oxide target with high filling factor, a dense oxide semiconductor film is formed.

It is preferable to use a high-purity gas from which an impurity such as hydrogen, water, a hydroxyl group, or hydride is removed to a concentration expressed by a level of ppm or ppb, as a sputtering gas used when the oxide semiconductor film 330 is formed.

The substrate is held in a treatment chamber kept under reduced pressure, and the substrate temperature is set to 100° C. to 600° C. inclusive, preferably 200° C. to 400° C. inclusive. Film formation is performed while the substrate is heated, whereby the concentration of an impurity contained in the oxide semiconductor film formed can be reduced. Further, damages due to sputtering can be reduced. Then, a sputtering gas from which hydrogen and moisture are removed is introduced into the treatment chamber from which residual moisture is being removed, and the oxide semiconductor film 330 is formed over the substrate 300 with the use of a metal oxide as a target. In order to remove residual moisture in the treatment chamber, an entrapment vacuum pump is preferably used. As the entrapment vacuum pump, a cryopump, an ion pump, or a titanium sublimation pump is preferably used, for example. Further, an exhaustion unit may be a turbo pump provided with a cold trap, for example. In the deposition chamber which is evacuated with the cryopump, a hydrogen atom, a compound containing a hydrogen atom, such as water ($H_2O$), (more preferably, also a compound containing a carbon atom), and the like are removed, whereby the concentration of an impurity in the oxide semiconductor film formed in the deposition chamber can be reduced.

An example of the deposition conditions is as follows: the distance between the substrate and the target is 100 mm, the pressure is 0.6 Pa, the DC power is 0.5 kW, and the atmosphere is an oxygen atmosphere (the flow rate of oxygen is 100%). It is preferable that a pulsed DC power supply be used because particles can be reduced and the film thickness can be uniform. The oxide semiconductor film preferably has a thickness of 5 nm to 30 nm inclusive. Note that the appropriate thickness of the oxide semiconductor film depends on an oxide semiconductor material used; therefore, the thickness may be selected as appropriate in accordance with a material.

Then, the oxide semiconductor film 330 is processed into an island-shaped oxide semiconductor layer in a second photolithography step. A resist mask for forming the island-shaped oxide semiconductor layer may be formed by an ink-jet method. When the resist mask is formed by an ink-jet method, the manufacturing cost can be reduced.

Next, the oxide semiconductor layer is subjected to the first heat treatment. With the first heat treatment, dehydration or dehydrogenation of the oxide semiconductor layer can be conducted. The temperature of the first heat treatment is from 400° C. to 750° C. inclusive, preferably higher than or equal to 400° C. and lower than the strain point of the substrate. Here, as an example, the substrate is introduced into an electric furnace which is one of heat treatment apparatuses, heat treatment is performed on the oxide semiconductor layer in a nitrogen atmosphere at 450° C. for 1 hour, and then, the oxide semiconductor layer is not exposed to the air and entry of water and hydrogen into the oxide semiconductor layer is prevented; thus, an oxide semiconductor layer 331 is obtained (see FIG. 16B).

Note that the atmosphere of the heat treatment apparatus may be switched to an oxygen atmosphere when the temperature is decreased from the heat treatment temperature. When the atmosphere is switched to an oxygen atmosphere in decreasing the temperature, oxygen is supplied to an oxygen-deficient portion in the oxide semiconductor layer. Carriers are generated by oxygen deficiency; however, as the oxygen deficiency disappears, the carriers are remarkably decreased, whereby an oxide semiconductor layer with extremely low carrier concentration can be obtained.

Note that the heat treatment apparatus is not limited to an electric furnace, and may have a device for heating an object to be processed by thermal conduction or thermal radiation from a heating element such as a resistance heating element. For example, an RTA apparatus such as a GRTA apparatus or an LRTA apparatus can be used. An LRTA apparatus is an apparatus for heating an object to be processed by radiation of light (an electromagnetic wave) emitted from a lamp such as a halogen lamp, a metal halide lamp, a xenon arc lamp, a carbon arc lamp, a high pressure sodium lamp, or a high pressure mercury lamp. A GRTA apparatus is an apparatus with which heat treatment is performed using a high-temperature gas. As the gas, an inert gas which does not react with an object to be processed by heat treatment, like nitrogen or a rare gas such as argon is used.

For example, as the first heat treatment, GRTA may be performed as follows. The substrate is transferred in an inert gas which has been heated to a high temperature of 650° C. to 700° C., heated for several minutes, and transferred and taken out of the inert gas which has been heated to a high temperature. GRTA enables a high-temperature heat treatment for a short time.

Note that in the first heat treatment, it is preferable that water, hydrogen, or the like be not contained in nitrogen or a rare gas such as helium, neon, or argon. Alternatively, the purity of nitrogen or a rare gas such as helium, neon, or argon which is introduced into the heat treatment apparatus is greater than or equal to 6 N (99.9999%), preferably greater than or equal to 7 N (99.99999%) (i.e., the impurity concentration is less than or equal to 1 ppm, preferably less than or equal to 0.1 ppm).

In addition, the first heat treatment can be performed on the oxide semiconductor film 330 before being processed into the island-shaped oxide semiconductor layer. In that case, the substrate is taken out of the heat treatment apparatus after the first heat treatment; then, a photolithography step is performed.

The heat treatment having an effect of dehydration or dehydrogenation with respect to the oxide semiconductor layer may be performed at any of the following timings: after the oxide semiconductor layer is formed; after a source electrode layer and a drain electrode layer are formed over the oxide semiconductor layer; and after a protective insulating layer is formed over the source electrode layer and the drain electrode layer.

Further, in the case where a contact hole is formed in the gate insulating layer 302, the formation of the contact hole may be performed before or after the dehydration or dehydrogenation of the oxide semiconductor film 330.

Note that the etching of the oxide semiconductor film may be dry etching, without limitation to wet etching.

The etching conditions (such as an etchant, etching time, and temperature) are appropriately adjusted depending on the material so that the material can be etched into a desired shape.

Next, a conductive film is formed over the gate insulating layer 302 and the oxide semiconductor layer 331. For example, the conductive film may be formed by a sputtering method or a vacuum evaporation method. As a material of the conductive film, an element selected from aluminum, chromium, copper, tantalum, titanium, molybdenum, and tungsten; an alloy containing any of these elements as a component; an alloy film containing any of these elements in combination; and the like can be given. Further, one or more materials selected from manganese, magnesium, zirconium, beryllium, and yttrium may be used as a material of the conductive film. Further, the conductive film may have a single-layer structure or a stacked structure of two or more layers. For example, a single-layer structure of an aluminum film containing silicon can be given as a single-layer structure. As a stacked structure, a two-layer structure in which a titanium film is stacked over an aluminum film, a three-layer structure in which a titanium film, an aluminum film, and a titanium film are stacked in that order, and the like can be given. Alternatively, a film, an alloy film, or a nitride film which contains aluminum and one or more elements selected from titanium, tantalum, tungsten, molybdenum, chromium, neodymium, and scandium may be used.

In the case where heat treatment is performed after formation of the conductive film, the conductive film preferably has heat resistance high enough to withstand the heat treatment.

A resist mask is formed over the conductive film in a third photolithography step and selective etching is performed, so that a source electrode layer 315a and a drain electrode layer 315b are formed. Then, the resist mask is removed (see FIG. 16C).

Ultraviolet light, a KrF laser beam, or an ArF laser beam is used for light exposure for forming the resist mask in the third photolithography step. A channel length L of the transistor to be formed later depends on a width of a distance between a bottom portion of the source electrode layer and a bottom portion of the drain electrode layer which are adjacent to each other over the oxide semiconductor layer 331. Note that when light exposure is performed in the case where the channel length L is shorter than 25 nm, extreme ultraviolet light with extremely short wavelengths of several nanometers to several tens of nanometers is used for light exposure for forming the resist mask in the third photolithography step. Light exposure with extreme ultraviolet light leads to a high resolution and a large depth of focus. Accordingly, the channel length L of the transistor to be formed later can be set to 10 nm to 1000 nm inclusive. Thus, the operation speed of a circuit can be increased, and further, an off-state current can be significantly small, whereby low power consumption can be achieved.

Note that the material and the etching conditions of the conductive film and the oxide semiconductor film are adjusted as appropriate so that the oxide semiconductor layer 331 is not removed by etching of the conductive film.

In this embodiment, as an example, a titanium film is used as the conductive film, an In—Ga—Zn—O-based oxide semiconductor layer is used as the oxide semiconductor layer 331, and an ammonia hydrogen peroxide solution (a mixture of ammonia, water, and a hydrogen peroxide solution) is used as an etchant.

In the third photolithography step, part of the oxide semiconductor layer 331 may be etched off, whereby the oxide semiconductor layer having a groove (a depression portion) may be formed. Note that a resist mask used for forming the source electrode layer 315a and the drain electrode layer 315b may be formed by an ink-jet method. When the resist mask is formed by an ink-jet method, the manufacturing cost can be reduced.

Further, oxide conductive layers may be formed between the oxide semiconductor layer and the source and drain electrode layers. The oxide conductive layers and the metal layer for forming the source and drain electrode layers can be formed successively. The oxide conductive layers can function as a source region and a drain region.

When the oxide conductive layers are provided as a source region and a drain region between the oxide semiconductor layer and the source and drain electrode layers, the resistance of the source region and the drain region can be reduced and high-speed operation of the transistor can be realized.

In order to reduce the number of photomasks and steps in a photolithography step, etching may be performed with the use of a resist mask formed using a multi-tone mask which is a light-exposure mask through which light is transmitted so as to have a plurality of intensities. Since a resist mask formed using a multi-tone mask has a plurality of thicknesses and can be further changed in shape by performing etching, the resist mask can be used in a plurality of etching steps to provide different patterns. Therefore, a resist mask corresponding to at least two kinds of different patterns can be formed by using one multi-tone mask. Thus, the number of light-exposure masks can be reduced and the number of corresponding photolithography steps can be also reduced, whereby simplification of a process can be realized.

Next, plasma treatment is performed using a gas such as $N_2O$, $N_2$, or Ar. This plasma treatment removes water or the like adsorbed on a surface of the oxide semiconductor layer which is exposed. Alternatively, plasma treatment may be performed using a mixed gas of oxygen and argon.

After the plasma treatment, an oxide insulating layer 316 serving as a protective insulating film which is in contact with part of the oxide semiconductor layer is formed without exposure to the air.

The oxide insulating layer 316 can be formed to have a thickness at least 1 nm by a sputtering method or the like as appropriate, which is a method with which an impurity such as water or hydrogen does not enter the oxide insulating layer 316. When hydrogen is contained in the oxide insulating layer 316, entry of the hydrogen to the oxide semiconductor layer or extraction of oxygen in the oxide semiconductor layer by the hydrogen is caused, thereby making the resistance of the back channel of the oxide semiconductor layer low (n-type), so that a parasitic channel might be formed. Therefore, it is important that a deposition method in which hydrogen is not used is employed such that the oxide insulating layer 316 contains hydrogen as little as possible.

In this embodiment, as an example, a 200-nm-thick silicon oxide film is formed as the oxide insulating layer 316 by a sputtering method. The substrate temperature in film formation may be room temperature to 300° C. inclusive and is 100° C. in this embodiment. The silicon oxide film can be formed by a sputtering method in a rare gas (typically argon) atmosphere, an oxygen atmosphere, or an atmosphere containing a rare gas (typically argon) and oxygen. Moreover, a silicon oxide target or a silicon target can be used as a target. For example, the silicon oxide film can be formed by a sputtering method using a silicon target in an atmosphere containing oxygen and nitrogen. The oxide insulating layer 316 which is formed in contact with the oxide semiconductor layer in a region which is in an oxygen-deficient state and thus has a lower resistance, i.e., is n-type is formed using an inorganic insulating film that does not contain an impurity such as moisture, a hydrogen ion, and OH⁻ and blocks entry of such an impurity from the outside, typically, a silicon oxide film, a silicon oxynitride film, an aluminum oxide film, or an aluminum oxynitride film.

In that case, the oxide insulating layer 316 is preferably formed removing residual moisture in the treatment chamber. This is for preventing hydrogen, a hydroxyl group, or moisture from being contained in the oxide semiconductor layer 331 and the oxide insulating layer 316.

In order to remove residual moisture in the treatment chamber, an entrapment vacuum pump is preferably used. As the entrapment vacuum pump, a cryopump, an ion pump, or a titanium sublimation pump is preferably used, for example. Further, an exhaustion unit may be a turbo pump provided with a cold trap, for example. In the deposition chamber which is evacuated with the cryopump, a hydrogen atom, a compound containing a hydrogen atom (water or the like), and the like are removed, whereby the concentration of an impurity contained in the oxide insulating layer 316 formed in the deposition chamber can be reduced.

It is preferable to use a high-purity gas from which an impurity such as hydrogen, water, a hydroxyl group, or hydride is removed to a concentration expressed by a level of ppm or ppb, as a sputtering gas used when the oxide insulating layer 316 is formed.

Next, the second heat treatment (preferably from 200° C. to 400° C. inclusive, for example, from 250° C. to 350° C. inclusive) may be performed in an inert gas atmosphere or an oxygen gas atmosphere. For example, the second heat treatment is performed in a nitrogen atmosphere at 250° C. for 1 hour. With the second heat treatment, heat is applied while part of the oxide semiconductor layer is in contact with the oxide insulating layer 316.

Through the above steps, the oxide semiconductor film has lower resistance when heat treatment for dehydration or dehydrogenation is performed on the formed oxide semiconductor film. Then, part of the oxide semiconductor film is selectively made to be in an oxygen excess state. As a result, a channel formation region 313 overlapping with the gate electrode layer 311 becomes i-type. At that time, a low-resistance source region 314a overlapping with the source electrode layer 315a and a low-resistance drain region 314b overlapping with the drain electrode layer 315b are formed in a self-aligned manner. Through the above steps, the transistor 310 is formed (see FIG. 16D).

By the formation of the low-resistance drain region 314b (or the low-resistance source region 314a) in part of the oxide semiconductor layer, which overlaps with the drain electrode layer 315b (or the source electrode layer 315a), reliability of the transistor can be improved. Specifically, with the formation of the low-resistance drain region 314b, the conductivity can be gradually varied from the drain electrode layer 315b to the low-resistance drain region 314b and the channel formation region 313. Therefore, in the case where the transistor operates with the drain electrode layer 315b connected to a wiring for supplying a high power supply potential VDD, the low-resistance drain region serves as a buffer and a high electric field is not applied locally even if the high electric field is applied between the gate electrode layer 311 and the drain electrode layer 315*b*, so that the withstand voltage of the transistor can be improved.

A protective insulating layer may be additionally formed over the oxide insulating layer 316. For example, a silicon nitride film is formed as the protective insulating layer by an RF sputtering method. An RF sputtering method has superiority in mass production and thus is a preferable method for forming the protective insulating layer. The protective insulating layer is formed using an inorganic insulating film which does not contain an impurity such as moisture, a hydrogen ion, or OH⁻ and blocks entry of these from the outside; for example, a silicon nitride film, an aluminum nitride film, a silicon nitride oxide film, an aluminum nitride oxide film, or the like is used. In this embodiment, a protective insulating layer 303 is formed using a silicon nitride film as the protective insulating layer (see FIG. 16E).

In this embodiment, as the protective insulating layer 303, a silicon nitride film is formed by heating the substrate 300 over which layers up to and including the oxide insulating layer 316 are formed, to a temperature of 100° C. to 400° C., introducing a high-purity sputtering gas which contains nitrogen and from which hydrogen and moisture are removed, and using a target of a silicon semiconductor. In that case, the protective insulating layer 303 is preferably formed removing residual moisture in the treatment chamber, similarly to the oxide insulating layer 316.

A planarization insulating layer for planarization may be provided over the protective insulating layer 303.

Further, a conductive layer may be formed so as to overlap with the oxide semiconductor layer, over the protective insulating layer 303 (in the case of providing a planarization insulating layer, over the planarization insulating layer). A potential of the conductive layer may be the same as or different from that of the gate electrode layer 311 of the transistor 310. The conductive layer can also function as a second gate electrode layer. The potential of the conductive layer may be a fixed potential such as GND or 0 V.

Electric characteristics of the transistor 310 can be controlled by the conductive layer.

As described above, the transistor including the oxide semiconductor layer can have stable electric characteristics and high reliability.

Note that this embodiment can be combined with or replaced by any of the other embodiments as appropriate.

Embodiment 8

In this embodiment, an example of a transistor which can be used as a transistor included in a DC converter circuit of an embodiment of the present invention will be described.

One example of a transistor and a method for manufacturing the transistor of this embodiment will be described with reference to FIGS. 17A to 17D.

FIGS. 17A to 17D illustrate an example of a method for manufacturing a transistor. A transistor illustrated in FIGS. 17A to 17D is a kind of bottom-gate structure called a channel-protective type (channel-stop type) and is also called an inverted staggered transistor.

Although a transistor 360 is described as a single-gate transistor, a multi-gate transistor including a plurality of channel formation regions may be used as a transistor of this embodiment.

A process for manufacturing the transistor 360 over a substrate 320 is described below with reference to FIGS. 17A to 17D.

First, a conductive film is formed over the substrate 320 having an insulating surface, and a first photolithography step is performed thereon, so that a gate electrode layer 361 is formed. Note that a resist mask may be formed by an ink-jet method. Formation of the resist mask by an ink-jet method needs no photomask; thus, manufacturing cost can be reduced.

The gate electrode layer 361 can be formed in a single layer or a stacked layer using a metal material such as molybdenum, titanium, chromium, tantalum, tungsten, aluminum, copper, neodymium, or scandium, or an alloy material which contains any of these materials as a main component.

Next, a gate insulating layer 322 is formed over the gate electrode layer 361.

An oxide semiconductor (a highly purified oxide semiconductor) which is made to be i-type or substantially i-type by removal of an impurity is highly sensitive to an interface state and interface electric charge; thus, an interface between the oxide semiconductor and the gate insulating layer is important. Therefore, the gate insulating layer (GI) which is in contact with the highly purified oxide semiconductor layer needs high quality.

For example, high-density plasma enhanced CVD using microwaves (2.45 GHz) is preferable because a dense high-quality insulating film having high withstand voltage can be formed. This is because when the highly purified oxide semiconductor layer is closely in contact with the high-quality gate insulating film, the interface state can be reduced and interface characteristics can be favorable. Here, as a high-density plasma apparatus, an apparatus which can realize a plasma density of greater than or equal to $1 \times 10^{11}/cm^3$ can be used.

For example, plasma is generated by applying a microwave power of 3 kW to 6 kW, and the insulating film is formed. A monosilane gas ($SiH_4$), nitrous oxide ($N_2O$), and a rare gas are introduced into a chamber as a source gas to generate high-density plasma at a pressure of 10 Pa to 30 Pa, and the insulating film is formed over the substrate having an insulating surface, such as a glass substrate. After that, the supply of a monosilane gas is stopped, and nitrous oxide ($N_2O$) and a rare gas are introduced without exposure to the air, so that plasma treatment may be performed on a surface of the insulating film. The plasma treatment performed on the surface of the insulating film by introducing nitrous oxide ($N_2O$) and a rare gas is performed at least after the insulating film is formed. The flow ratio of a monosilane gas ($SiH_4$) to nitrous oxide ($N_2O$) which are introduced into the chamber is in the range of 1:10 to 1:200. In addition, as a rare gas which is introduced into the chamber, helium, argon, krypton, xenon, or the like can be used. In particular, argon, which is inexpensive, is preferably used.

Needless to say, a different deposition method such as a sputtering method or a plasma enhanced CVD method can be used as long as a high-quality insulating film can be formed as the gate insulating layer 322. Further, an insulating film whose film quality and characteristic of an interface between the insulating film and an oxide semiconductor are improved by heat treatment which is performed after formation of the insulating film may be formed as a gate insulating film. In any case, any insulating film can be used as long as film quality as a gate insulating film is high, interface state density with an oxide semiconductor is decreased, and a favorable interface can be formed.

In a gate-bias thermal stress test (BT test) at 85° C., at a voltage applied to the gate of $2 \times 10^6$ V/cm for 12 hours, if an impurity has been added to an oxide semiconductor, the bond between the impurity and the main component of the oxide semiconductor is broken by a high electric field (B: bias) and high temperature (T: temperature), so that a generated dangling bond induces a shift in the threshold voltage ($V_{th}$). As a countermeasure against this, in the transistor which is used in a DC converter circuit of an embodiment of the present invention, the impurity in the oxide semiconductor, particularly, hydrogen, water, or the like is removed as much as possible so that the characteristics of an interface between the oxide semiconductor layer and the gate insulating layer are favorable as described above. Accordingly, it is possible to obtain a transistor which is stable with respect to the BT test.

As the gate insulating layer 322, a single layer or stacked layers can be formed using one or more of a silicon oxide layer, a silicon nitride layer, a silicon oxynitride layer, a silicon nitride oxide layer, and an aluminum oxide layer.

As the gate insulating layer 322, $HfO_x$ or the like can be used, for example. When $HfO_x$ or the like is used for the gate insulating layer 322, leakage current which flows to a gate electrode from the oxide semiconductor layer side can be reduced.

In addition, the gate insulating layer 322 can have a structure in which a silicon oxide layer and a silicon nitride layer are stacked. In this embodiment, for example, a silicon oxynitride layer with a thickness of 100 nm is formed by a high-density plasma enhanced CVD method with a pressure of 30 Pa and a microwave power of 6 kW. The flow ratio of a monosilane gas ($SiH_4$) to nitrous oxide ($N_2O$) which are introduced into the chamber is in the range of 1:10 to 1:200.

Next, an oxide semiconductor film is formed to have a thickness of 2 nm to 200 nm inclusive over the gate insulating layer 322, and then, the oxide semiconductor film is processed into an island-shaped oxide semiconductor layer in a second photolithography step. In this embodiment, as an example, the oxide semiconductor film is formed by a sputtering method with the use of an In—Ga—Zn—O-based metal oxide target.

In that case, the oxide semiconductor film is preferably formed removing residual moisture in the treatment chamber. This is for preventing hydrogen, a hydroxyl group, or moisture from being contained in the oxide semiconductor film.

In order to remove residual moisture in the treatment chamber, an entrapment vacuum pump is preferably used. As the entrapment vacuum pump, a cryopump, an ion pump, or a titanium sublimation pump is preferably used, for example. Further, an exhaustion unit may be a turbo pump provided with a cold trap, for example. In the deposition chamber which is evacuated with the cryopump, a hydrogen atom, a compound containing a hydrogen atom (water or the like), and the like are removed, whereby the concentration of an impurity contained in the oxide semiconductor film formed in the deposition chamber can be reduced.

It is preferable to use a high-purity gas from which an impurity such as hydrogen, water, a hydroxyl group, or hydride is removed to a concentration expressed by a level of ppm or ppb, as a sputtering gas used when the oxide semiconductor film is formed.

Next, the first heat treatment is performed on the oxide semiconductor layer. The temperature of the first heat treatment is from 400° C. to 750° C. inclusive, preferably higher than or equal to 400° C. and lower than the strain point of the substrate. In this embodiment, the substrate is put in an electric furnace which is a kind of heat treatment apparatus and heat treatment is performed on the oxide semiconductor layer in a nitrogen atmosphere at 450° C. for 1 hour, and then, the oxide semiconductor layer is not exposed to the air and water or hydrogen is prevented from entering the oxide semiconductor layer. In this manner, an oxide semiconductor layer 332 is obtained (see FIG. 17A).

Next, plasma treatment is performed using a gas such as $N_2O$, $N_2$, or Ar. This plasma treatment removes water or the like adsorbed on a surface of the oxide semiconductor layer which is exposed. In addition, plasma treatment may be performed using a mixed gas of oxygen and argon.

Next, an oxide insulating layer is formed over the gate insulating layer 322 and the oxide semiconductor layer 332. After that, a resist mask is formed in a third photolithography step, the oxide insulating layer is selectively etched to form an oxide insulating layer 366, and then, the resist mask is removed.

In this embodiment, a 200-nm-thick silicon oxide film is formed as the oxide insulating layer 366 by a sputtering method. The substrate temperature in film formation may be room temperature to 300° C. inclusive and is 100° C. in this embodiment. The silicon oxide film can be formed by a sputtering method in a rare gas (typically argon) atmosphere, an oxygen atmosphere, or an atmosphere containing a rare gas (typically argon) and oxygen. Moreover, a silicon oxide target or a silicon target can be used as a target. For example, the silicon oxide film can be formed by a sputtering method using a silicon target in an atmosphere containing oxygen and nitrogen. The oxide insulating layer 366 which is formed in contact with the oxide semiconductor layer in a region which has a lower resistance is formed using an inorganic insulating film that does not contain an impurity such as moisture, a hydrogen ion, and $OH^-$ and blocks entry of such an impurity from the outside, typically, a silicon oxide film, a silicon oxynitride film, an aluminum oxide film, or an aluminum oxynitride film.

In that case, the oxide insulating layer 366 is preferably formed removing residual moisture in the treatment chamber. This is for preventing hydrogen, a hydroxyl group, or moisture from being contained in the oxide semiconductor layer 332 and the oxide insulating layer 366.

In order to remove residual moisture in the treatment chamber, an entrapment vacuum pump is preferably used. As the entrapment vacuum pump, a cryopump, an ion pump, or a titanium sublimation pump is preferably used, for example. Further, an exhaustion unit may be a turbo pump provided with a cold trap, for example. In the deposition chamber which is evacuated with the cryopump, a hydrogen atom, a compound containing a hydrogen atom (water or the like), and the like are removed, whereby the concentration of an impurity contained in the oxide insulating layer 366 formed in the deposition chamber can be reduced.

It is preferable to use a high-purity gas from which an impurity such as hydrogen, water, a hydroxyl group, or hydride is removed to a concentration expressed by a level of ppm or ppb, as a sputtering gas used when the oxide insulating layer 366 is formed.

Next, the second heat treatment may be performed in an inert gas atmosphere or an oxygen gas atmosphere (preferably 200° C. to 400° C. inclusive, for example 250° C. to 350° C. inclusive). For example, the second heat treatment is performed in a nitrogen atmosphere at 250° C. for 1 hour. When the second heat treatment is performed, heat is applied while part of the oxide semiconductor layer (a channel formation region) is in contact with the oxide insulating layer 366.

In this embodiment, the oxide semiconductor layer 332 which is partly exposed by providing the oxide insulating layer 366 is further subjected to heat treatment in a nitrogen atmosphere or an inert gas atmosphere or under a reduced pressure. By the heat treatment in a nitrogen atmosphere or an inert gas atmosphere or under a reduced pressure, the resistance of the exposed region of the oxide semiconductor layer 332, which is not covered by the oxide insulating layer 366, can be reduced. For example, the heat treatment is performed in a nitrogen atmosphere at 250° C. for 1 hour.

With the heat treatment on the oxide semiconductor layer 332 provided with the oxide insulating layer 366 in a nitrogen atmosphere, the resistance of the exposed region of the oxide semiconductor layer 332 is reduced, so that an oxide semiconductor layer 362 including regions with different resistances (indicated as a shaded region and a white region in FIG. 17B) is formed.

Next, a conductive film is formed over the gate insulating layer 322, the oxide semiconductor layer 362, and the oxide insulating layer 366. After that, a resist mask is formed in a fourth photolithography step, the conductive film is selectively etched to form a source electrode layer 365a and a drain electrode layer 365b, and then, the resist mask is removed (see FIG. 17C).

As a material of the source electrode layer 365a and the drain electrode layer 365b, an element selected from aluminum, chromium, copper, tantalum, titanium, molybdenum, and tungsten; an alloy containing any of these elements as a component; an alloy film containing any of these elements in combination; and the like can be given. Further, the conductive film may have a single-layer structure or a stacked structure of two or more layers.

Through the above steps, after the heat treatment for dehydration or dehydrogenation is performed on the formed oxide semiconductor film in order to reduce the resistance of the oxide semiconductor film, part of the oxide semiconductor film is selectively made to be in an oxygen excess state. As a result, a channel formation region 363 overlapping with the gate electrode layer 361 becomes i-type, and a low-resistance source region 364a overlapping with the source electrode layer 365a and a low-resistance drain region 364b overlapping with the drain electrode layer 365b are formed in a self-aligned manner. Through the above steps, the transistor 360 is formed.

By the formation of the low-resistance drain region 364b (or the low-resistance source region 364a) in part of the oxide semiconductor layer, which overlaps with the drain electrode layer 365b (or the source electrode layer 365a), reliability of the transistor can be improved. Specifically, with the formation of the low-resistance drain region 364b, the conductivity can be gradually varied from the drain electrode layer to the low-resistance drain region 364b and the channel formation region 363. Therefore, in the case where the transistor operates with the drain electrode layer 365b connected to a wiring for supplying a high power supply potential VDD, the low-resistance drain region serves as a buffer and a high electric field is not applied locally even if the high electric field is applied between the gate electrode layer 361 and the drain electrode layer 365b, so that the withstand voltage of the transistor can be improved.

A protective insulating layer 323 is formed over the source electrode layer 365a, the drain electrode layer 365b, and the oxide insulating layer 366. In this embodiment, the protective insulating layer 323 is formed using a silicon nitride film (see FIG. 17D).

An oxide insulating layer may be formed over the source electrode layer 365a, the drain electrode layer 365b, and the oxide insulating layer 366, and the protective insulating layer 323 may be stacked over the oxide insulating layer.

As described above, the transistor including the oxide semiconductor layer can have stable electric characteristics and high reliability.

Note that this embodiment can be implemented by being combined with any of other embodiments as appropriate.

Embodiment 9

In this embodiment, an example of a transistor which can be used as a transistor included in a DC converter circuit of an embodiment of the present invention will be described.

An embodiment of a transistor and a method for manufacturing the transistor of this embodiment will be described with reference to FIGS. 18A to 18D. FIGS. 18A to 18D are cross-sectional views illustrating a method for manufacturing a transistor of this embodiment.

A transistor 350 is a single-gate transistor; a multi-gate transistor including a plurality of channel formation regions may be used as a transistor of this embodiment.

A manufacturing process of the transistor 350 over a substrate 340 is described below with reference to FIGS. 18A to 18D.

First, a conductive film is formed over the substrate 340 having an insulating surface, and a first photolithography step is performed thereon, so that a gate electrode layer 351 is formed. In this embodiment, a 150-nm-thick tungsten film is formed by a sputtering method as the conductive film used to form the gate electrode layer 351.

Next, a gate insulating layer 342 is formed over the gate electrode layer 351.

An oxide semiconductor (a highly purified oxide semiconductor) which is made to be i-type or substantially i-type by removal of an impurity is highly sensitive to an interface state and interface electric charge; thus, an interface between the oxide semiconductor and a gate insulating layer is important. Therefore, the gate insulating layer (GI) which is in contact with the highly purified oxide semiconductor needs high quality.

For example, high-density plasma enhanced CVD using microwaves (2.45 GHz) is preferable because a dense high-quality insulating film having high withstand voltage can be formed. This is because when the highly purified oxide semiconductor layer is closely in contact with the high-quality gate insulating film, the interface state can be reduced and interface characteristics can be favorable. Here, as a high-density plasma apparatus, an apparatus which can realize a plasma density of greater than or equal to $1 \times 10^{11}/cm^3$ can be used.

For example, plasma is generated by applying a microwave power of 3 kW to 6 kW, and the insulating film is formed. A monosilane gas ($SiH_4$), nitrous oxide ($N_2O$), and a rare gas are introduced into a chamber as a source gas to generate high-density plasma at a pressure of 10 Pa to 30 Pa, and the insulating film is formed over the substrate having an insulating surface, such as a glass substrate. Then, the supply of a monosilane gas is stopped, and nitrous oxide ($N_2O$) and a rare gas are introduced without exposure to the air, so that plasma treatment may be performed on a surface of the insulating film. The plasma treatment performed on the surface of the insulating film by introducing nitrous oxide ($N_2O$) and a rare gas is performed at least after the insulating film is formed. The flow ratio of a monosilane gas ($SiH_4$) to nitrous oxide ($N_2O$) which are introduced into the chamber is in the range of 1:10 to 1:200. In addition, as a rare gas which is introduced into the chamber, helium, argon, krypton, xenon, or the like can be used. In particular, argon, which is inexpensive, is preferably used.

Needless to say, a different deposition method such as a sputtering method or a plasma enhanced CVD method can be used as long as a high-quality insulating film can be formed as the gate insulating layer 342. Further, an insulating film whose film quality and characteristic of an interface between the insulating film and an oxide semiconductor are improved by heat treatment which is performed after formation of the insulating film may be formed as a gate insulating film. In any case, any insulating film can be used as long as film quality as a gate insulating film is high, interface state density with an oxide semiconductor is decreased, and a favorable interface can be formed.

In a gate-bias thermal stress test (BT test) at 85° C., at a voltage applied to the gate of $2 \times 10^6$ V/cm for 12 hours, if an impurity has been added to an oxide semiconductor, the bond between the impurity and the main component of the oxide semiconductor is broken by a high electric field (B: bias) and high temperature (T: temperature), so that a generated dangling bond induces a shift in the threshold voltage ($V_{th}$). As a countermeasure against this, in the transistor which is used in a DC converter circuit of an embodiment of the present invention, the impurity in the oxide semiconductor, particularly, hydrogen, water, or the like is removed as much as possible so that the characteristics of an interface between the oxide semiconductor layer and the gate insulating layer are favorable as described above. Accordingly, it is possible to obtain a transistor which is stable with respect to the BT test.

As the gate insulating layer 342, a single layer or stacked layer can be formed using one or more of a silicon oxide layer, a silicon nitride layer, a silicon oxynitride layer (also referred to as $SiO_xN_y$, x>y>0), a silicon nitride oxide layer (also referred to as $SiN_xO_y$, x>y>0), and an aluminum oxide layer.

As the gate insulating layer 342, $HfO_x$ or the like can be used, for example. When $HfO_x$ or the like is used for the gate insulating layer 342, leakage current which flows to a gate electrode from the oxide semiconductor layer side can be reduced.

In addition, the gate insulating layer 342 can have a structure in which a silicon oxide layer and a silicon nitride layer are stacked. In this embodiment, for example, a silicon oxynitride layer with a thickness of 100 nm is formed by a high-density plasma enhanced CVD method with a pressure of 30 Pa and a microwave power of 6 kW. The flow ratio of a monosilane gas ($SiH_4$) to nitrous oxide ($N_2O$) which are introduced into the chamber is in the range of 1:10 to 1:200.

Next, a conductive film is formed over the gate insulating layer 342. After that, a resist mask is formed over the conductive film in a second photolithography step, the conductive film is selectively etched to form a source electrode layer 355a and a drain electrode layer 355b, and then, the resist mask is removed (see FIG. 18A).

Figure 18A:
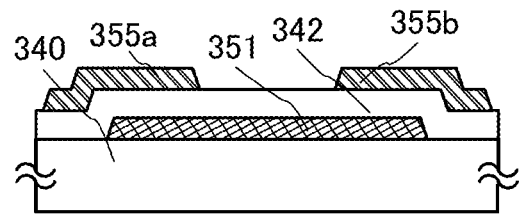
FIGS. 18A to 18D are cross-sectional views illustrating a method for manufacturing a transistor.
Figure 18B:
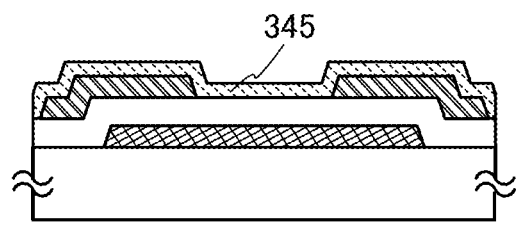
Figure 18C:
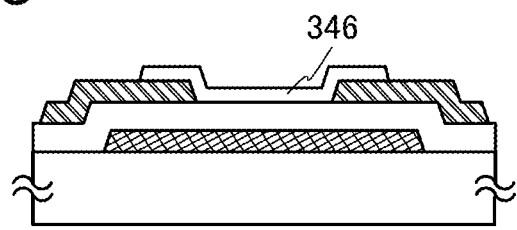
Figure 18D:
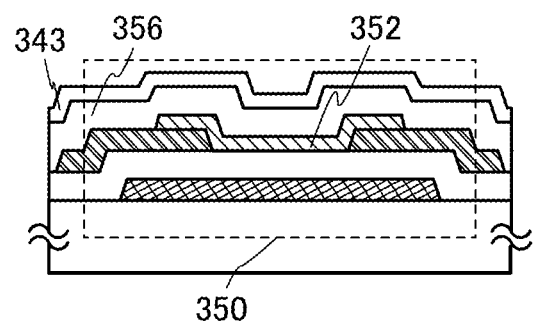

Next, an oxide semiconductor film 345 is formed (see FIG. 18B). In this embodiment, the oxide semiconductor film 345 is formed by a sputtering method with the use of an In—Ga—Zn-0-based metal oxide target. The oxide semiconductor film 345 is processed into an island-shaped oxide semiconductor layer in a third photolithography step.

In that case, the oxide semiconductor film 345 is preferably formed removing residual moisture in the treatment chamber. This is for preventing hydrogen, a hydroxyl group, or moisture from being contained in the oxide semiconductor film 345.

In order to remove residual moisture in the treatment chamber, an entrapment vacuum pump is preferably used. As the entrapment vacuum pump, a cryopump, an ion pump, or a titanium sublimation pump is preferably used, for example. Further, an exhaustion unit may be a turbo pump provided with a cold trap, for example. In the deposition chamber which is evacuated with the cryopump, a hydrogen atom, a compound containing a hydrogen atom (water or the like), and the like are removed, whereby the concentration of an impurity contained in the oxide semiconductor film 345 formed in the deposition chamber can be reduced.

It is preferable to use a high-purity gas from which an impurity such as hydrogen, water, a hydroxyl group, or hydride is removed to a concentration expressed by a level of ppm or ppb, as a sputtering gas used when the oxide semiconductor film 345 is formed.

Next, the first heat treatment is performed on the oxide semiconductor layer. The temperature of the first heat treatment is from 400° C. to 750° C. inclusive, preferably higher than or equal to 400° C. and lower than the strain point of the substrate. In this embodiment, the substrate is put in an electric furnace which is a kind of heat treatment apparatus and heat treatment is performed on the oxide semiconductor layer in a nitrogen atmosphere at 450° C. for 1 hour, and then, the oxide semiconductor layer is not exposed to the air and water or hydrogen is prevented from entering the oxide semiconductor layer. In this manner, an oxide semiconductor layer 346 is obtained (see FIG. 18C). Through the first heart treatment, dehydration or dehydrogenation is performed.

For example, as the first heat treatment, GRTA may be performed as follows. The substrate is transferred in an inert gas which has been heated to a high temperature of 650° C. to 700° C., heated for several minutes, and transferred and taken out of the inert gas which has been heated to a high temperature. GRTA enables a high-temperature heat treatment for a short time.

Next, an oxide insulating layer 356 serving as a protective insulating film is formed in contact with the oxide semiconductor layer 346.

The oxide insulating layer 356 has a thickness of at least 1 nm and can be formed by a method by which an impurity such as water or hydrogen does not enter the oxide insulating layer 356, such as a sputtering method, as appropriate. When hydrogen is contained in the oxide insulating layer 356, entry of the hydrogen to the oxide semiconductor layer or extraction of oxygen in the oxide semiconductor layer by the hydrogen is caused, thereby making the resistance of the back channel of the oxide semiconductor layer low (n-type), so that a parasitic channel could be formed. Therefore, it is important that a deposition method in which hydrogen is not used is employed such that the oxide insulating layer 356 contains hydrogen as little as possible.

In this embodiment, a 200-nm-thick silicon oxide film is formed as the oxide insulating layer 356 by a sputtering method. The substrate temperature in film formation may be room temperature to 300° C. inclusive and is 100° C. in this embodiment. The silicon oxide film can be formed by a sputtering method in a rare gas (typically argon) atmosphere, an oxygen atmosphere, or an atmosphere containing a rare gas (typically argon) and oxygen. Moreover, a silicon oxide target or a silicon target can be used as a target. For example, the silicon oxide film can be formed by a sputtering method using a silicon target in an atmosphere containing oxygen and nitrogen. The oxide insulating layer 356 which is formed in contact with the oxide semiconductor layer which is changed into an oxygen-deficient state and has lower resistance, that is, becomes an n-type oxide semiconductor layer is formed using an inorganic insulating film that does not contain an impurity such as moisture, a hydrogen ion, or $OH^-$ and blocks entry of such an impurity from the outside, typically a silicon oxide film, a silicon oxynitride oxide film, an aluminum oxide film, or an aluminum oxynitride film.

In that case, the oxide insulating layer 356 is preferably formed removing residual moisture in the treatment chamber. This is for preventing hydrogen, a hydroxyl group, or moisture from being contained in the oxide semiconductor layer 346 and the oxide insulating layer 356.

In order to remove residual moisture in the treatment chamber, an entrapment vacuum pump is preferably used. As the entrapment vacuum pump, a cryopump, an ion pump, or a titanium sublimation pump is preferably used, for example. Further, an evacuation unit may be a turbo pump provided with a cold trap. In the deposition chamber which is evacuated with the cryopump, a hydrogen atom, a compound containing a hydrogen atom, such as water ($H_2O$), and the like are removed, whereby the concentration of an impurity in the oxide insulating layer 356 formed in the deposition chamber can be reduced.

It is preferable to use a high-purity gas from which an impurity such as hydrogen, water, a hydroxyl group, or hydride is removed to a concentration expressed by a level of ppm or ppb, as a sputtering gas used when the oxide insulating layer 356 is formed.

Next, the second heat treatment (preferably at 200° C. to 400° C. inclusive, for example, 250° C. to 350° C. inclusive) is performed in an inert gas atmosphere or an oxygen gas atmosphere. For example, the second heat treatment is performed in a nitrogen atmosphere at 250° C. for 1 hour. When the second heat treatment is performed, heat is applied while part of the oxide semiconductor layer (channel formation region) is in contact with the oxide insulating layer 356.

As described above, by performing heat treatment for dehydration or dehydrogenation, the oxide semiconductor layer is made to be in an oxygen-deficient state; thus, the oxide semiconductor layer becomes lower-resistance type, that is, n-type. When the oxide insulating layer is formed in contact with the oxide semiconductor layer, the oxide semiconductor layer is made to be in an oxygen-excess state. As a result, a high-resistance i-type oxide semiconductor layer 352 is formed. Though the above-described steps, the transistor 350 is formed.

A protective insulating layer may be formed over the oxide insulating layer 356. For example, a silicon nitride film is formed by an RF sputtering method. In this embodiment, a protective insulating layer 343 is formed using a silicon nitride film as the protective insulating layer (see FIG. 18D).

A planarization insulating layer for planarization may be provided over the protective insulating layer 343.

As described above, the transistor including the oxide semiconductor layer can have stable electric characteristics and high reliability.

Note that this embodiment can be combined with or replaced by any of the other embodiments as appropriate.

Embodiment 10

In this embodiment, an example of a transistor which can be applied to a transistor included in a DC converter circuit of an embodiment of the present invention will be described.

Figure 19:
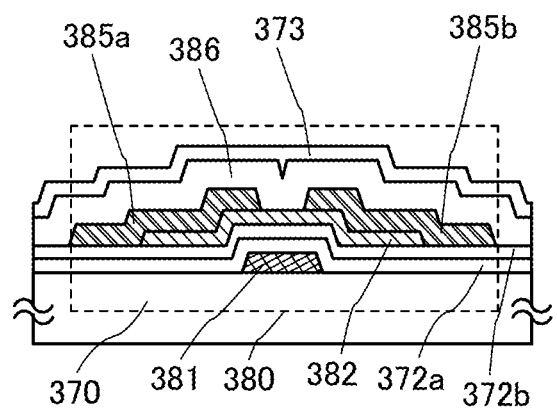
FIG. 19 is a cross-sectional view illustrating a transistor.

In this embodiment, an example which is partly different from Embodiment 7 in manufacturing process of a transistor will be described with reference to FIG. 19. FIG. 19 is the same as FIGS. 16A to 16E except for part of the steps. Thus, the same parts as in FIGS. 16A to 16E are denoted by the same reference numerals and detailed description on the parts is omitted.

First, a gate electrode layer 381 is formed over a substrate 370, and a first gate insulating layer 372a and a second gate insulating layer 372b are stacked thereover. In this embodiment, a gate insulating layer has a two layer structure in which a nitride insulating layer and an oxide insulating layer are used as the first gate insulating layer 372a and the second gate insulating layer 372b, respectively.

As the oxide insulating layer, for example, a silicon oxide layer, a silicon oxynitride layer, an aluminum oxide layer, an aluminum oxynitride layer, or the like may be used. As the nitride insulating layer, a silicon nitride layer, a silicon nitride oxide layer, an aluminum nitride layer, an aluminum nitride oxide layer, or the like may be used.

As the first gate insulating layer 372a or the second gate insulating layer 372b, $HfO_x$ or the like can be used, for example. When $HfO_x$ or the like is used for the first gate insulating layer 372a or the second gate insulating layer 372b, leakage current which flows to a gate electrode from the oxide semiconductor layer side can be reduced.

In this embodiment, the gate insulating layer has a structure where a silicon nitride layer and a silicon oxide layer are stacked in that order over the gate electrode layer 381. A silicon nitride layer ($SiN_y$ (y>0)) with a thickness of 50 nm to 200 nm inclusive (50 nm in this embodiment) is formed by a sputtering method as the first gate insulating layer 372a and a silicon oxide layer ($SiO_x$ (x>0)) with a thickness of 5 nm to 300 nm inclusive (100 nm in this embodiment) is stacked as the second gate insulating layer 372b over the first gate insulating layer 372a; thus, the gate insulating layer with a thickness of 150 nm is formed.

Next, an oxide semiconductor film is formed and is processed into an island-shaped oxide semiconductor layer in a photolithography step. In this embodiment, the oxide semiconductor film is formed by a sputtering method with the use of an In—Ga—Zn—O-based metal oxide target, for example.

In that case, the oxide semiconductor film is preferably formed removing residual moisture in the treatment chamber. This is for preventing hydrogen, a hydroxyl group, or moisture from being contained in the oxide semiconductor film.

In order to remove residual moisture in the treatment chamber, an entrapment vacuum pump is preferably used. As the entrapment vacuum pump, a cryopump, an ion pump, or a titanium sublimation pump is preferably used, for example. Further, an exhaustion unit may be a turbo pump provided with a cold trap, for example. In the deposition chamber which is evacuated with the cryopump, a hydrogen atom, a compound containing a hydrogen atom, such as water ($H_2O$), and the like are removed, whereby the concentration of an impurity in the oxide semiconductor film formed in the deposition chamber can be reduced.

It is preferable to use a high-purity gas from which an impurity such as hydrogen, water, a hydroxyl group, or hydride is removed to a concentration expressed by a level of ppm or ppb, as a sputtering gas used when the oxide semiconductor film is formed.

Next, dehydration or dehydrogenation of the oxide semiconductor layer is performed. The temperature of the first heat treatment at which dehydration or dehydrogenation is performed is 400° C. to 750° C. inclusive, preferably 425° C. to 750° C. inclusive. Note that in the case where the temperature is higher than or equal to 425° C., the heat treatment time may be less than or equal to 1 hour, whereas in the case where the temperature is lower than 425° C., the heat treatment time is longer than 1 hour. Here, the substrate is put in an electric furnace, which is a kind of heat treatment apparatus, and heat treatment of the oxide semiconductor layer is performed in a nitrogen atmosphere. Then, the oxide semiconductor layer is not exposed to the air and water or hydrogen is prevented from entering the oxide semiconductor layer. After that, cooling is performed by introduction of a high-purity oxygen gas, a high-purity $N_2O$ gas, or ultra-dry air (having a dew point of lower than or equal to $-40°$ C., preferably lower than or equal to $-60°$ C.) into the same furnace. It is preferable that water, hydrogen, or the like be not contained in an oxygen gas or a $N_2O$ gas. Alternatively, the purity of an oxygen gas or a $N_2O$ gas which is introduced into the heat treatment apparatus is greater than or equal to 6 N (99.9999%), preferably greater than or equal to 7 N (99.99999%) (i.e., the impurity concentration of the oxygen gas or the $N_2O$ gas is less than or equal to 1 ppm, preferably less than or equal to 0.1 ppm).

The heat treatment apparatus is not limited to the electric furnace, and for example may be an RTA apparatus such as a GRTA apparatus or an LRTA apparatus. An LRTA apparatus is an apparatus for heating an object to be processed by radiation of light (an electromagnetic wave) emitted from a lamp such as a halogen lamp, a metal halide lamp, a xenon arc lamp, a carbon arc lamp, a high pressure sodium lamp, or a high pressure mercury lamp. In addition, without limitation to an LRTA apparatus and a lamp, an apparatus that heats the product to be processed by thermal conduction or thermal radiation from a heating element such as a resistance heating element may be used. GRTA is a method for performing heat treatment using a high-temperature gas. As the gas, an inert gas which does not react with an object to be processed by heat treatment, for example, nitrogen or a rare gas such as argon, is used. The heat treatment may be performed at $600°$ C. to $750°$ C. for several minutes using an RTA method.

In addition, after the first heat treatment for dehydration or dehydrogenation, heat treatment may be performed at $200°$ C. to $400°$ C. inclusive, preferably $200°$ C. to $300°$ C. inclusive in an oxygen gas atmosphere or a $N_2O$ gas atmosphere.

The first heat treatment for the oxide semiconductor layer can be performed before the oxide semiconductor film is processed into the island-shaped oxide semiconductor layer. In that case, the substrate is taken out of the heat treatment apparatus after the first heat treatment, and then a photolithography step is performed.

The entire oxide semiconductor layer is made to contain an excess amount of oxygen through the above steps, whereby the oxide semiconductor layer has higher resistance, that is, becomes i-type. Accordingly, an oxide semiconductor layer 382 whose entire region has i-type conductivity is formed.

Next, a conductive film is formed over the oxide semiconductor layer 382, a resist mask is formed in a photolithography step, and the conductive film is selectively etched to form a source electrode layer 385*a* and a drain electrode layer 385*b*; then, an oxide insulating layer 386 is formed by a sputtering method.

In that case, the oxide insulating layer 386 is preferably formed removing residual moisture in the treatment chamber. This is for preventing hydrogen, a hydroxyl group, or moisture from being contained in the oxide semiconductor layer 382 and the oxide insulating layer 386.

In order to remove residual moisture in the treatment chamber, an entrapment vacuum pump is preferably used. As the entrapment vacuum pump, a cryopump, an ion pump, or a titanium sublimation pump is preferably used, for example. Further, an exhaustion unit may be a turbo pump provided with a cold trap, for example. In the deposition chamber which is evacuated with the cryopump, a hydrogen atom, a compound containing a hydrogen atom, such as water ($H_2O$), and the like are removed, whereby the concentration of an impurity in the oxide insulating layer 386 formed in the deposition chamber can be reduced.

It is preferable to use a high-purity gas from which an impurity such as hydrogen, water, a hydroxyl group, or hydride is removed to a concentration expressed by a level of ppm or ppb, as a sputtering gas used when the oxide insulating layer 386 is formed.

Through the above-described steps, a transistor 380 can be formed.

In order to reduce variation in electric characteristics of the transistor, heat treatment (preferably at higher than or equal to $150°$ C. and lower than $350°$ C.) may be performed in an inert gas atmosphere or a nitrogen gas atmosphere. For example, the heat treatment is performed in a nitrogen atmosphere at $250°$ C. for 1 hour.

Furthermore, the heat treatment may be performed in the air at $100°$ C. to $200°$ C. inclusive for 1 hour to 30 hours inclusive. In this embodiment, the heat treatment is performed at $150°$ C. for 10 hours. This heat treatment may be performed at a fixed heating temperature. Alternatively, the following change in the heating temperature may be conducted plural times repeatedly: the heating temperature is increased from a room temperature to a temperature of $100°$ C. to $200°$ C. inclusive and then decreased to a room temperature. When the heat treatment is performed under the reduced pressure, the heat treatment time can be shortened. With such heat treatment, hydrogen is introduced from the oxide semiconductor layer to the oxide insulating layer; thus, a normally-off transistor can be obtained. Therefore, reliability of the transistor can be improved.

A protective insulating layer 373 is formed over the oxide insulating layer 386. In this embodiment, as the protective insulating layer 373, a silicon nitride film with a thickness of 100 nm is formed by a sputtering method.

The protective insulating layer 373 and the first gate insulating layer 372*a* each formed using a nitride insulating layer do not contain an impurity such as moisture, hydrogen, hydride, and hydroxide and have an effect of blocking entry of these from the outside.

Therefore, in a manufacturing process after the formation of the protective insulating layer 373, entry of an impurity such as moisture from the outside can be prevented, so that the long-term reliability of the device can be improved.

Further, part of the insulating layers between the protective insulating layer 373 formed using a nitride insulating layer and the first gate insulating layer 372*a* may be removed, so that the protective insulating layer 373 and the first gate insulating layer 372*a* may be in contact with each other.

Accordingly, an impurity such as moisture, hydrogen, hydride, and hydroxide in the oxide semiconductor layer is reduced as much as possible and mixture of the impurity is prevented, so that the concentration of an impurity in the oxide semiconductor layer can be maintained to be low.

A planarization insulating layer for planarization may be provided over the protective insulating layer 373.

Further, a conductive layer may be formed so as to overlap with the oxide semiconductor layer, over the protective insulating layer 373. A potential of the conductive layer may be the same as or different from that of the gate electrode layer 381 of the transistor 380. The conductive layer can also function as a second gate electrode layer. The potential of the conductive layer may be a fixed potential such as GND or 0 V.

Electric characteristics of the transistor 380 can be controlled by the conductive layer.

As described above, the transistor including the oxide semiconductor layer can have stable electric characteristics and high reliability.

Note that this embodiment can be combined with or replaced by any of the other embodiments as appropriate.

Embodiment 11

A DC converter circuit of an embodiment of the present invention can be combined with any of various power storage devices to form a power supply circuit. In this embodiment, a power supply circuit formed using the DC converter circuit which is an embodiment of the present invention will be described.

Figure 20:
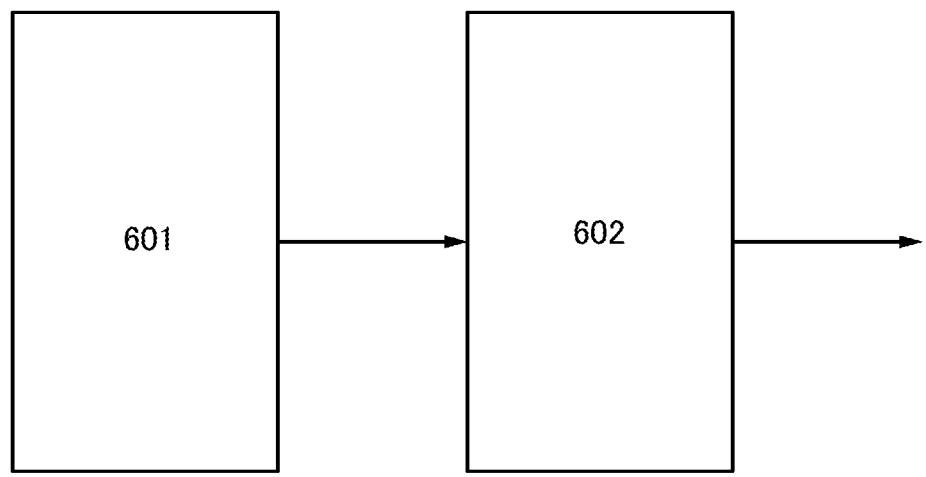
FIG. 20 is a diagram illustrating a power supply circuit.

An example of the structure of the power supply circuit in this embodiment will be described with reference to FIG. 20. FIG. 20 is a block diagram illustrating an example of the structure of the power supply circuit in this embodiment.

The power supply circuit illustrated in FIG. 20 includes a power storage device 601 and a DC converter circuit 602.

The power storage device 601 has a function of supplying electric power. As the power storage device 601, for example, one or more of a photoelectric conversion device, a lithium ion secondary battery, a lithium ion capacitor, an electric double-layer capacitor, a redox capacitor, and the like can be used. For example, when a lithium ion secondary battery and a lithium ion capacitor are used together, a power storage device which can charge or discharge at high speed and can supply electric power for a long time can be formed. Note that there is no limitation on the lithium ion secondary battery. As noted above, a lithium ion secondary battery is one example of a kind of power storage device that can be used, and, accordingly, the power storage device 601 is not limited to being a lithium ion secondary battery. For the power storage device 601, a secondary battery in which another alkali metal ion, alkaline earth metal ion, or the like is used as a mobile ion may be used. In addition, there is no limitation on the lithium ion capacitor. For the power storage device 601, a capacitor in which another alkali metal ion, alkaline earth metal ion, or the like is used as a mobile ion may be used.

The DC converter circuit 602 is electrically connected to the power storage device 601. As the DC converter circuit 602, the DC converter circuit described in Embodiment 1 or Embodiment 2 can be used, for example.

As illustrated in FIG. 20, an example of the power supply circuit of this embodiment includes a power storage device and a DC converter circuit. Electric power supplied by the power storage device is stepped-up or stepped-down by the DC converter circuit, whereby power supply voltage which is suitable for the specification of the device which is supplied with electric power is generated. Further, the DC converter circuit of an embodiment of the present invention is used as a DC converter circuit in the power supply circuit of this embodiment, so that reliability of the power supply circuit can be increased.

Note that this embodiment can be combined with or replaced by any of the other embodiments as appropriate.

Embodiment 12

In this embodiment, examples of an electronic device to which the power supply circuit according to Embodiment 11 can be applied will be described with reference to FIGS. 21A and 21B.

FIG. 21A illustrates a laptop personal computer, which includes a main body 3001, a housing 3002, a display portion 3003, a keyboard 3004, and the like. The power supply circuit described in Embodiment 11 can be used to generate power supply voltage which is supplied to the laptop personal computer illustrated in FIG. 21A.

FIG. 21B illustrates a mobile phone, which includes two housings, a housing 2800 and a housing 2801. The housing 2801 includes a display panel 2802, a speaker 2803, a microphone 2804, a pointing device 2806, a camera lens 2807, an external connection terminal 2808, and the like. The housing 2800 includes a solar cell 2810 for charging of the mobile phone, an external memory slot 2811, and the like. Further, an antenna is incorporated in the housing 2801.

Further, the display panel 2802 is provided with a touch panel. A plurality of operation keys 2805 which are displayed as images are illustrated by dashed lines in FIG. 21B. The mobile phone illustrated in FIG. 21B includes a power supply circuit including the solar cell 2810 and a DC converter circuit which converts voltage which is output from the solar cell 2810 into voltage which is necessary for each circuit.

As described above, the power supply circuit in Embodiment 11 is applied to a variety of electronic devices. Further, the power supply circuit in Embodiment 11 is applied to an electronic device, whereby a highly reliable electronic device can be provided.

Note that this embodiment can be combined with or replaced by any of the other embodiments as appropriate.

This application is based on Japanese Patent Application serial no. 2009-276859 filed with Japan Patent Office on Dec. 4, 2009, the entire contents of which are hereby incorporated by reference.

The invention claimed is:

1. A power supply circuit comprising:
   an inductor comprising a terminal;
   a transistor connected to the terminal of the inductor, the transistor comprising:
      a first conductive film over a first insulating layer, the first conductive film functioning as one of a source electrode and a drain electrode;
      an oxide semiconductor layer over the first conductive film;
      a second conductive film over the oxide semiconductor layer, the second conductive film functioning as the other of the source electrode and the drain electrode; and
      a gate electrode over the second conductive film,
   a rectifier connected to the terminal of the inductor; and
   a control circuit connected to the transistor,
   wherein a hydrogen concentration of the oxide semiconductor layer is less than or equal to $5 \times 10^{19}$ atoms/cm$^3$, and
   wherein, in a top view of the transistor, the gate electrode includes a concentric circular shape having an opening overlapping the second conductive film.

2. The power supply circuit according to claim 1, wherein an end portion of the first conductive film or the second conductive film is tapered.

3. The power supply circuit according to claim 1, wherein the gate electrode comprises tungsten.

4. The power supply circuit according to claim 1, further comprising a gate insulating layer between the gate electrode and the oxide semiconductor layer.

5. The power supply circuit according to claim 1, wherein the oxide semiconductor layer comprises indium and zinc.

6. A power supply circuit comprising:
   an inductor comprising a terminal;
   a transistor connected to the terminal of the inductor, the transistor comprising:
      a first conductive film over a first insulating layer, the first conductive film functioning as one of a source electrode and a drain electrode;
      an oxide semiconductor layer over the first conductive film;
      a second conductive film over the oxide semiconductor layer, the second conductive film functioning as the other of the source electrode and the drain electrode; and
      a gate electrode over the second conductive film, a rectifier connected to the terminal of the inductor; and
a control circuit connected to the transistor,
wherein a hydrogen concentration of the oxide semiconductor layer is less than or equal to $5\times10^{19}$ atoms/cm$^3$,
wherein, in a top view of the transistor, the gate electrode includes a first concentric circular shape having a first opening overlapping the second conductive film,
wherein, in the top view, the first conductive film includes a second concentric circular shape having a second opening, and
wherein the second conductive film is inside the second opening.

7. The power supply circuit according to claim 6, wherein an end portion of the first conductive film or the second conductive film is tapered.

8. The power supply circuit according to claim 6, wherein the gate electrode comprises tungsten.

9. The power supply circuit according to claim 6, further comprising a gate insulating layer between the gate electrode and the oxide semiconductor layer.

10. The power supply circuit according to claim 6, wherein the oxide semiconductor layer comprises indium and zinc.

11. A semiconductor device comprising:
an inductor comprising a terminal;
a transistor connected to the terminal of the inductor, the transistor comprising:
  a first conductive film over a first insulating layer, the first conductive film functioning as one of a source electrode and a drain electrode;
  an oxide semiconductor layer over the first conductive film;
  a second conductive film over the oxide semiconductor layer, the second conductive film functioning as the other of the source electrode and the drain electrode; and
  a gate electrode over the second conductive film,
a rectifier connected to the terminal of the inductor; and
a control circuit connected to the transistor,
wherein, in a top view of the transistor, the gate electrode includes a first concentric circular shape having a first opening overlapping the second conductive film,
wherein, in the top view, the first conductive film includes a second concentric circular shape having a second opening, and
wherein the second conductive film is inside the second opening.

12. The semiconductor device according to claim 11, wherein an end portion of the first conductive film or the second conductive film is tapered.

13. The semiconductor device according to claim 11, wherein the gate electrode comprises tungsten.

14. The semiconductor device according to claim 11, further comprising a gate insulating layer between the gate electrode and the oxide semiconductor layer.

15. The semiconductor device according to claim 11, wherein the oxide semiconductor layer comprises indium and zinc.

16. The semiconductor device according to claim 11, wherein the control circuit comprises a hysteresis comparator which comprises:
a first comparator;
a second comparator;
a first inverter to which a voltage of the first comparator is applied;
a second inverter to which a voltage of the second comparator is applied;
a first NOR gate to which a voltage of the first inverter is applied; and
a second NOR gate to which a voltage of the second inverter is applied,
wherein the first NOR gate outputs a voltage to the transistor, and
wherein the second NOR gate outputs a voltage to the first NOR gate.

* * * * *